United States Patent
Shiraishi

(10) Patent No.: US 7,079,691 B2
(45) Date of Patent: Jul. 18, 2006

(54) METHOD OF AND APPARATUS FOR ENCODING, METHOD OF AND APPARATUS FOR DECODING, AND IMAGE FORMING APPARATUS

(75) Inventor: Naoto Shiraishi, Tokyo (JP)

(73) Assignee: Ricoh Company, Ltd., Tokyo (JP)

(*) Notice: Subject to any disclaimer, the term of this patent is extended or adjusted under 35 U.S.C. 154(b) by 877 days.

(21) Appl. No.: 09/984,427

(22) Filed: Oct. 30, 2001

(65) Prior Publication Data

US 2002/0075532 A1    Jun. 20, 2002

(30) Foreign Application Priority Data

Oct. 31, 2000    (JP) .............. 2000-334027

(51) Int. Cl.
*G06K 9/36*    (2006.01)

(52) U.S. Cl. .............. 382/232; 382/233; 382/237; 382/245

(58) Field of Classification Search ........ 382/232–251; 358/539, 462, 2.99, 3, 3.01, 1.2, 1.5, 1.6, 358/1.9
See application file for complete search history.

(56) References Cited

U.S. PATENT DOCUMENTS

| | | | | |
|---|---|---|---|---|
| 4,809,081 A | * | 2/1989 | Linehan | ............. 382/233 |
| 4,843,632 A | * | 6/1989 | Lee et al. | ............. 382/233 |
| 6,809,836 B1 | * | 10/2004 | Nobuta et al. | ............. 358/1.9 |

FOREIGN PATENT DOCUMENTS

| | | |
|---|---|---|
| JP | 63-076579 | 4/1988 |
| JP | 07-236065 | 9/1995 |
| JP | 08-130647 | 5/1996 |
| JP | 09-065147 | 3/1997 |
| JP | 09-252256 | 9/1997 |
| JP | 11-004170 | 1/1999 |
| JP | 2000-217005 | 8/2000 |

* cited by examiner

*Primary Examiner*—Duy M. Dang
(74) *Attorney, Agent, or Firm*—Dickstein Shapiro Morin & Oshinsky LLP

(57) ABSTRACT

With an encoding section 301 in an encoding apparatus, an image reading section 310 sequentially inputs binary signals by a predetermined bit length; a run counter in a run length processing section 320 outputs a run length determined within the binary signal of the predetermined bit length input by the image reading section 310 and a run length not determined within the binary signal; an adder in the run length processing section 320 adds the indeterminate run length to the first run length of a binary signal of the predetermined bit length to be subsequently input by the image reading section 310, and encoding unit 340 encodes the run length output by the run length processing section 320.

9 Claims, 65 Drawing Sheets

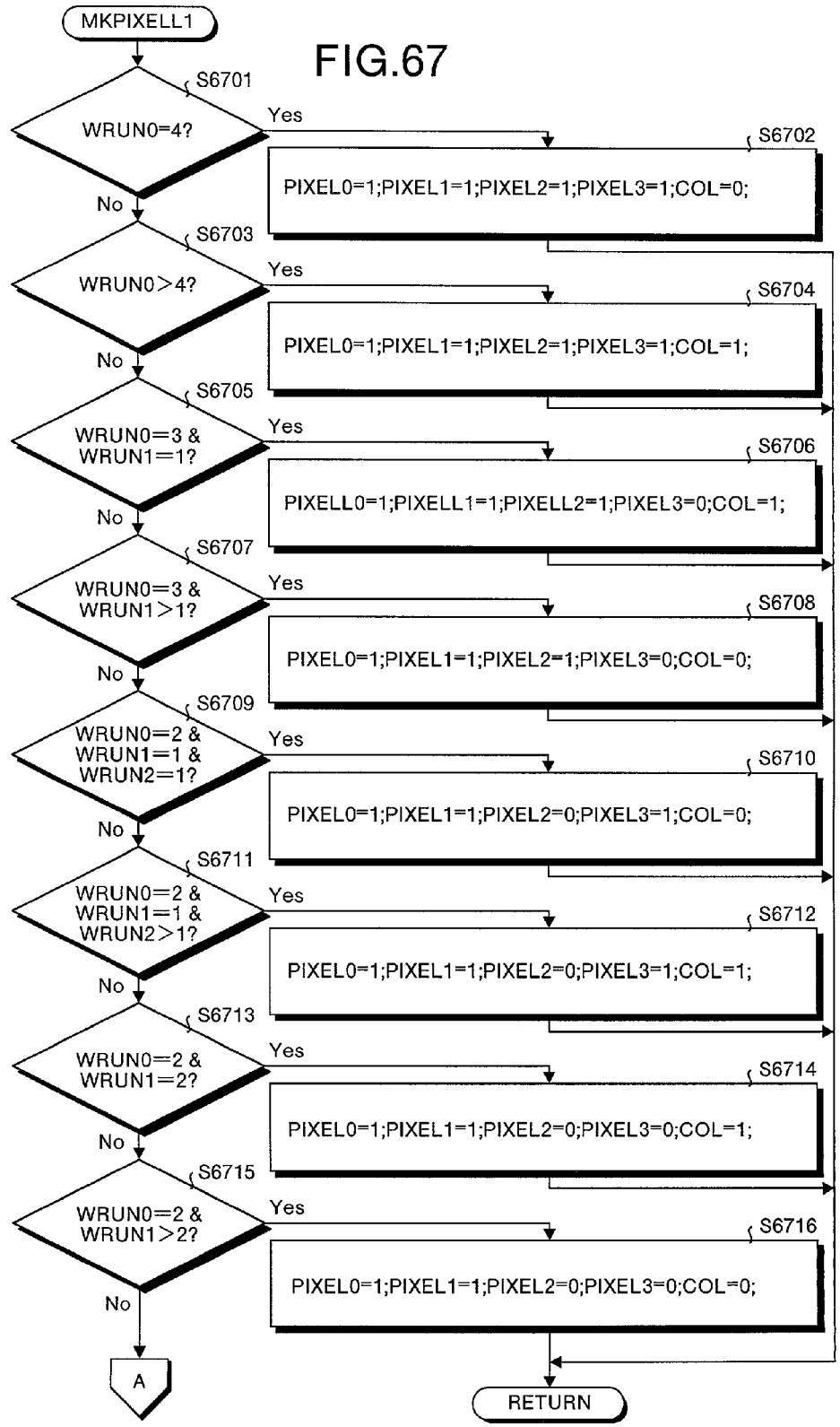

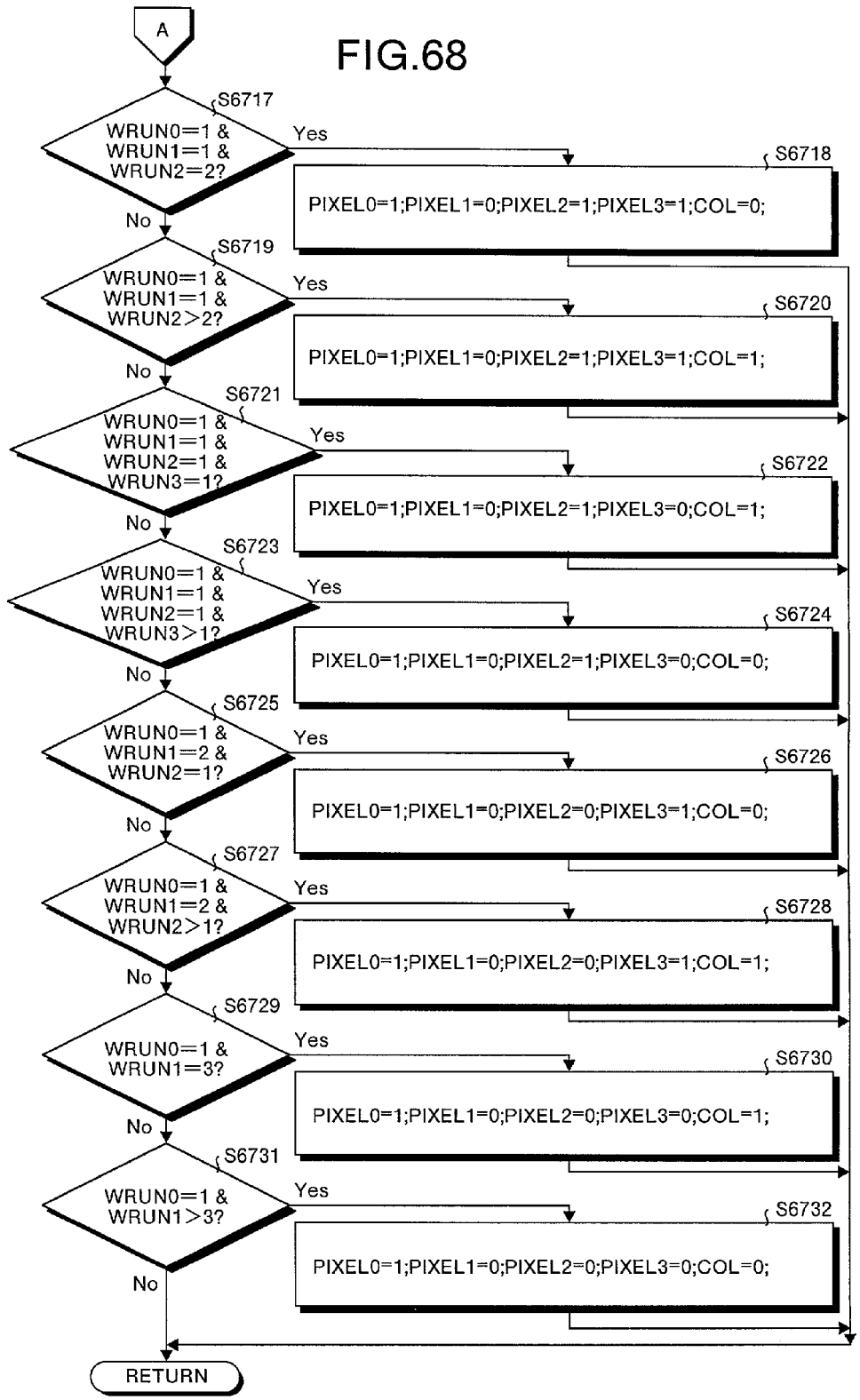

METHOD OF AND APPARATUS FOR ENCODING, METHOD OF AND APPARATUS FOR DECODING, AND IMAGE FORMING APPARATUS

FIELD OF THE INVENTION

The present invention relates to a technology for compressing (that is, encoding) and/or expanding (that is, decoding) binarized image data. Especially, the present invention relates to a so-called memory saving mechanism for saving a capacity of a frame buffer of a printer or the like.

BACKGROUND OF THE INVENTION

Binary signal compression techniques have heretofore been used in order to reduce a memory capacity required for holding image data and to reduce a transmission time of the image data. For example, MH coding has been widely known as a method of compressing binarized image data (heretofore, appropriately referred to as binarized image) with a small-sized hardware. The MH coding method is applied for run-length image compression, being a one-dimensional compression, facsimile or the like.

Japanese Patent Application Laid-Open (JP-A) No. 9-65147, "Image signal compression method, . . . " discloses a modification of the MH coding. This reference discloses that, at the time of performing the MH coding, white and black run lengths immediately before are stored, and when a run length of a certain color matches with a run length immediately before, a predetermined repetition code is generated. It is possible to improve the compressibility and the processing speed when this technique is applied.

JBIG (Joint Bi-level Image experts Group) is widely known as a method of compressing binarized images at high compressibility. JBIG is an international standard of the two-dimensional compression method. Moreover, a QM_coder, being an arithmetic encoder, has been used as the entropy encoder.

Techniques that fall in the same category as the above-mentioned one have been disclosed in "Image data encoding method" of Japanese Patent Application Publication (JP-B) No. 8-34545, "Binarized data compression/expansion circuit, . . . " of JP-A No. 9-252256, and "Method of and apparatus for data compression, method of and apparatus for data expansion" of Japanese Patent No. 2683506.

However, the prior arts have problems as described below. There is a problem with the technique disclosed in JP-A No. 9-65147, in that it is difficult to obtain a code set having sufficient compressibility, with respect to the image data in which colors change frequently in a short cycle. Moreover, the code set is similar to the MH code, therefore, when a plurality of bits are processed in parallel, a large number of gates are required. As a consequence, a high speed performance cannot be expected.

In the JBIG method, large-sized hardware becomes necessary for a context memory required for the QM_coder and a line memory for preparing the context. As a consequence, it is difficult to achieve high speed.

"Data encoding method/decoding method, . . . " of JP-A No. 2000-217005 discloses a solution to the above-mentioned problems. This reference disclose a method of encoding in which a numerical progression of a run length based on the data by color obtained by scanning the image is received, converted to a predetermined code queue, and output.

Specifically, what is disclosed in JP-A No. 2000-217005 is as follows. At the time of inputting the numerical value of the run length, if the value matches with the numerical value of the run length immediately before of the same color then it is set as an agreement, and if the values do not match then it is considered as a disagreement. A number of times the agreement occurs is set as a repetition number. Moreover, if the agreement or the disagreement occurs continuously, then a repetition number code corresponding to the repetition number is generated. On the other hand, if the disagreement occurs, then a code corresponding to the value of the run-length numerical value is generated.

With the technique disclosed in JP-A No. 2000-217005, however, a CPU processes as the algorithm of software. Therefore, the processing is performed serially, causing a problem in that it may be difficult to obtain a processing speed required for the image processing of the printer.

On the other hand, parallel processing by means of the hardware can be considered. However, as the number of bits to be processed in parallel increases, combinations for processing the number of bits at a time increases (for example, there exist 16 combinations for 4 bits, 256 combinations for 8 bits, and $2^n$ combinations for n bits), causing an increase of the number of gates of the hardware. Hence, there is a problem in that the number of bits cannot be increased thoughtlessly, in view of the design of the hardware.

Moreover, as other techniques of compressing and expanding the run-length code, there is known an apparatus that compares bit by bit for every clock to count up the run length (see FIG. 10), or an apparatus that increases the processing speed by matching of the same run length (see FIG. 1) in "Binarized image compression apparatus" of JP-A No. 7-236065.

However, with the technique disclosed in FIG. 10 of JP-A No. 7-236065, since one clock is consumed for every BIT, high frequency is required for improving the processing speed. However, in building into LSI, high frequency becomes a problem, and hence speed-up is difficult due to noise, consumed current and generation of heat. There is further a problem in that with an increase of the number of pixels of digital cameras and with an improvement of resolution of scanners, improvement of frequency cannot catch up with an increase of the data to be processed.

On the other hand, with the technique disclosed in FIG. 1 of JP-A No. 7-236065, in case of a long run length, speed-up is possible by the number of bits to be processed in parallel by the pixel detection section and the barrel shifter. However, with respect to a pattern having a short run length of for example, '101010', lots of clocks are consumed, and hence the same problem described with respect to FIG. 1 arises. Moreover, with the techniques disclosed in both the figures, since the processing time is different depending on the pattern, with respect to the image having the same size, there is a problem in that equipments must be designed, assuming a pattern having the worst processing efficiency.

SUMMARY OF THE INVENTION

It is an object of the present invention to compress the binarized image at high speed, without increasing the number of bits to be processed at a time.

It is another object of the present invention to expand the compressed binarized image without increasing the number of bits to be processed at a time, even at a low frequency.

The encoding apparatus according to one aspect of the present invention comprises: a binary signal input unit which inputs binary signals sequentially by a predetermined bit length; a determined run length output unit which outputs the run length determined in the binary signal of the predetermined bit length, input by the binary signal input unit; an indeterminate run length output unit which outputs the run length not determined in the binary signal of the predetermined bit length, input by the binary signal input unit; a run length adding unit which adds the run length output by the indeterminate run length output unit to the first run length of the binary signal of the predetermined bit length to be subsequently input by the binary signal input unit; and an encoding unit which encodes the run length output by the determined run length output unit. According to this encoding apparatus, a long run length can be calculated, while decreasing the bit length to be processed.

The encoding apparatus according to another aspect of the present invention comprises: a binary signal mass input unit which inputs binary signals sequentially by a predetermined unit, designating binary signals of a predetermined bit length as one unit; an in-unit determined run length output unit which outputs the run length determined in the respective units input by the binary signal mass input unit; storing units, in a number that is the same number as that of the predetermined units, which store the run length determined in the respective units, output by the in-unit determined run length output unit, based on the number of run lengths determined in the respective units and the order of the units in the whole predetermined units; a determined run length output unit which outputs the run length determined in one unit, when the run length stored in the storing unit is combined and the whole predetermined unit is designated as one unit; an indeterminate run length output unit which outputs the run length not determined in the one unit, when the run length stored in the storing unit is combined and the whole predetermined unit is designated as one unit; a run length adding unit which adds the run length output by the indeterminate run length output unit to the first run length of the binary signal in the predetermined unit, subsequently input by the binary signal mass input unit; and an encoding unit which encodes the run length output by the determined run length output unit. According to this encoding apparatus, the bit length that can be processed at a time with a circuit structure having a fewer number of gates can be increased.

The decoding apparatus according to still another aspect of the present invention comprises: a decoding unit which individually decodes signals consisting of a code of a run length and number of repetitions, being repetition of the run length, and outputting the run length or the number of repetitions; a FIFO memory which stores a plurality of run lengths or numbers of repetitions output by the decoding unit in an order of output; a binary signal conversion unit which inputs the run length or the number of repetitions stored in the FIFO memory and converts the input run length or the number of repetitions to a binary signal of a predetermined BIT length; and a control unit which controls the input of the run length or number of repetitions decoded by the decoding unit by the number of conversion converted to the binary signals by the binary signal conversion unit, into the FIFO memory. According to this decoding apparatus, the data to be processed can be efficiently input.

The image forming apparatus according to still another aspect of the present invention comprises any one or both of the encoding apparatus and the decoding apparatus described above.

The encoding method according to still another aspect of the present invention comprises: a binary signal input step of inputting binary signals sequentially by a predetermined bit length; a determined run length output step of outputting the run length determined in the binary signal of the predetermined bit length, input in the binary signal input step; an indeterminate run length output step of outputting the run length not determined in the binary signal of the predetermined bit length, input in the binary signal input step; a run length adding step of adding the run length output in the indeterminate run length output step to the first run length of the binary signal of the predetermined bit length to be subsequently input in the binary signal input step; and an encoding step of encoding the run length output in the determined run length output step. According to this encoding method, a long run length can be calculated, while decreasing the bit length to be processed.

The encoding method according to still another aspect of the present invention comprises: a binary signal mass input step of inputting binary signals sequentially by a predetermined unit, designating binary signals of a predetermined BIT length as one unit; an in-unit determined run length output step of outputting the run length determined in the respective units input in the binary signal mass input step; a storing step of storing the run length determined in the respective units, output in the in-unit determined run length output step, in the storage step of same number as that of the predetermined units, based on the number of run lengths determined in the respective units and the order of the units in the whole predetermined units; a determined run length output step of outputting the run length determined in one unit, when the run length stored in the storing step is combined and the whole predetermined unit is designated as one unit; an indeterminate run length output step of outputting the run length not determined in the one unit, when the run length stored in the storing step is combined and the whole predetermined unit is designated as one unit; a run length adding step of adding the run length output in the indeterminate run length output step to the first run length of the binary signal in the predetermined unit, subsequently input in the binary signal mass input step; and an encoding step of encoding the run length output in the determined run length output step. According to this encoding method, the bit length that can be processed at a time with a circuit structure having a fewer number of gates can be increased.

The decoding method according to still another aspect of the present invention comprises: a decoding step of individually decoding signals consisting of a code of a run length and number of repetitions, being repetition of the run length, and outputting the run length or the number of repetitions; a storing step of storing a plurality of run lengths or numbers of repetitions output in the decoding step, in an FIFO memory in an order of output; a binary signal conversion step of inputting the run length or the number of repetitions stored in the FIFO memory in the storing step to convert it to a binary signal of a predetermined bit length; and a control step of controlling the input of the run length or number of repetitions decoded in the decoding step by the number of conversion converted to the binary signals in the binary signal conversion step, into the FIFO memory. According to this decoding method, the data to be processed can be efficiently input.

Other objects and features of this invention will become apparent from the following description with reference to the accompanying drawings.

BRIEF DESCRIPTION OF THE DRAWINGS

FIG. 67 is a continuation of the processing shown in FIG. 64; and

FIG. 68 is a continuation of the processing shown in FIG. 67.

DESCRIPTION OF THE PREFERRED EMBODIMENTS

Embodiments of the present invention will now be described in detail, with reference to the accompanying drawings. The encoding apparatus and the decoding apparatus of the present invention have been utilized in a multi-color image forming apparatus. It should be noted that the multi-color image forming apparatus is only one example where the encoding apparatus and the decoding apparatus can be utilized. First, a schematic construction of the multi-color image forming apparatus will be explained, then the electrical control section will be explained, and finally the encoding apparatus and the decoding apparatus will be explained.

Figure 1:
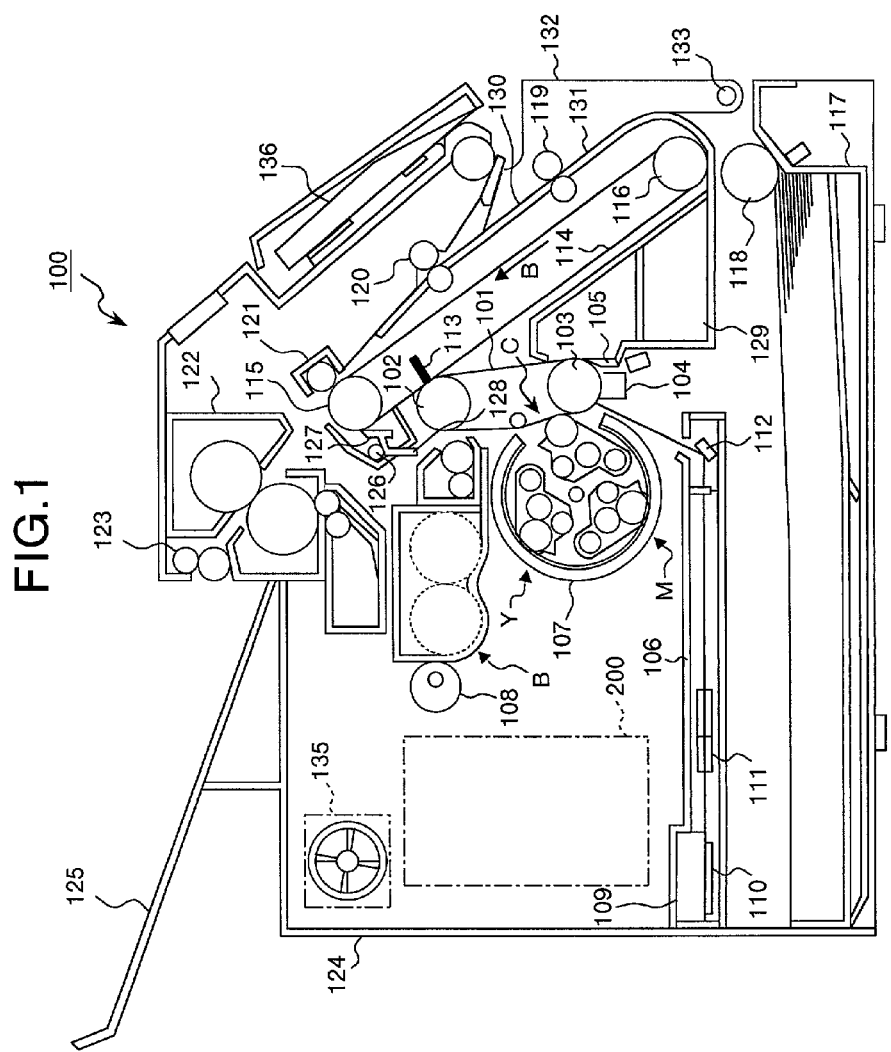
FIG. 1 is a diagram showing one example of a schematic construction of a multi-color image forming apparatus comprising an encoding apparatus and a decoding apparatus of the present invention.

Details of the Multi-color Image Forming Apparatus:

FIG. 1 is a diagram showing one example of a schematic construction of the multi-color image forming apparatus comprising the encoding apparatus and the decoding apparatus of the present invention. The multi-color image forming apparatus 100 has a photosensitive material 101 in a belt form, being an image carrier, rotation rollers 102 and 103 for supporting the photosensitive material 101 and rotating the photosensitive material 101 in the direction of the arrow A. Moreover, there arranged a charging section 104 in the outer periphery of the photosensitive material 101 for charging the photosensitive material 101. Moreover, there are provided a discharging lamp L and a cleaning blade 105 for cleaning the photosensitive material 101.

The multi-color image forming apparatus 100 further has a laser writing section 106, as an optical writing means, at a position on the downstream side of the charging section 104. Moreover, at a position on the downstream side of the laser writing section 106, a multi-color development section 107 is arranged, in which developing units for a plurality of colors are supported so as to be freely changed over. Specifically, these developing units are a yellow developing unit Y, a magenta developing unit M, and a cyan developing unit C, constituted for each color toner to be stored therein. Above the multi-color development section 107, there is provided a black developing section B storing a black toner.

Each developing unit moves to a developable position, synchronously to the developing timing of the corresponding color. More specifically, in case of the multi-color development section 107, by a rotation thereof by 120 degrees, the developing units of the respective colors move to the developable position. If a black color is to be developed, the black developing unit B moves close to the photosensitive material 101, to the developable position, and on the contrary, when the multi-color development section 107 performs development, the black developing unit B moves to a position away from the photosensitive material 101. The movement of the black developing unit B is performed by a rotation of a cam 108.

The laser writing section 106 sequentially generates laser beams corresponding to image forming signals of a plurality of colors (writing information) from a laser source (not shown), and the laser beams are cyclically deflected by using a polygon mirror 110 rotated by a polygon motor 109, so as to scan the surface of the charged photosensitive material 101 through a fθ lens 111 and a mirror 112, to thereby form an electrostatic latent image.

The electrostatic latent image formed on the surface of the photosensitive material 101 is developed by toners from the corresponding developing units, to thereby form and hold a toner image. The toner image on the photosensitive material 101 is transferred onto the surface of an intermediate transfer belt 114 by a transfer brush (first transfer step) 113. The intermediate transfer belt 114 is supported rotatably in the direction of the arrow B by the rotation rollers 115 and 116.

The surface of the photosensitive material 101 is cleaned by the cleaning blade 105 for every color, and a toner image of a predetermined color is formed thereon. To the surface of the intermediate transfer belt 114 is transferred the toner image on the photosensitive material 101 synchronously every time the intermediate transfer belt 114 is rotated, so that toner images of the plurality of colors are overlapped one by one. When all colors have been transferred, the toner images are transferred onto a recording medium such as paper or plastic.

At the time of transfer onto papers, a sheet of paper stored in a paper feeder (paper feed cassette) 117 is fed out by a paper feed roller 118 and carried by a carrier roller 119, and temporarily stopped in a condition with the paper abutted against a resist roller pair 120. Then, the paper is re-carried to a nip of the intermediate transfer belt 114 and a transfer roller (second transfer step) 121, with the timing adjusted so that the transfer position of the toner image is correct.

After the toner images of the plurality of colors on the intermediate transfer belt 114 are collectively transferred by the operation of the transfer roller 121, the re-carried paper is transported to a fixing section 122, to thereby fix the toner image thereon, and the paper is ejected to an ejected paper stack section 125 above a body frame 124 by a paper ejection roller pair 123.

The intermediate transfer belt 114 is provided with a cleaning section 126 for the intermediate transfer belt 114 at a portion of the rotation roller 115, with the cleaning blade 127 being freely put close to or away from the intermediate transfer belt 114 via an arm 128 for putting the cleaning blade close to or away from the intermediate transfer belt 114. This cleaning blade 127 is separated away from the intermediate transfer belt 114 in the process of receiving the toner image from the photosensitive material 101, and is brought into contact therewith after the toner image has been transferred onto the paper from the intermediate transfer belt 114, to thereby scrape off the remaining toner after the toner image has been transferred onto the paper.

The waste toner scraped off by the cleaning blades 105 and 127 is received in a recovery container 129. The recovery container 129 is properly replaced. Transport of the waste toner is performed by an auger 137 provided inside of the cleaning section 126, and sent to the recovery container 129 by transport step (not shown).

The photosensitive material 101, the charging section 104, the intermediate transfer belt 114, the cleaning section 126, and a carrier guide 130 forming a paper transport passage are integrally assembled in a process cartridge in one unit, so as to be replaceable at the end of the life span thereof. In addition to the replacement of the process cartridge 131, the multi-color developing section 107 and the black developing unit B are also replaced at the end of the life span thereof. In order to facilitate the replaceability of the process cartridge 131 and the processing of jammed paper, a front frame 132 of a part of the body has a rotatable structure so as to be opened or closed about a spindle 133.

Moreover, inside of the multi-color image forming apparatus 100, there is also housed an electrical control section 200 for encoding or decoding the image data. Above the electrical control section 200, there is provided a fan 135 for exhausting air for preventing the temperature in the apparatus from increasing too much. Above the process cartridge 131, there is provided a relatively small paper feeder 136, other than the paper feeder 117. In this embodiment, the intermediate transfer belt 114 is used as the intermediate transfer body, but the present invention is not limited thereto, and for example, an intermediate transfer drum may be used.

Figure 2:
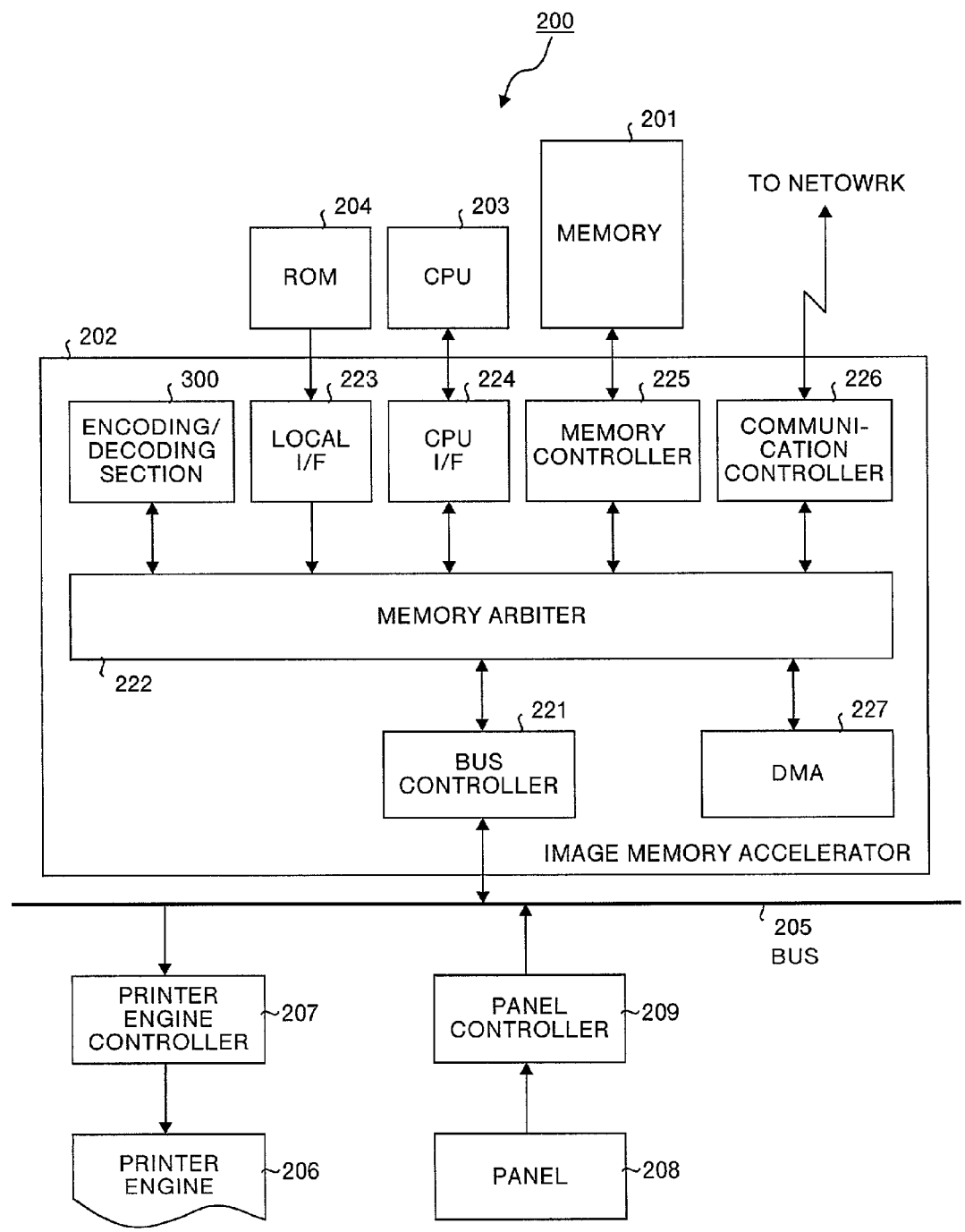
FIG. 2 is a block diagram showing one example of an electrical control section of the multi-color image forming apparatus.

The electrical control section of the multi-color image forming apparatus will now be described. FIG. 2 is a block diagram showing one example of the electrical control section of the multi-color image forming apparatus. The electrical control section 200 has an image memory 201 serving as a memory for storing image data, an image memory accelerator 202 for mainly operating the image memory 201, a CPU 203 for controlling the entire apparatus of the multi-color image forming apparatus 100, and a ROM 204 for storing various programs and font information such as characters.

The image memory accelerator 202 is controlled by the CPU 203, to receive image data from a host computer via a network, perform encoding, transfer the encoded image data to the image memory 201 and transfer the image data to a printer engine controller 207 described later. Moreover, the image memory accelerator 202 performs communication with each host, control of the image memory 201, and input of information operated from a panel 208 described later, and further performs control of a bus with respect to the peripheral equipment (not shown).

As a specific construction, the image memory accelerator 202 has a bus controller 221 for performing arbitration of bus between respective peripheral controllers connected to a bus 205, a memory arbiter 222 for performing arbitration between the image memory 201 and various controllers, a local I/F 223 serving as an interface of the ROM 204 or the like, a CPU I/F 224 serving as an interface of the CPU 203, a memory controller 225 for controlling the image memory 201 and connecting the image memory 201 to various controllers and the CPU 203 via the memory arbiter 222, a communication controller 226 for connecting to the network to receive various data and commands from the network, and connecting to various controllers via the memory arbiter 222, and a DMA (Direct Memory Access) 227 for performing direct memory access between controllers connected to the memory arbiter 222.

The image memory accelerator 202 also has an encoding/decoding section 300, which is connected to the image memory 201 and the CPU 203 via the memory arbiter 222, for performing encoding and decoding of the image data from the image memory 201 or the like. Hereinafter, of the encoding/decoding section 300, the section for performing encoding is referred to as an encoding section 301, and the section for performing decoding is referred to as a decoding section 302.

Moreover, the image memory accelerator 202 is connected via the bus 205 to the printer engine controller 207 for controlling a printer engine 206, and a panel controller 209 for controlling a panel 208 for inputting the operation from a user.

Figure 3:
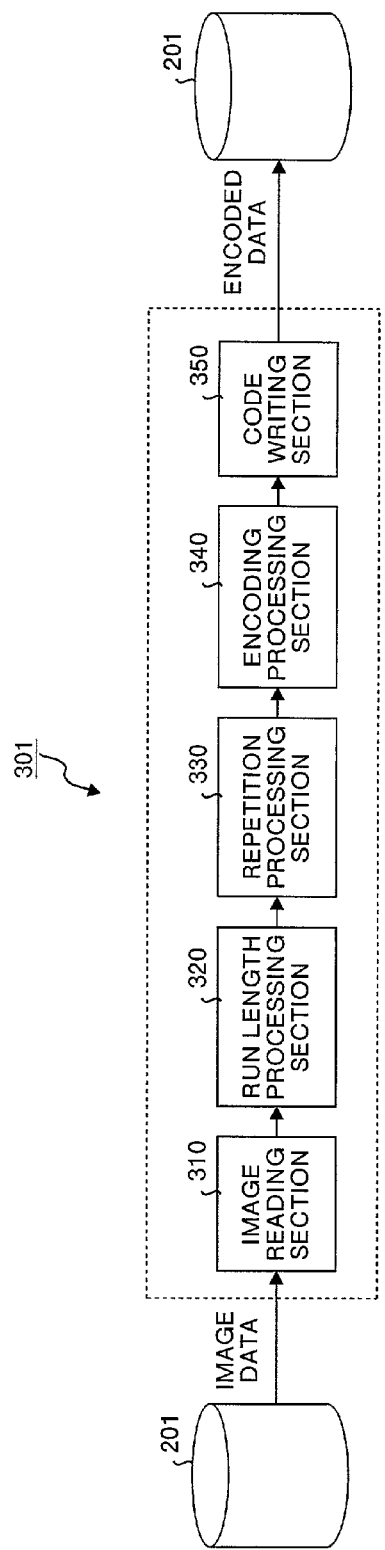
FIG. 3 is a block diagram for explaining a flow of data ("data flow") when the encoding apparatus encodes the image data.

Details of the Encoding Section:

The encoding section 301 will now be described in detail. FIG. 3 is a block diagram for explaining the data flow when the encoding section 301 encodes the image data.

The encoding section 301 has an image reading section 310 for reading the image data from the image memory 201, a run length processing section 320 for converting the binary image data read by the image reading section 310 to a run length, a repetitive processing section 330 for calculating the number of repetitions of the run length converted by the run length processing section 320, an encoding processing section 340 for encoding the run length and the number of repetitions, and a code writing section 350 for writing the codes encoded in the NL encoding processing section 340 in the image memory 201.

The run length stands for a continuous number of signal 0 or signal 1 of the binary value (0 or 1). For example, if the signal is 001011000001 . . . , the run length of a portion where five zeros continue in the latter part is 5.

Each section of the encoding section 301 will now be described in detail. An example where the image data is taken in by 4 bits, and subjected to parallel processing (the taken 4 bits are collectively processed) is described herein. Hereinafter, the taken 4-bit data set is referred to as an image pattern. Moreover, as an other example of encoding, an example where the image data is taken in by 8 bits will be described later.

Figure 4:
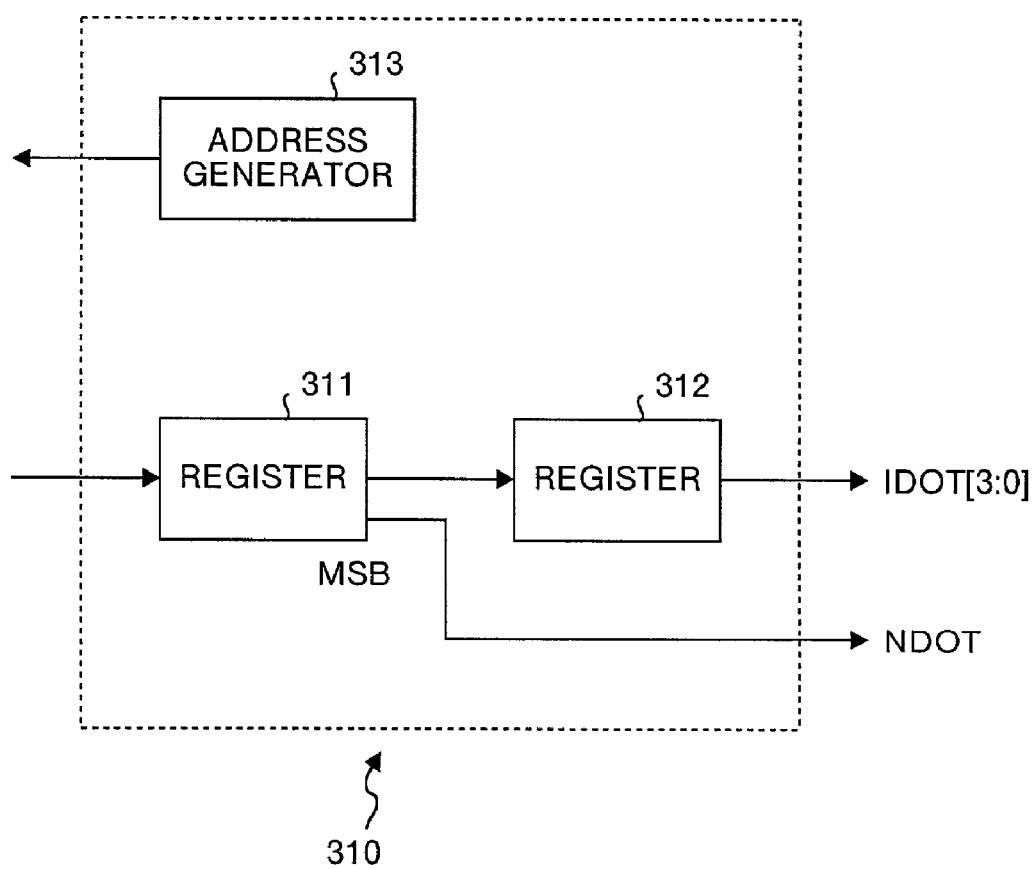
FIG. 4 is a block diagram showing one example of a construction of an image reading section.

The contents of the image reading section 310 will be described. FIG. 4 is a block diagram showing one example of the construction of the image reading section 310. The image reading section 310 comprises a register 311 for storing the image data read from the image memory 201, a register 312 connected to the register 311 by a pipeline, and an address generator 313 for generating an address to be read.

The register 312 stores data to be processed, and the register 311 stores an image pattern to be processed next, subsequently to the data stored in the register 312. The register 311 transfers MSB (most significant bit) data, that is, the data of the first bit of the image pattern to be processed next to the run length processing section 320. Since the example where processing is performed by 4 bits is described here, the contents of the first one signal (0 or 1) of the four "01 signals" is transferred to the run length processing section 320.

This MSB data is used when it is judged whether the run length is determined or not by the data of the last bit, of the image pattern to be processed stored in the register 312. For example, the image pattern is '0100', and the next image pattern is '1 . . . ', the MSB data is 0, and the run length of the above-described 00 signal is not determined.

Figure 5:
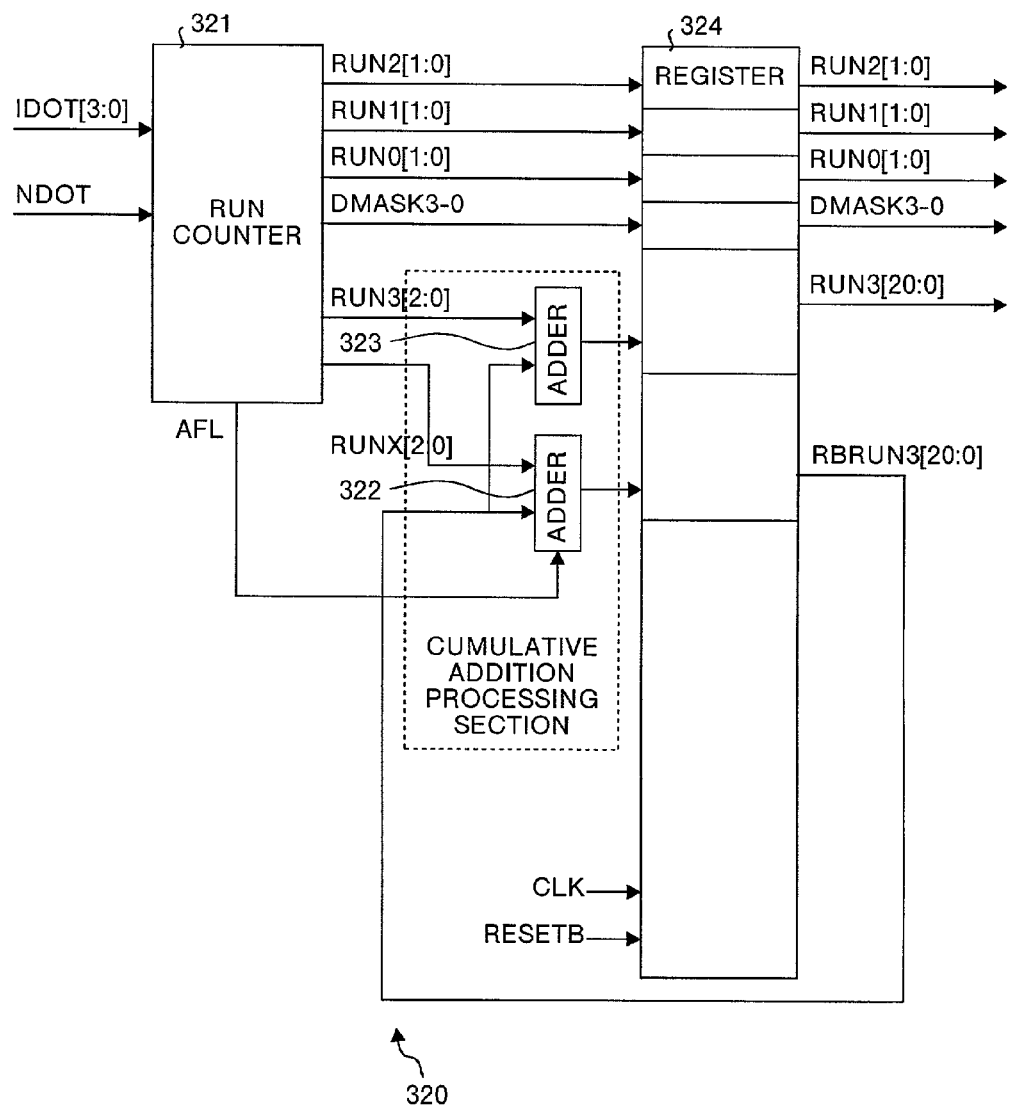
FIG. 5 is a block diagram showing one example of a construction of a run length processing section.

The contents of the run length processing section 320 will now be described. FIG. 5 is a block diagram showing one example of the construction of the run length processing section 320. The run length processing section 320 comprises a run counter 321, an adder 322, an adder 323, and a register 324.

As the overall processing performed by the run length processing section 320, the 4-bit binary signal stored in the register 312 of the image reading section 310 and the MSB data from the register 311 are input, to determine a "closed run length" and a "carried over run length", to thereby output respective run length and a mask value indicating whether the run length is the closed one or one to be carried over. An output example of the run length processing section 320 with respect to a specific input of IDOT will be described later, with reference to FIG. 6 and FIG. 7.

Hereinafter, the 4-bit binary signal (image pattern) is appropriately referred to as an "IDOT". The MSB data is also appropriately referred to as an "NDOT". The closed run length stands for a run length in which the first and the last of the run length could have been judged determinately as a length (a number of value of continuous 0 or 1).

For example, if IDOT is '0000' and the NDOT is 1, one closed run length exists in the IDOT. Similarly, if IDOT is '1010' and the NDOT is 1, if the former pattern is ignored, there exist four closed run lengths, and if IDOT is '1010' and the NDOT is 0, if the former pattern is ignored, there exist three closed run lengths. On the other hand, if IDOT is '0000' and the NDOT is also 0, there is no closed run length.

In the last two examples, since the signal value of the last bit of the IDOT and the NDOT are the same, the run length cannot be determined. Therefore, 1 or 4 is handed over as a "run length to be carried over", respectively, and the run length is determined by the IDOT to be input thereafter. This run length to be carried over is hereinafter appropriately referred to as "RUNX".

Here, the operation of each section of the run length processing section 320 will be described. The run counter 321 receives the IDOT and the NDOT from the image reading section 310, and outputs maximum four run lengths. In the figure, the run length is expressed as RUN3 to RUN0. DMASK3 to DMASK0 show a flag indicating whether the run lengths RUN3 to RUN0 are closed or to be carried over. AFL shows a flag that becomes 1, only when all the bits in the IDOT are 0 or 1 (that is, the IDOT is '0000' or '1111' signal), and the NDOT has the same value, and in other cases, becomes 0. A specific output pattern of the run counter 321 will be described later, with reference to FIG. 8 to FIG. 11.

When the AFL is 1, the adder 322 newly sets, as RBRUN3, the result of adding the run length to be carried over to the next processing, RUNX (that is, 4) to the total value (this value is designated as RUN3) of the run length RUNX carried over by the former processing of the IDOT. On the other hand, when the AFL is 0, the adder 322 sets the run length RUNX to be carried over to the next processing as RBRUN3.

The adder 323 adds the first run length (this value is designated as RUN3) in the processing of IDOT this time and RBRUN3, which is the total run length carried over until now set in the previous processing, to thereby determine the run length, taking RBRUN3 into consideration.

That is to say, even if signals are input only by 4 bits by the adders 322 and 323 in the image reading section 310, an optional run length having a value larger than 4 can be calculated.

Figure 6:
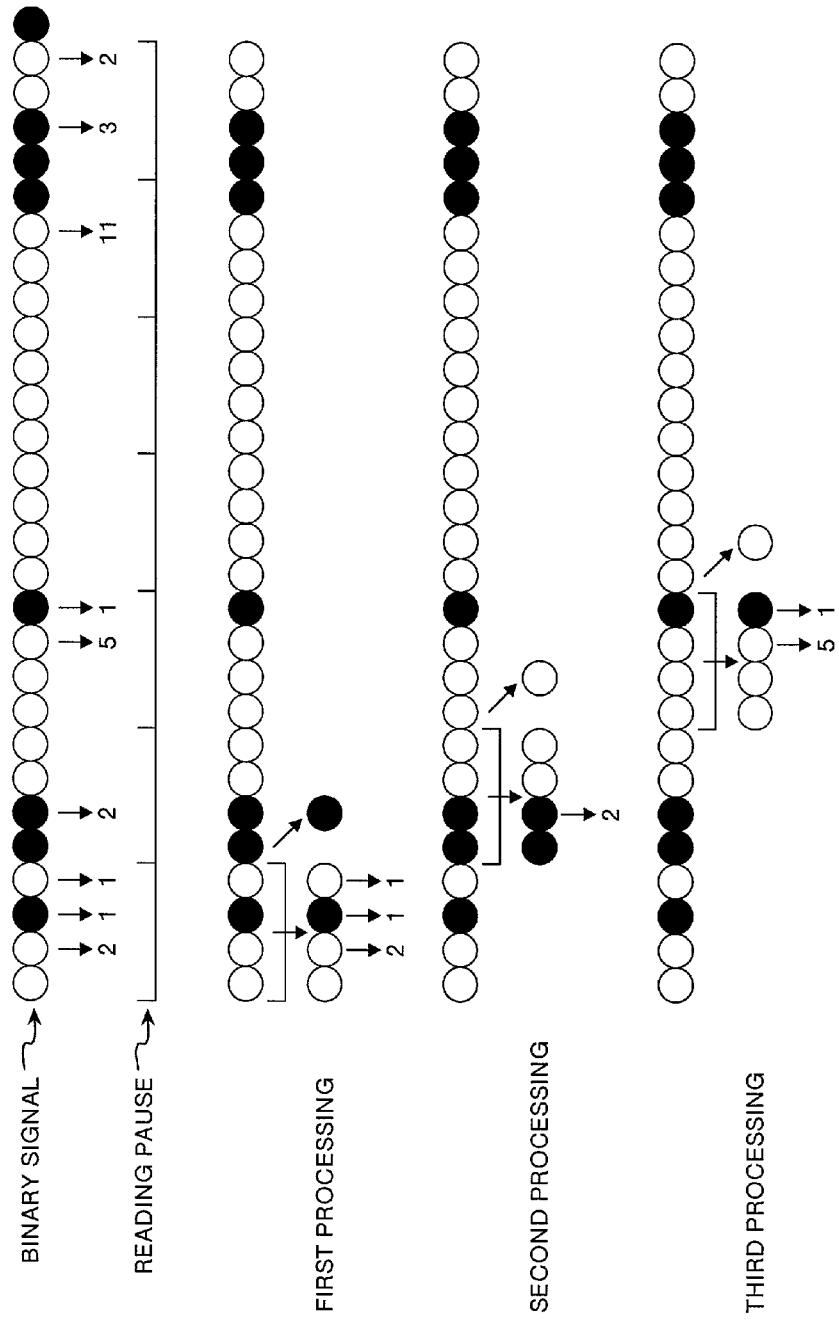
FIG. 6 is a diagram showing an example of a processing performed by the run length processing section.
Figure 7:
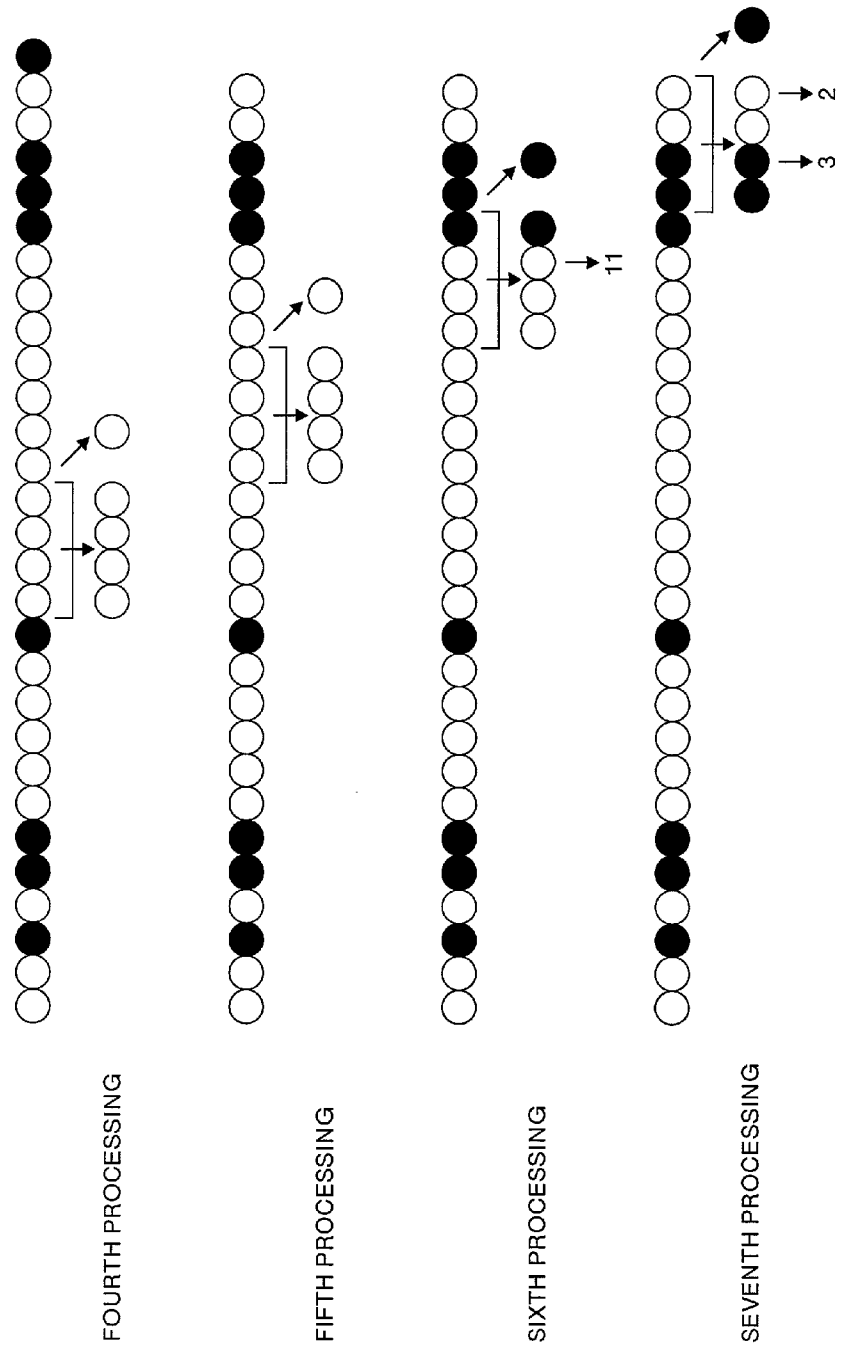
FIG. 7 is a continuation of the processing shown in FIG. 6.
Figure 8:
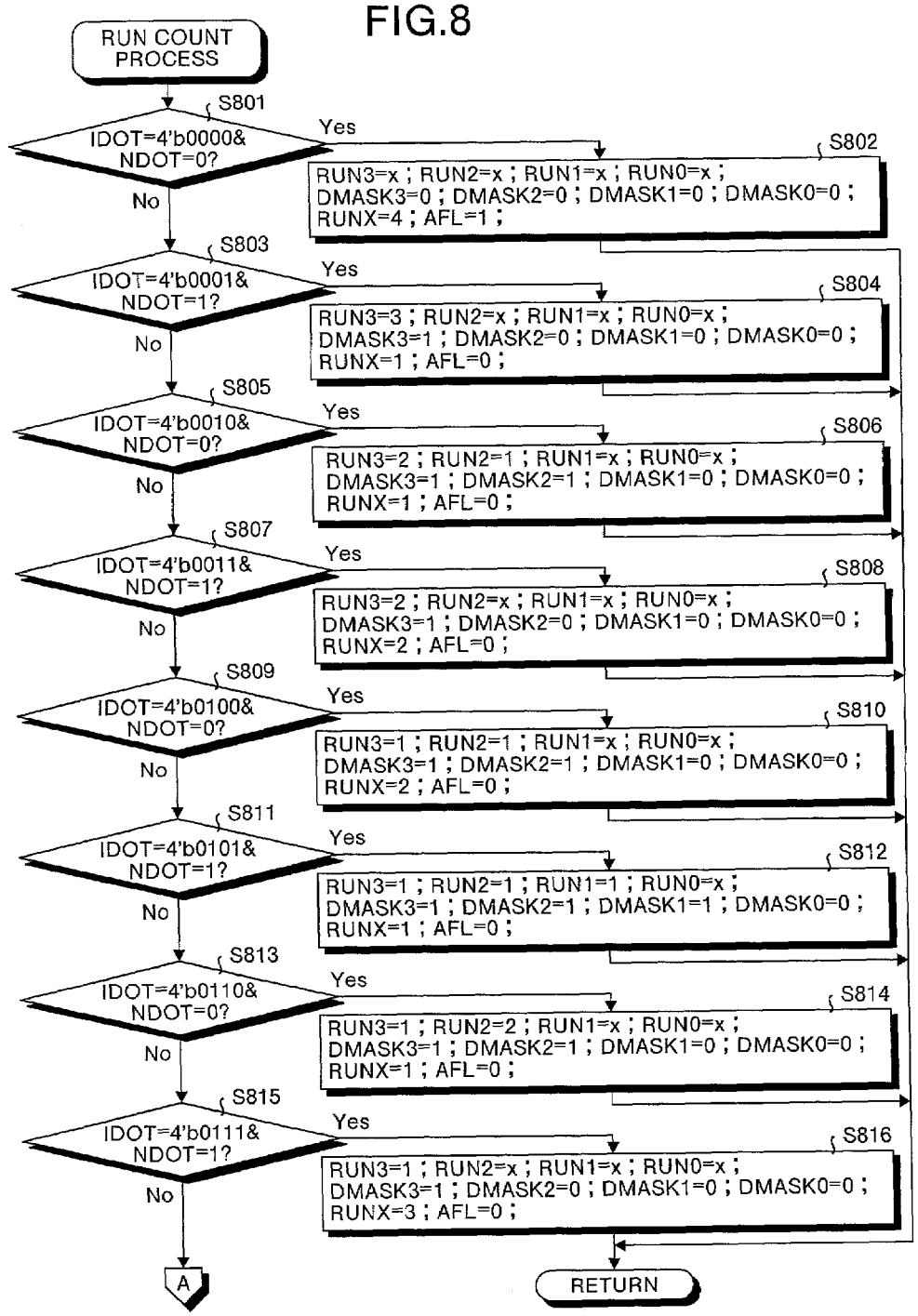
FIG. 8 is a flowchart showing one example of a processing performed by a run counter.
Figure 9:
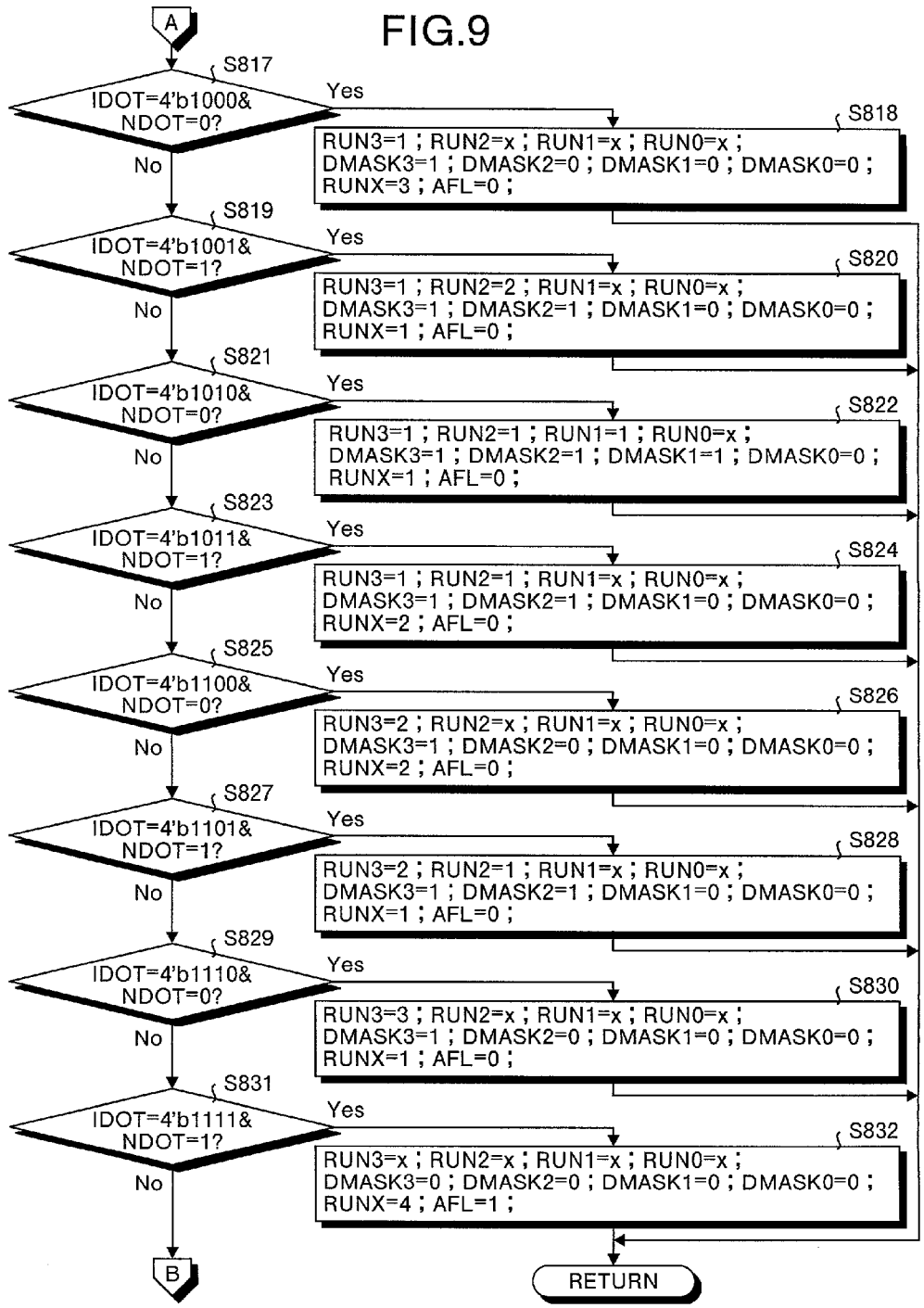
FIG. 9 is a continuation of the flowchart shown in FIG. 8.
Figure 10:
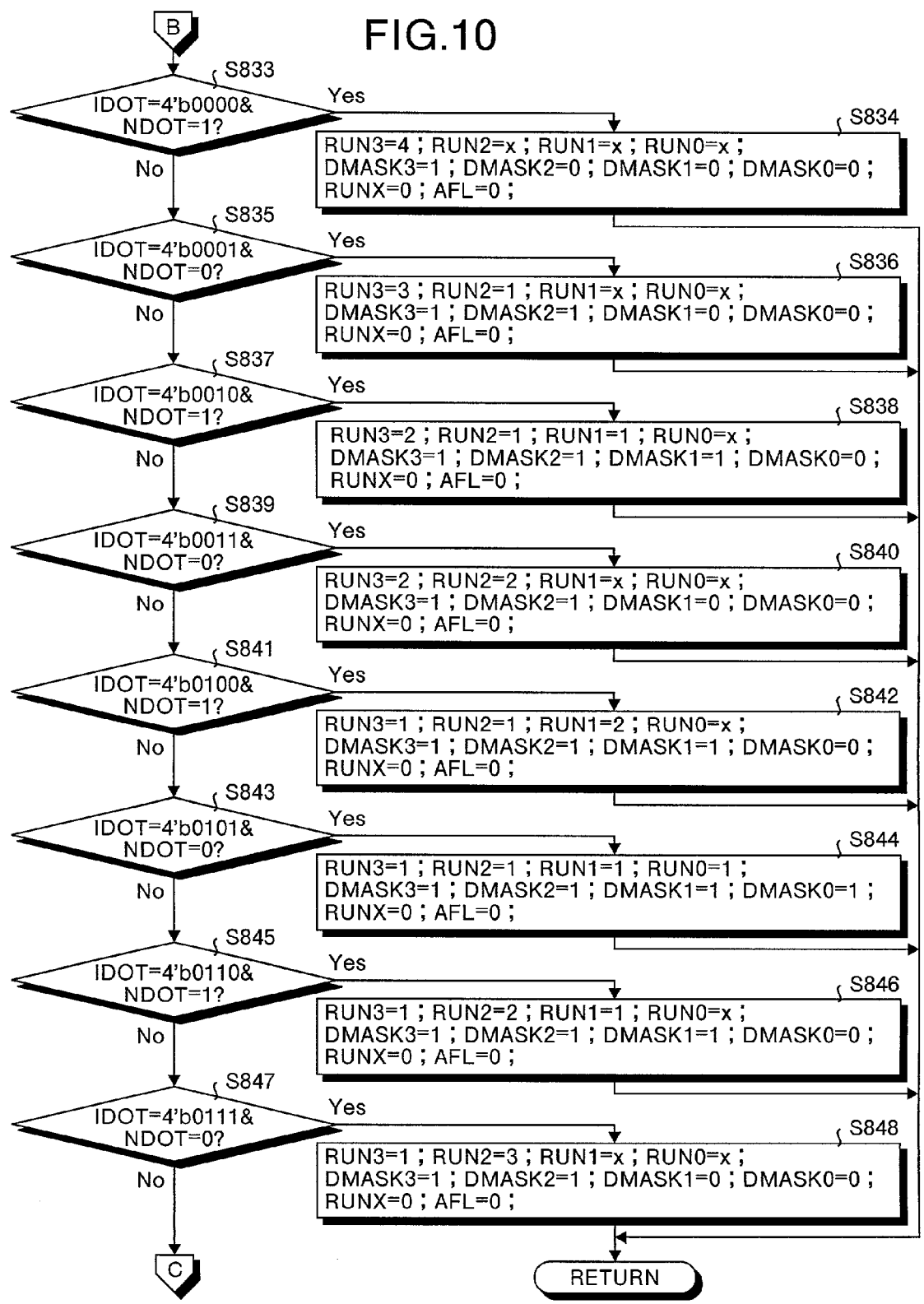
FIG. 10 is a continuation of the flowchart shown in FIG. 9.
Figure 11:
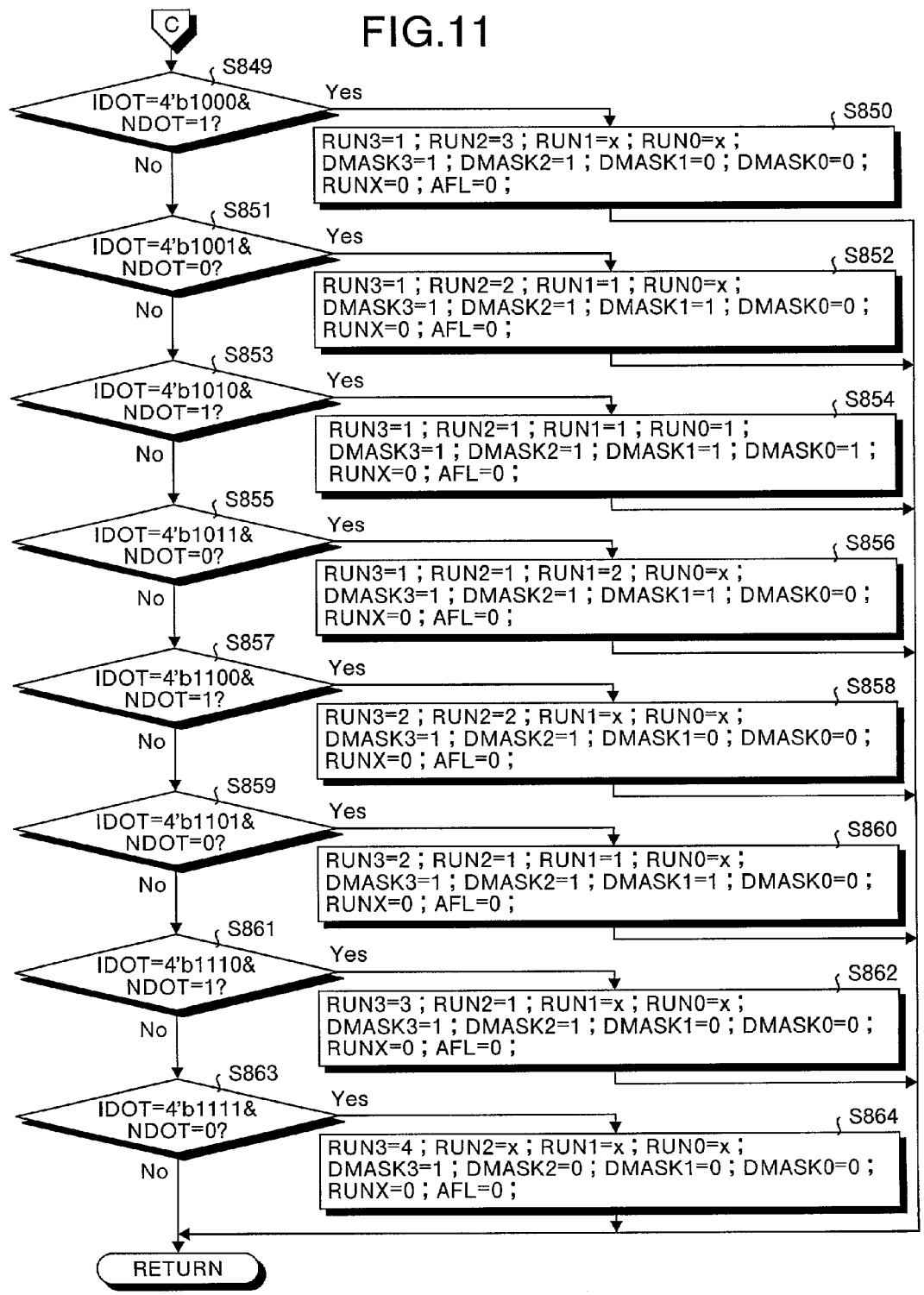
FIG. 11 is a continuation of the flowchart shown in FIG. 10.

An output example of the run length processing section 320 with respect to a specific IDOT will now be described. FIG. 6 and FIG. 7 are diagrams showing the processing example of the run length processing section 320. White circles indicate signal 0, and black circles indicate signal 1. At first, in the first processing, since the last bit of the image pattern is '0', and the first signal (IDOT) of the next image pattern is '1', this parallel-processed first image pattern has three closed run lengths '2', '1' and '1'.

In the second processing, since the last bit of the image pattern is '0', and the first signal (IDOT) of the next image pattern is '0', this parallel-processed image pattern is not closed inside, and the last run length RUNX is handed over to the next processing, wherein the image pattern has one run length '2'.

In the third processing, since the last bit of the image pattern is '1', and the first signal (IDOT) of the next image pattern is '0', this parallel-processed image pattern is closed inside, and since there is the run length '2' continuous from the previous processing, it is added to the first run length '3' in this image pattern, thereby the first run length RUN3 becomes 5. Therefore, in the third processing, two run lengths, '5' and '1' are calculated.

The fourth processing and the fifth processing are not closed, and there is no run length. In the subsequent sixth processing, the total value RBRUN3 of the carried over run length is added to the first run length '3' in this bit, to obtain one run length '1'. The run length processing section 320 outputs the run length sequentially in this manner.

Next, a specific output of the run counter will be described. FIG. 8 to FIG. 11 are flowcharts showing one example of the processing performed by the run counter 321. The run counter 321 judges 32 patterns in total, combining 16 combination patterns of 4-bit signals of the IDOT and 2 combination patterns of the 1-bit signal of the IDOT. In these figures, 4'b indicates that the input signal is 4 bit.

The run counter 321 first judges if the IDOT is '0000', and the NDOT is 0 (step S801). If these conditions are satisfied (step S801: YES), the run length is not obtained in this IDOT, and hence signal values of RUN3 to RUN0=x, DMASK3 to DMASK0=0, RUNX=4 and AFL=1 are output, designating the code x as a symbol that does not output a value (step S802), to thereby terminate the processing (return). If these conditions are not satisfied (step S801: NO), the control moves to step S802.

The run counter 321 judges in step S802, if the IDOT is '0001', and the NDOT is 1 (step S803). If these conditions are satisfied (step S802: YES), signal values of RUN3=3, RUN2 to RUN0=x, DMASK3=1, DMASK2 to DMASK0=0, RUNX=1 and AFL=0 are output (step S804), to thereby terminate the processing (return). If these conditions are not satisfied (step S802: NO), the control moves to step S805.

In the same way, the run counter 321 sequentially performs judgment until step S864, according to need. The judgment step in the figure is only an example, and for example, as step S803, it may be judged if the IDOT is '1111' and the NDOT is 1. In this manner, by rearranging the judgment step appropriately, the time for judgment processing can be reduced.

Figure 12:
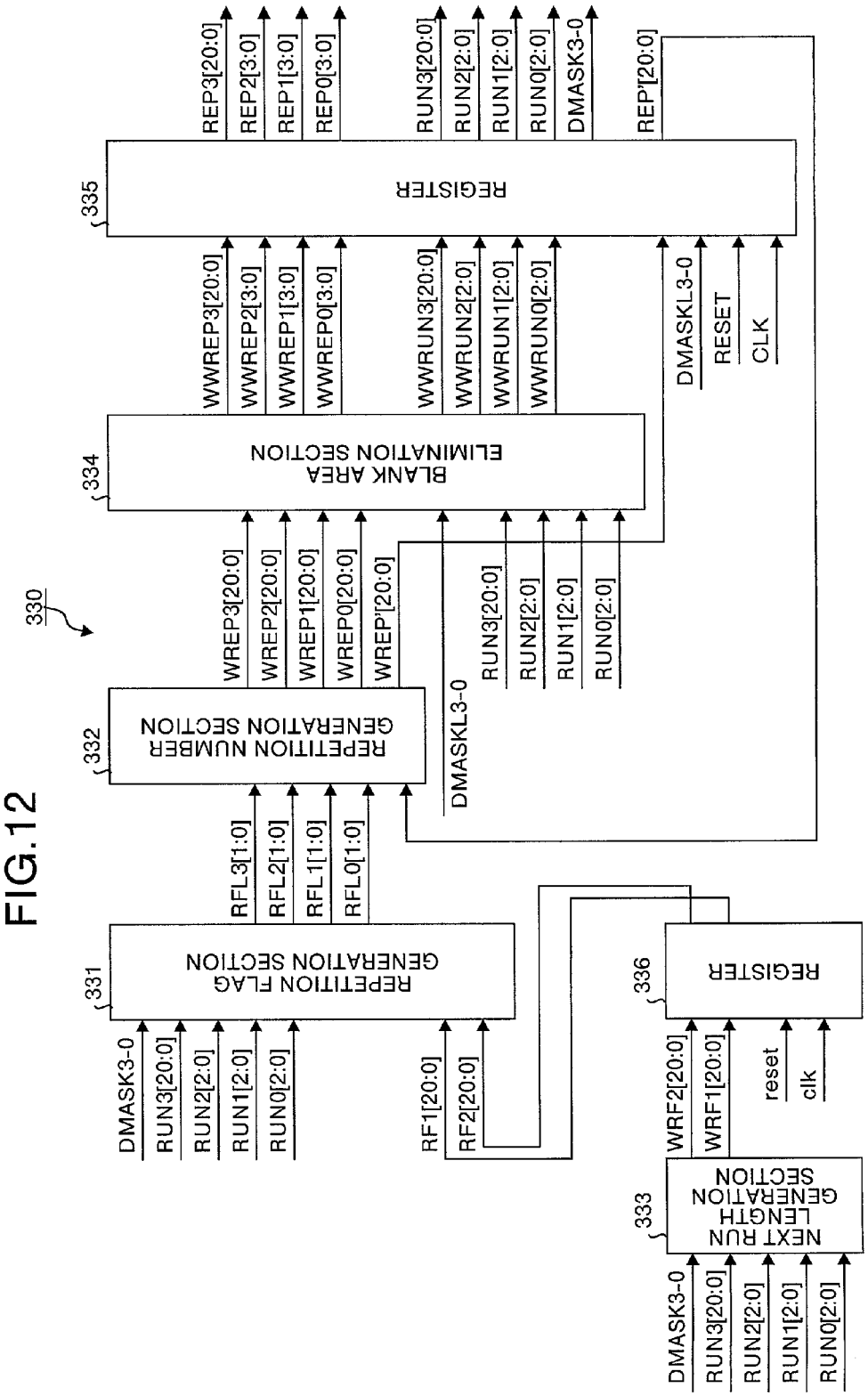
FIG. 12 is a block diagram showing one example of a construction of a repetitive processing section.

The contents of the repetitive processing section 330 will now be described. FIG. 12 is a block diagram showing one example of a construction of a repetitive processing section 330. The repetitive processing section 330 comprises a repetition flag generation section 331, a repetition number generation section 332, a NEXT run length generation section 333, a blank area elimination section 334, a register 335 and a register 336.

As the overall processing performed by the repetitive processing section 330, the run length determined by the run length processing section 320 is input, to judge whether it is the run length of signals of the same kind, that is, it is the same as the numerical value of a run length two before, and if it is the same, it is counted up sequentially and output as a repetitive number. An output example of the repetitive processing section 330 with respect to a specific input of the run length will be described later, with reference to FIG. 13 and FIG. 14.

Here, the processing contents of each section of the repetitive processing section 330 will be described. The repetition flag generation section 331 receives a plurality of run lengths RUN3 (~RUN0) from the run length processing section 320, the mask value DMASK3 (~DMASK0) corresponding thereto, and a run length two before and a run length one before in the previous pattern, to thereby judge whether the input each run length RUN3 (~RUN0) agrees with the run length two before or not, and outputs a repetition flag RFL3 (~RFL0).

If the input run length RUN is the same as the run length two before, the repetition flag RFL is designated as '1' if the input run length RUN is not the same as the run length two before, is designated as '0', and as '2' in other cases. The number of run length RUN to be input at a time is maximum 4, and here, the other cases stand for a case where, for example, if only RUN3 and RUN2 are input, RFL1 becomes 2, and RFL0 becomes 2. The expression of (~RUN0), (~DMASK0), and (~RFL0) is given for noting that four values are not necessarily input.

Figure 15:
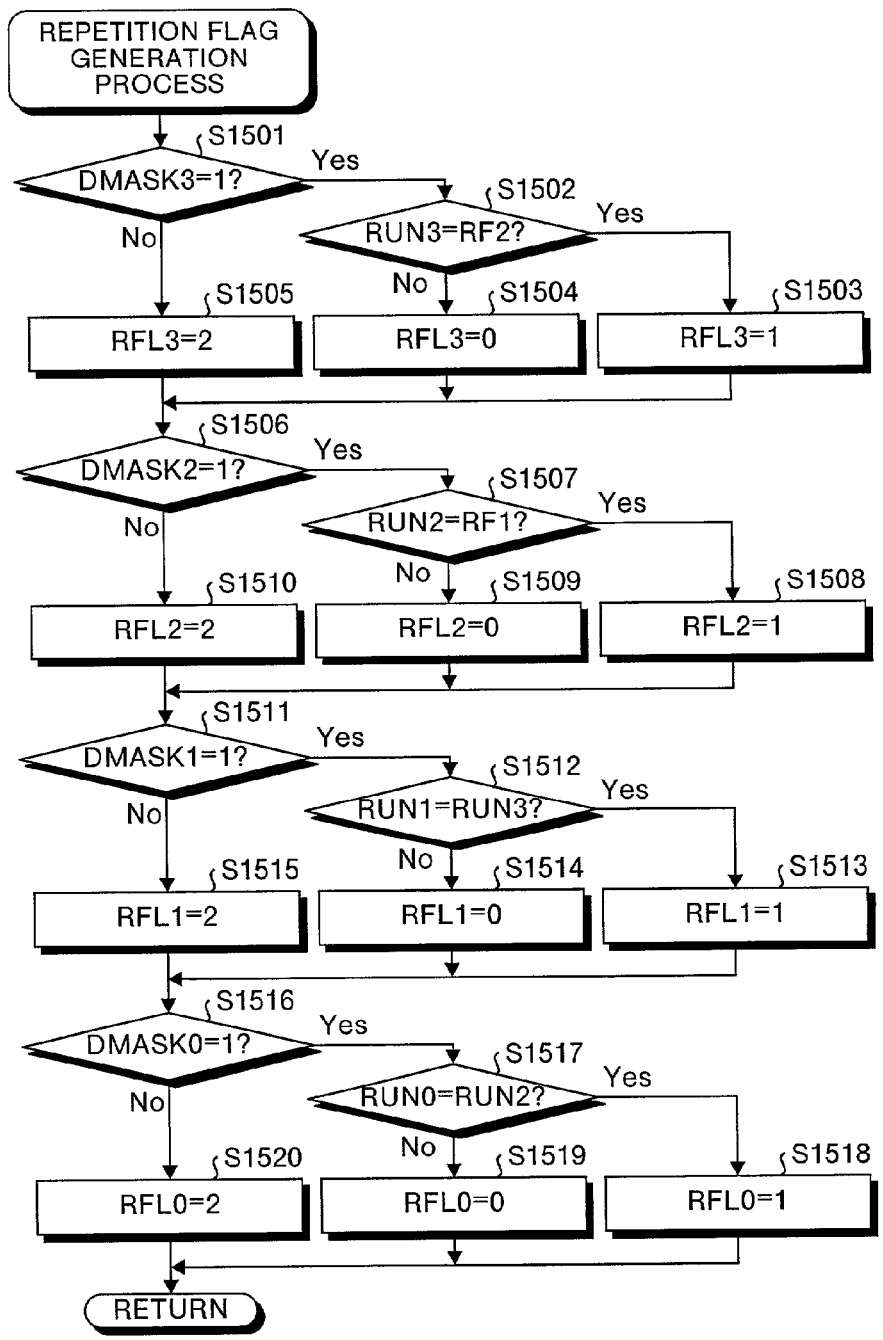
FIG. 15 is a flowchart showing one example of a processing performed by a repetition flag generation section.

Specific processing contents of the repetition flag generation section 331 will be described later with reference to FIG. 15.

The repetition number generation section 332 receives the repetition flags RFL3 to RFL0 from the repetition flag generation section 331 and the carried over repetition number (REP'), to thereby generate a new repetition number. Here, the carried over repetition number REP' means that repetition in the run length is not finished in the input set of this run length and the repetition number is judged in the subsequent input set. The specific processing contents of the repetition number generation section 332 will be described later with reference to FIG. 16.

The blank area elimination section 334 shifts a portion judged to be repetitive by the repetition number generation section 332, from a plurality of repetition numbers and a plurality of run lengths received from the repetition number generation section 332, and having no information (the repetition is 0), to thereby cut down the repetition number and the run length towards WREP3 and WWRUN3.

The NEXT run length generation section 333 determines the second run length from the rear and the first run length from the rear input this time, in order to generate a repetition flag with respect to the run length RUN3 to RUN0 to be input next. The specific processing contents of the NEXT run length generation section 333 will be described later with reference to FIG. 21.

Figure 13:
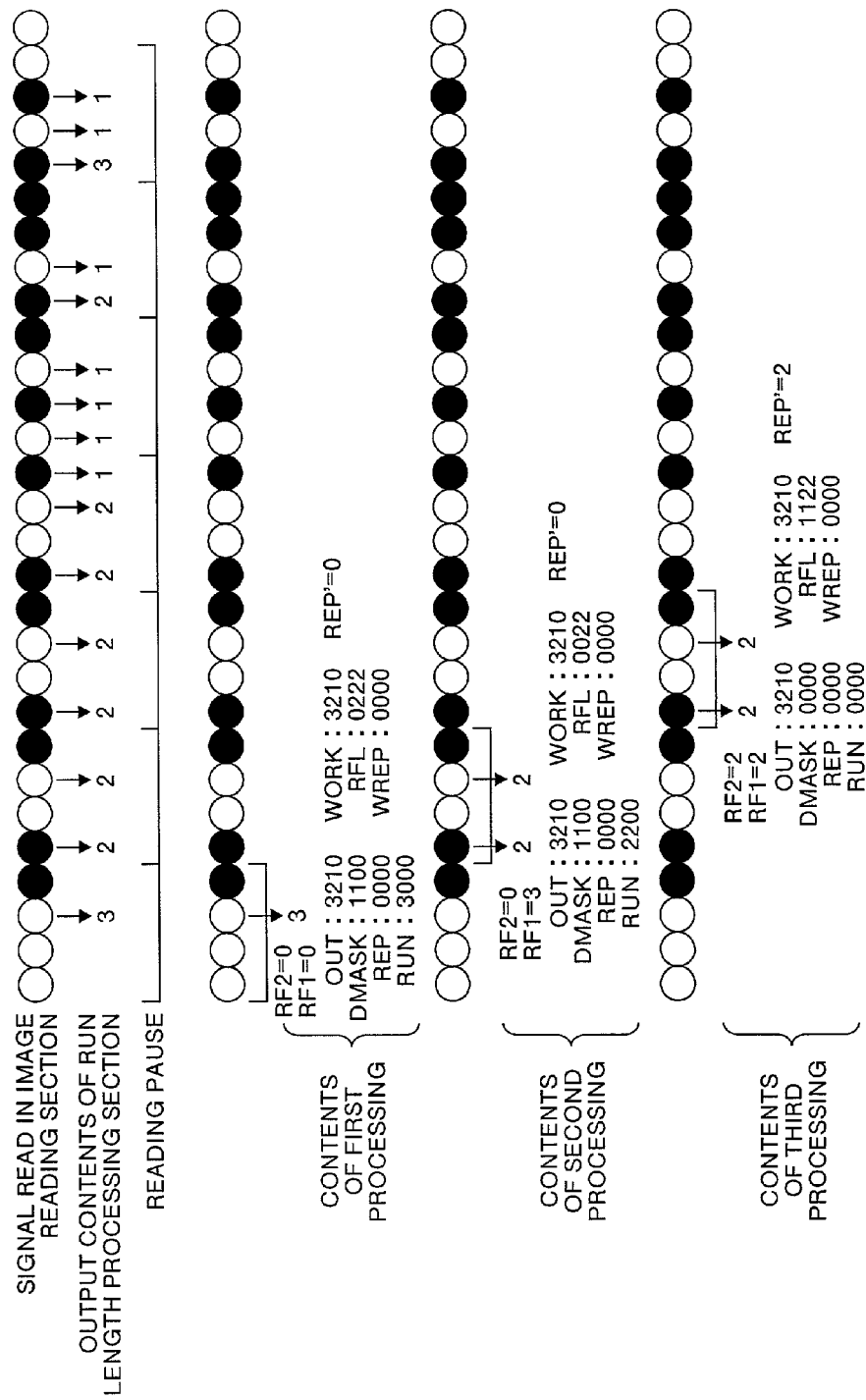
FIG. 13 is a diagram showing a specific example of a processing performed by the repetitive processing section.
Figure 14:
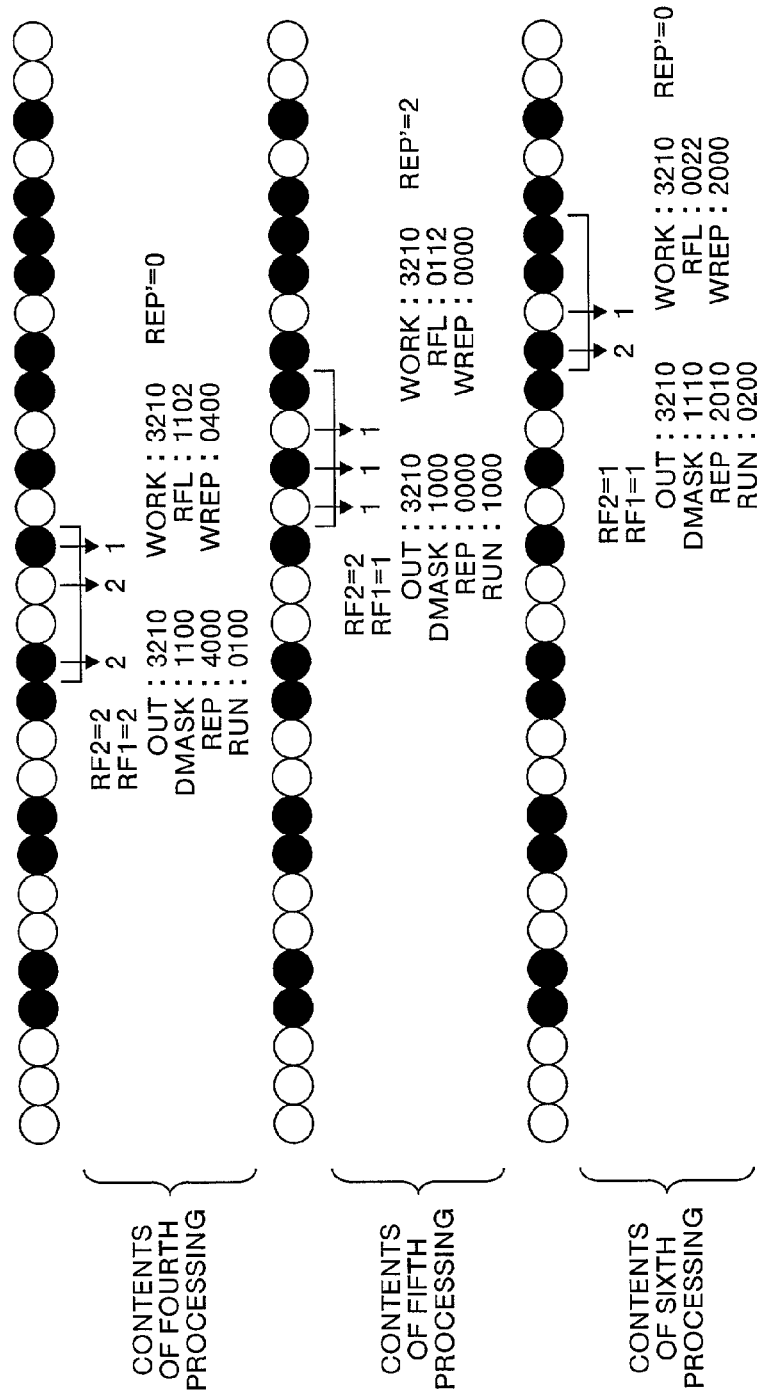
FIG. 14 is a continuation of the processing shown in FIG. 13.

The specific contents of the repetitive processing section 330 will now be described, using a specific input set of run length. FIG. 13 and FIG. 14 are diagrams showing a specific example of processing of the repetitive processing section 330. As shown in those figures, the input queue of run length becomes '3' 22' 22' 221' 111' 21' 331'. Here, ' represents a pause of the input set, corresponding to the reading pause shown in FIG. 6 and FIG. 7.

Of the respective processing contents in the figure, 3210 in OUT and WORK denotes an identification symbol for identifying an output of the repetitive processing section 330 in each set. DMASK denotes an effective flag of the run length, and '1' indicates that it is effective, that is, closed. REP denotes repetition number, and '0' indicates that the item is not a repetition, but a run length. RUN denotes a run length. RFL denotes a repetition flag output from the repetition flag generation section 331, and if the item is a run length, 0 is indicated, if the item is a repetition, 1 is indicated, and if there is nothing, 2 is indicated. WREP denotes a repetition number determined by the repetition number generation section 332. REP' is a carried over repetition number.

RF2 and RF1 indicate the last run length of the previous image pattern, RF1 indicating the run length one before, and RF2 indicating the run length two before. The initial value of RF1 and RF2 is designated as 0, which is an impossible value as a run length.

At first, in the first processing, one run length '3' is input, but repetition is not possible. In the second processing, two run lengths of '2', '2' are input, but repetition is not possible, either.

In the third processing, two run lengths '2' and '2' are input. At this time, the first run length '2' agrees with the numerical value of RF2, and is recognized as a repetition number. The next run length '2' also agrees with the numerical value of RF1, and is recognized as a repetition number. As a result, the repetition flag RFL becomes such that RFL3 and RFL2 become '1'.

Moreover, since it cannot be judged in this input set whether the repetition of the run length is finished or not, the item of RFL1 becomes '2', indicating that this repetition is still continuing. Therefore, the carried over repetition number '2' is stored in REP'. At the same time, in this set, since the determined repetition number is not output, WREP is 0.

In the fourth processing, three run lengths, '2', '2', '1' are input. As in the third processing, the run length of the first '2' agrees with RF2, and is recognized as a repetition number. The next run length '2' also agrees with the numerical value of RF1, and is recognized as a repetition number. However, the next '1' does not agree with the numerical value of the run length two before, hence it is not recognized as a repetition.

As a result, in the items of the repetition flag RFL3 and RFL2, RFL3 and RFL2 become '1' and RFL1 becomes '0'. That is to say, in this set, it is indicated that the phenomenon of repetition carried over from the third processing has been terminated. Therefore, the repetition number '4' is indicated in the terminated position item 3 in WREP.

Then, since a blank exists in the item 3 of WREP, the blank in the item 3 is eliminated by the blank area elimination section 334 and shifted by one, so that REP and RUN of OUT become as shown in the figure. When a blank occurs, the blank area elimination section 334 eliminates the blank portion and cut down the space, thereby making it possible to keep the rule of the format, at the time of transferring to the next processing section. As a result, the processing section in the next process can receive the data in a simple format, thereby enabling reduction of gates in the hardware, and improvement of the processing speed.

In the fifth processing, three run lengths, '1', '1', '1' are input. Here, the first run length '1' does not agree with RF2, and the next run length '1' agrees with RF1. The next run length '1' agrees with the run length '1' two before. Here, continuous two repetitions occur. The processing thereafter is similar to the above described processing and processed sequentially in the same manner.

The processing performed by the repetition flag generation section 331 in the repetitive processing section 330 will be described. FIG. 15 is a flowchart showing one example of the processing performed by the repetition flag generation section 331. The repetition flag generation section 331 judges if DMASK3=1 or not, of the run length RUN3 to RUN0 input from the run length processing section 320, and DMASK3 to DMASK0 corresponding thereto (step S1501) When DMASK3=1 (step S1501: YES), it is judged whether the run length RUN3 has the same value as that of the run length RF2 two before stored in the register 336 (step S1502) If these are the same value (step S1502: YES), the repetition flag RFL3 is set to 1 (step S1503). On the other hand, if these are not the same value (step S1502: NO), the repetition flag RFL3 is set to 0 (step S1504).

Moreover, if DMASK is not 1 (step S1501: NO), the repetition flag RFL is set to 2. This means that there is no corresponding run length. In this case, since DMASK2 to DMASK0 are not 1, RFL2 to RFL0 are set to 2, thereby the processing may be terminated.

According to the above processing, the repetition flag RFL3 is set. The values of the repetition flag RFL2 to RFL0 are also set, respectively, based on the values of DMASK2 to DMASK0. Since the processing procedure is the same, the description thereof is omitted.

Figure 16:
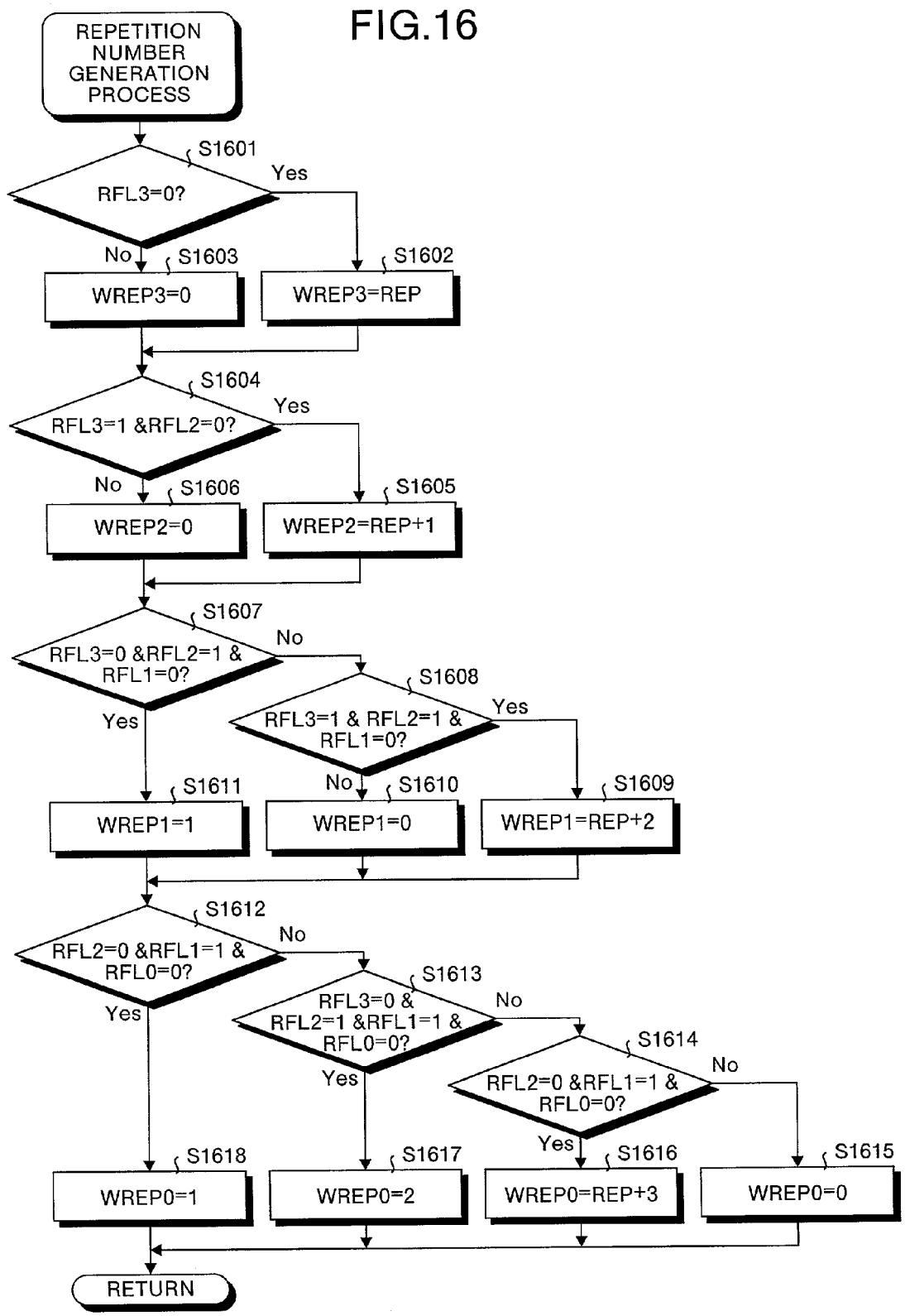
FIG. 16 is a flowchart showing one example of a processing performed by a repetition number generation section.
Figure 17:
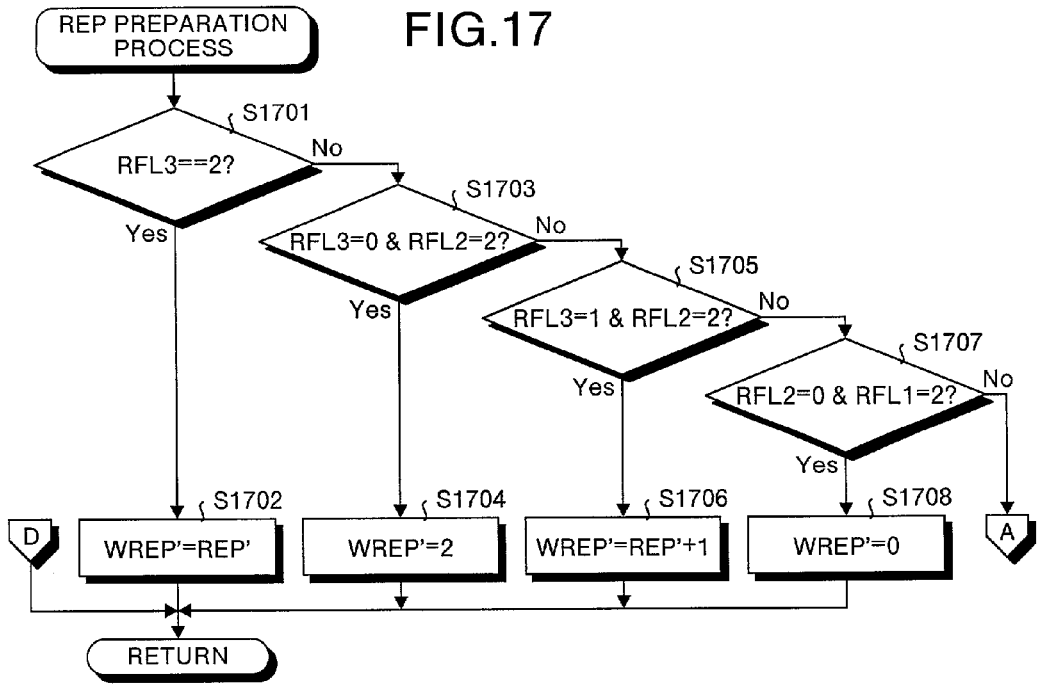
FIG. 17 is a continuation of the processing shown in FIG. 16.
Figure 18:
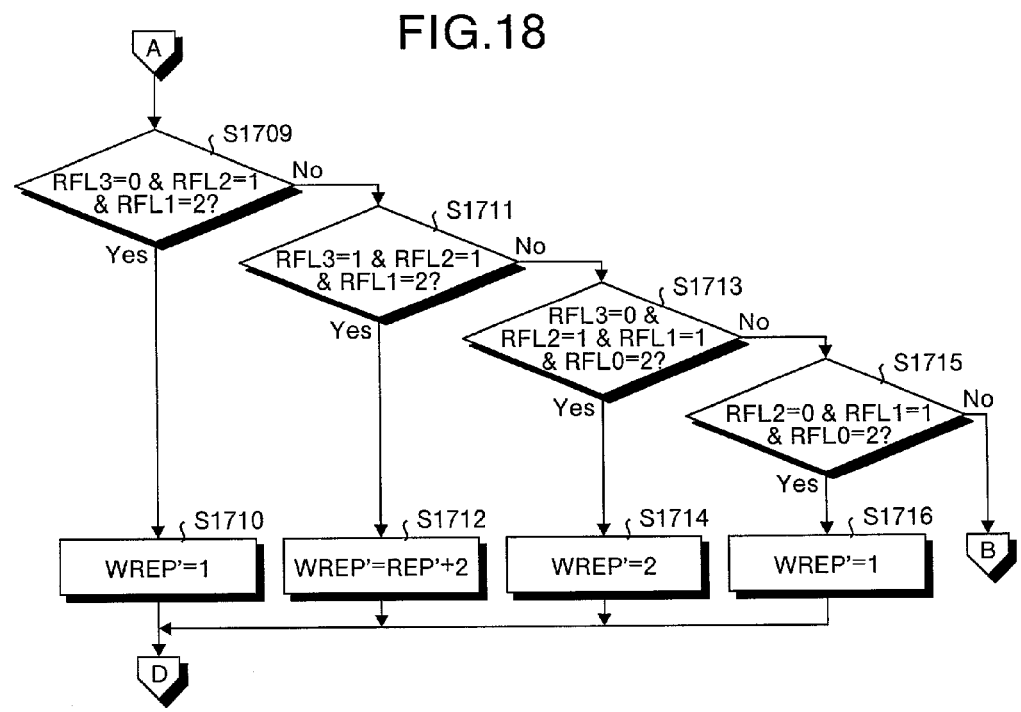
FIG. 18 is a continuation of the processing shown in FIG. 17.
Figure 19:
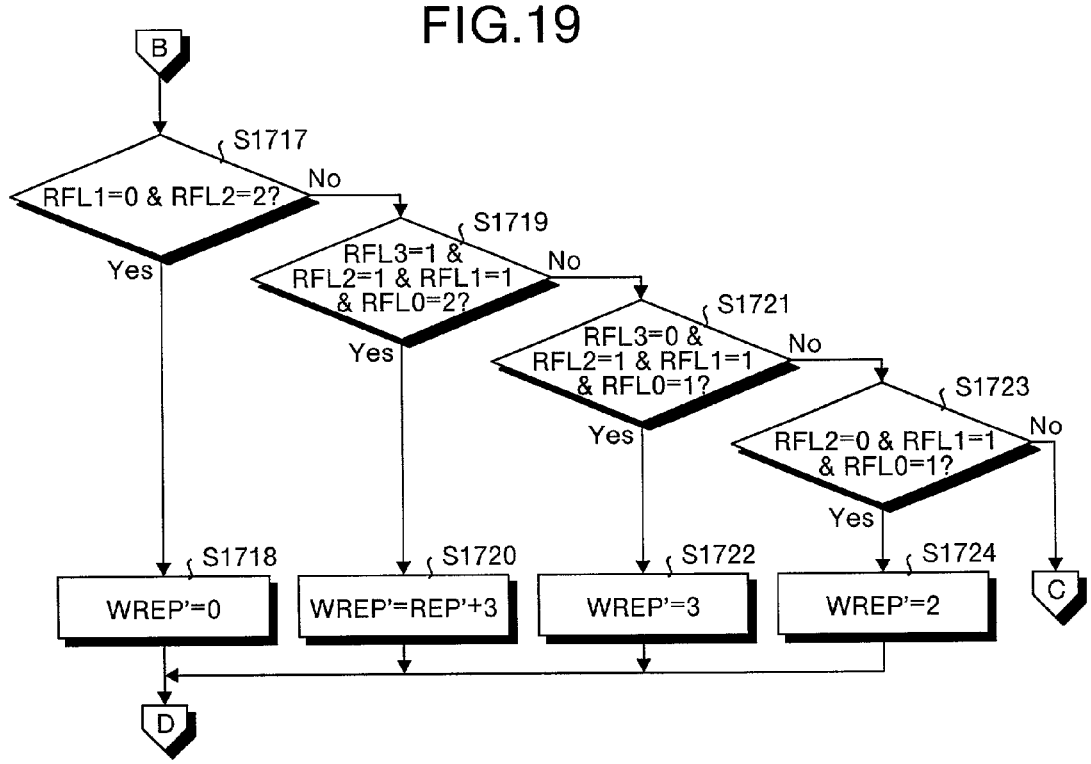
FIG. 19 is a continuation of the processing shown in FIG. 18.
Figure 20:
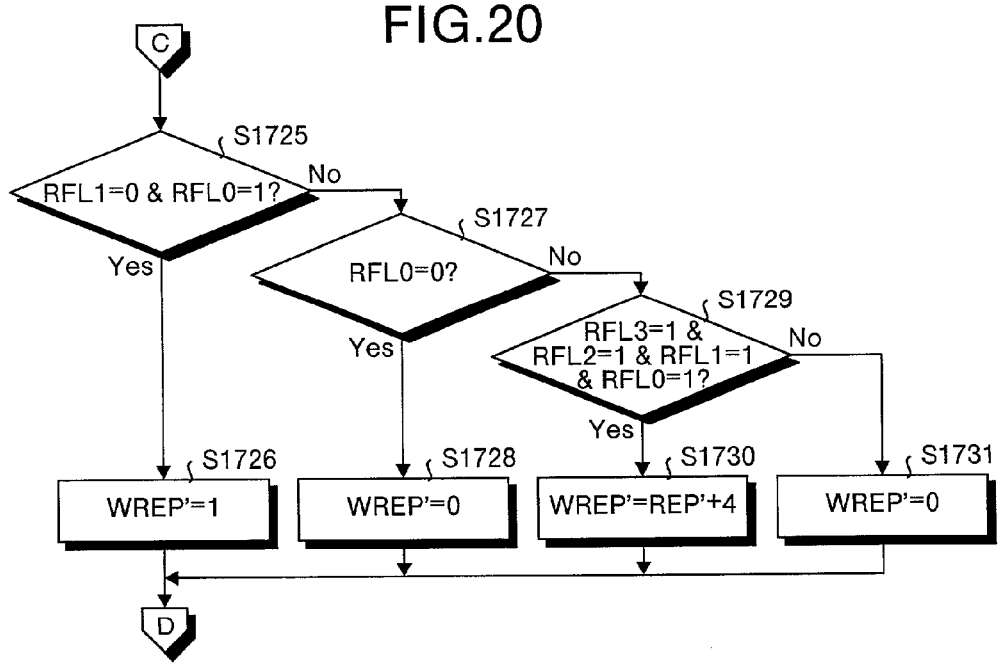
FIG. 20 is a continuation of the processing shown in FIG. 19.

The processing performed by the repetition number generation section 332 in the repetitive processing section 330 will be described. FIG. 16 is a flowchart showing one example of the processing performed by the repetition number generation section 332. The repetition number generation section 332 first judges whether RFL3=0 or not, of the repetition flags RFL3 to RFL0 input from the repetition flag generation section 331 (step S1601). When RFL3=0 (step S1601: YES), the value of REP is substituted as the value of WREP3 (step S1602). On the other hand, if RFL3 is not 0, (step S1601: NO), WREP3 is set to 0 (step S1603).

The contents of the setting flow of this WREP3 will now be described. The repetition number REP is counted up while repetition continues, and at a point where the repetition stops in respective positions, the final number of repetition is obtained. The repetition number for the third bit is obtained, according to step S1601 to step S1603 (however, one output from the repetition number generation section 332 is not REP, but is expressed as WREP). That is to say, if the repetition flag RFL3 is 0, the comparison results in the repetition flag generation section 331 do not agree with each other. Hence, the repetition number up to now is cleared, and the repetition number (REP) up to now is substituted in the repetition number WREP3. If RFL3 is 1, since repetition is continuing, the repetition number (WREP3) is set to 0.

It is then judged if RFL3=1, and RFL2=0 (step S1604) When these conditions are satisfied (step S1604: YES), a value obtained by counting up REP by 1 is substituted as a value of WREP2 (step S1605). On the other hand, if these conditions are not satisfied (step S1604: NO), WREP2 is set to 0 (step S1606).

The repetition number WREP2 is determined in step S1604 to step S1606. The repetition number generation section 332 judges if the repetition flag RFL3=1 and RFL2=0 (step S1604). If these conditions are satisfied (step S1604: YES), the repetition number REP up to now and the repetition number 1 this time (since RFL3=1) are added and the added value is substituted in the repetition number WREP2 (step S1605). On the other hand, if these conditions are not satisfied (step S1604: NO), the repetition number WREP2 is set to 0 (step S1606).

Thereafter, WREP1 and WREP0 are determined in the same manner, respectively, in step S1607 to step S1611, and in step S1612 to step S1618.

The processing flow for determining the carried over repetition number REP' will now be described. FIG. 17 to FIG. 20 are flowcharts showing one example of the processing flow for determining the repetition number REP' to be carried over. At first, it is judged whether the repetition flag RFL3 is 2 or not (step S1701). If RFL3=2 (step S1701: YES), since a run length having the highest priority level cannot be determined, the repetition number up to now (REP') is held (step S1702). At this time, the carried over repetition number output from the repetition number generation section 332 is expressed as WREP' for convenience' sake.

On the other hand, If RFL3 is not 2 (step S1701: NO), it is judged if RFL3=0 and RFL2=2 (step S1703). If these conditions are satisfied (step S1703: YES), since the repetition flag RFL3 is 0, and RFL2 is 2, the run length having the highest priority level is not repetitive, and there is no run length thereafter, the repetition number WREP' is set to 0 (step. S1704).

On the other hand, if these conditions are not satisfied in step S1703 (step S1703: NO), it is judged if the repetition flag RFL3=1 and RFL2=2 (step S1705). If these conditions are satisfied (step S1705: YES), since the run length having the highest priority level is repetitive, and there is no run length thereafter, the repetition number WREP' up to now (REP') is added by the repetition number 1 this time, and the added value is substituted in the repetition number WREP' (step S1706).

On the other hand, if these conditions are not satisfied in step S1705 (step S1705: NO), it is judged if the repetition flag RFL2=0 and RFL1=2 (step S1707). If these conditions are satisfied (step S1707: YES), since RFL1 is 2 and RFL2 is termination here, the repetition number WREP1 to be continued to the next pattern is set to 0 (step S1708).

Thereafter, through step S1709 to step S1731, the value of the repetition number WREP' to be carried over can be obtained, based on the values of RFL3 to RFL0 input from the repetition flag generation section 331.

Figure 21:
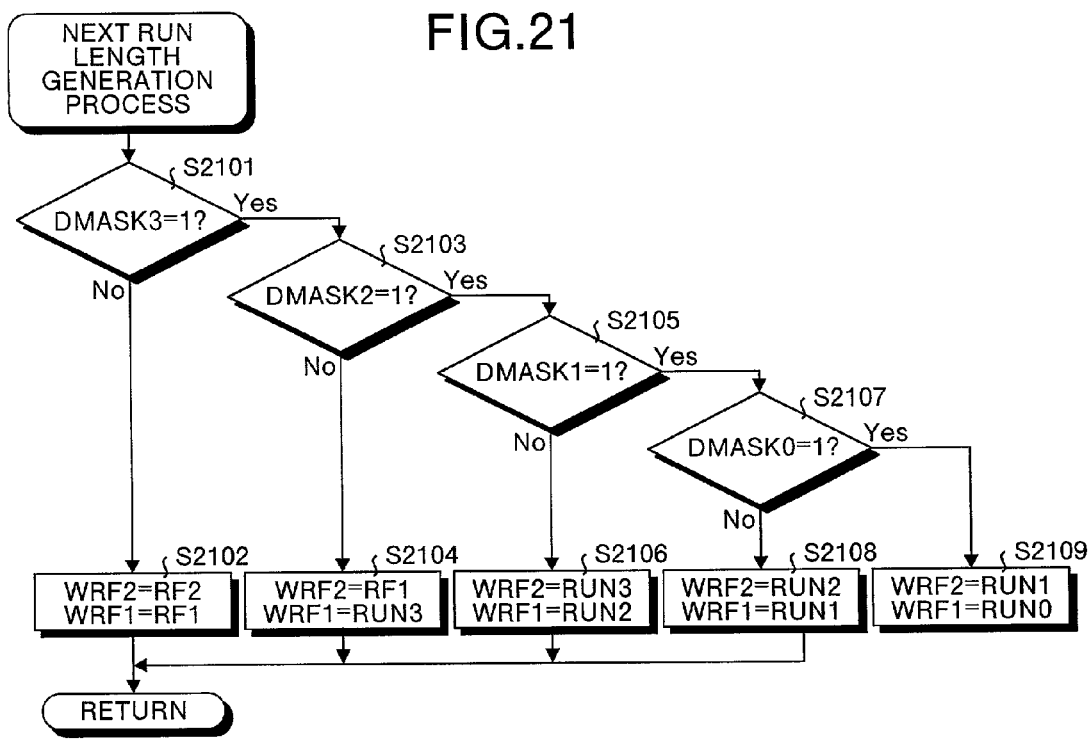
FIG. 21 is a flowchart showing one example of a processing performed by a NEXT run length generation section.

The processing performed by the NEXT run length generation section 333 in the repetitive processing section 330 will be described. FIG. 21 is a flowchart showing one example of the processing performed by the NEXT run length generation section 333. The NEXT run length generation section 333 first judges if DMASK3 is 1 or not (step S2101).

When DMASK3 is not 1 (step S2101: NO), since there is no closed run length in RUN3, the value of two before (WRF2) and the value of one before (WRF1) from the last of the previous pattern are maintained as it is (step S2102). WRF2 and WRF1 indicate, for the convenience' sake, the run length RF2 two before and RF2 one before, respectively output from the NEXT run length generation section 333.

On the other hand, if DMASK3=1 (step S2101: YES), it is judged if DMASK2 is 0 or not (step S2103). If DMASK2 is not 0 (step S2103: NO), since only one run length exists, the value of RUN3 is substituted as the run length WRF1 one before from the last, and RF1 one before from the last is substituted as the run length WRF2 two before from the last (step S2104).

On the other hand, if DMASK2=1 (step S2103: YES), it is judged if DMASK1 is 0 or not (step S2105). If DMASK1 is not 0 (step S2105: NO), since only two run lengths exist, the value of RUN2 is substituted as the run length WRF1 one before from the last, and the value of RUN3 is substituted as the run length WRF2 two before from the last (step S2106).

On the other hand, if DMASK1=1 (step S2105: YES), it is judged if DMASK0 is 0 or not (step S2107). If DMASK0 is not 0 (step S2107: NO), since only three run lengths exist, the value of RUN1 is substituted as the run length WRF1 one before from the last, and the value of RUN2 is substituted as the run length WRF2 two before from the last (step S2108).

Lastly, if DMASK0 is 0 (step S2107: YES), since four run lengths exist, the value of RUN0 is substituted as the run length WRF1 one before from the last, and the value of RUN1 is substituted as the run length WRF2 two before from the last (step S2109).

Figure 22:
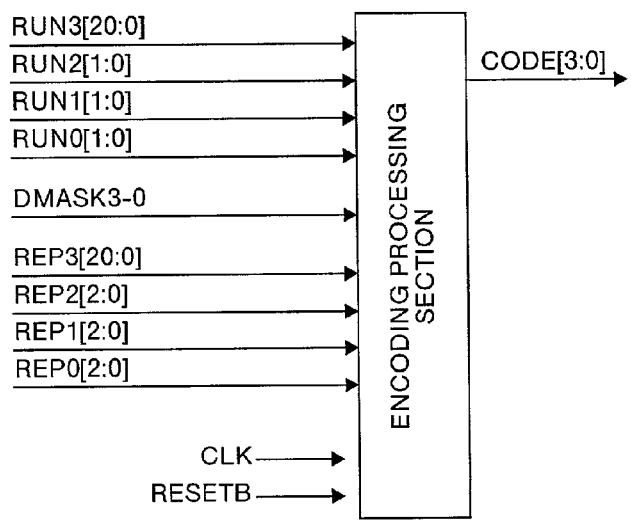
FIG. 22 is a block diagram for explaining an encoding processing section.

The contents of the encoding processing section 340 will now be described. The encoding processing section 340 encodes the run length RUN and the repetition number REP output from the repetitive processing section 330. FIG. 22 is a block diagram for explaining the encoding processing section.

The encoding processing section 340 receives maximum four run lengths RUN (run length RUN3 to run length RUN0) and four repetition numbers REP (REP3 to REP0), and mask values DMASK, and outputs a code (CODE) in a predetermined format.

Figure 23:
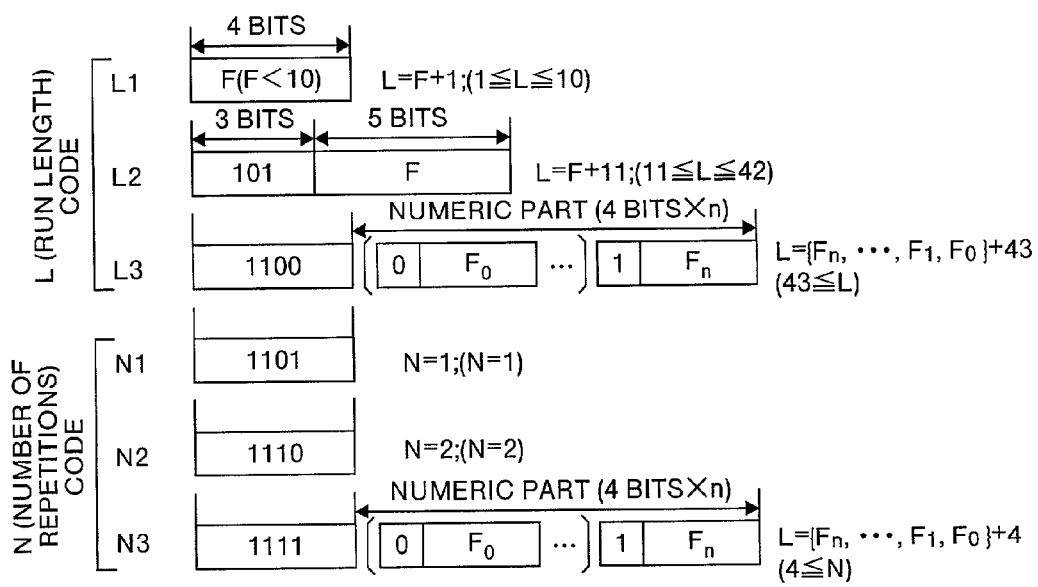
FIG. 23 is a diagram showing an example of codes in a predetermined format.

FIG. 23 is a diagram showing an example of the code in this predetermined format. Here, the encoding processing section 340 outputs a code in a format for every 4 bits. The format of the code may be output for any number of bits. The code is constituted of a code unit of six formats, as shown in the figure. From the first code format L1 to the third code format L3 are L codes representing a numerical value of the run length, and from the fourth code format N1 to the sixth code format N3 are N codes representing the number of repetitions. The first code format L1 has a 4-bit width, and is identified by that the numerical value of the 4 bits is less than "10", and a value obtained by adding "1" to this numerical value corresponds to the run length value L.

The second code format L2 has an 8-bit width, and is identified by that the value of the high-order 4 bits preceding in the code queue is "11" or "12", wherein a value obtained by adding "11" to the value of the low-order 4 bits corresponds to the run length value L. The third code format L3 has a width of at least 8 bits and being a multiple of 4, and is identified by that the value of the high-order 4 bits preceding in the code queue is "12", wherein with respect to each 4 bit following the 4 bits, a value obtained by adding "43" to a value, obtained by concatenating, that is, connecting the low-order 3 bits in each 4 bits towards the high order until a value of 8 or larger is detected in the 4-bit value, corresponds to the run length value L.

The expression written at the right end of the third code format L3, that is, L={Fn, . . . , F1, F0}+43, uses the expression of Verilog (trade mark of Cadence Co. in USA), which is a representative hardware descriptive language, and it means that each element such as Fn divided by comma within the brackets is concatenated in the order of description, to thereby obtain one numerical value.

The fourth code format N1 has a 4-bit width, and is identified by that the value of the 4 bits is "13", corresponding to that the number of repetitions N is "1". The fifth code format N2 has a 4-bit width, and is identified by that the value of the 4 bits is "14", corresponding to that the above number of repetitions N is "2". The sixth code format N3 has a width of at least 8 bits and being a multiple of 4, and is identified by that the value of the high-order 4 bits preceding in the code queue is "15", wherein with respect to each 4 bit following the 4 bits, a value obtained by adding "4" to a value, obtained by concatenating, that is, connecting the low-order 3 bits in each 4 bits towards the high order until a value of 8 or larger is detected in the 4-bit value, corresponds to the above described number of repetitions N.

The expression written at the right end of the sixth code format N3, that is, N={Fn, . . . , F1, F0}+4, uses the expression of Verilog (trade mark of Cadence Co. in USA), which is a representative hardware descriptive language, and it means that each element such as Fn divided by comma within the brackets is concatenated in the order of description, to thereby obtain one numerical value.

The code in which the number of repetitions N corresponds to "3" is not specified, but it is assumed that the N1 code (N=1) and N2 code (N=2) are combined and used. The volume of codes constituted of these combinations is 8 bits, and equals to the minimum volume of codes of the N3 format code. By using this combination expression, it becomes possible to increase the range to which the N3 code having a certain volume of codes corresponds.

This code format does not fundamentally restrict the representable range, and it should be noted that there is a characteristic that an optional integer can be represented by using the L3 code and N3 code. This is because a temporary memory used for processing of decoding a numerical value has a limited bit width, and on the other hand, there is no limit in the length of the L3 code and N3 code, and hence there can be generated a code in which a result of processing by the concatenation and addition becomes "0" or a negative number by means of carry.

Figure 24:
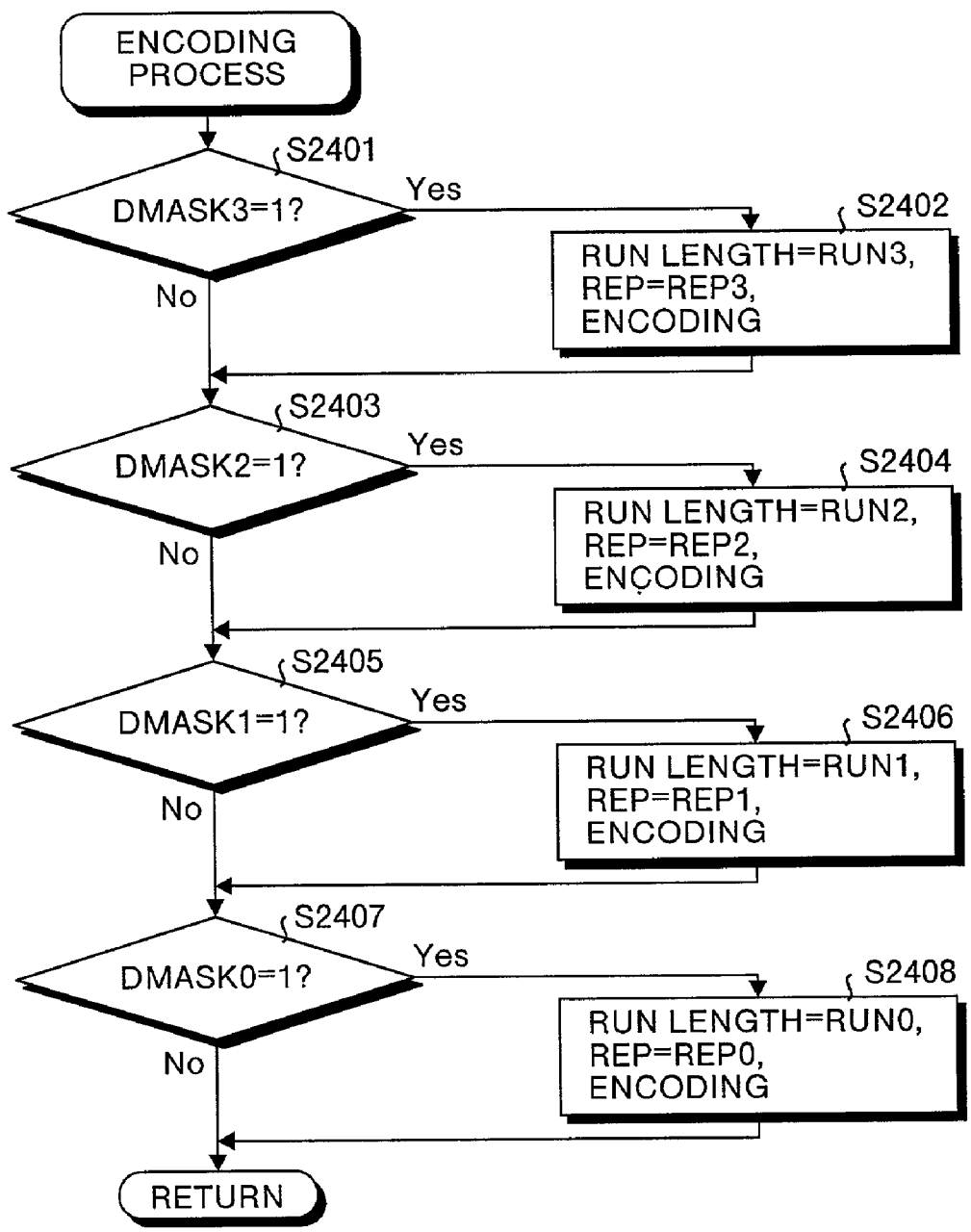
FIG. 24 is a flowchart showing one example of a processing performed by the encoding processing section.
Figure 25:
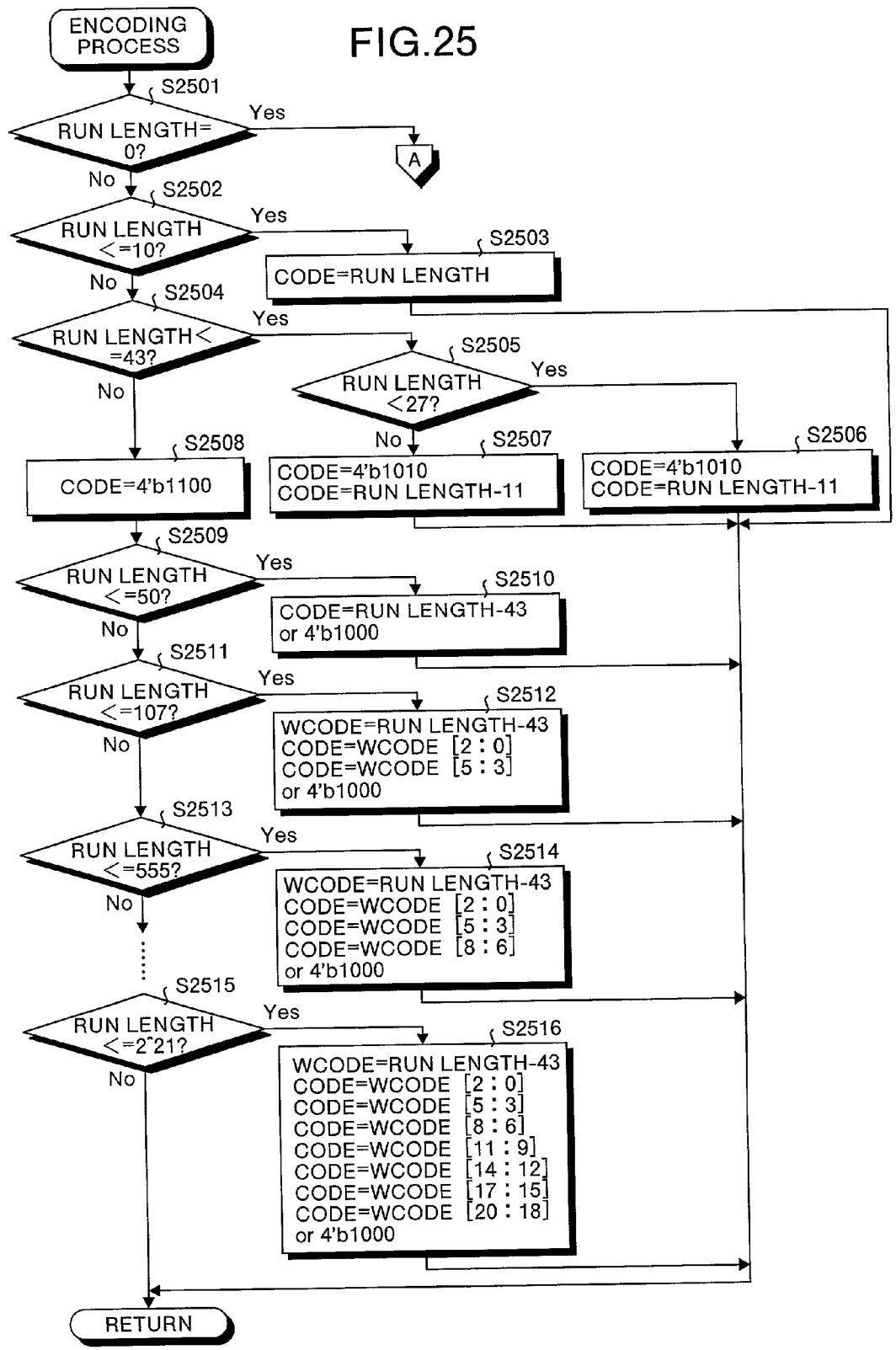
FIG. 25 is a flowchart showing another example of the processing performed by the encoding processing section.
Figure 26:
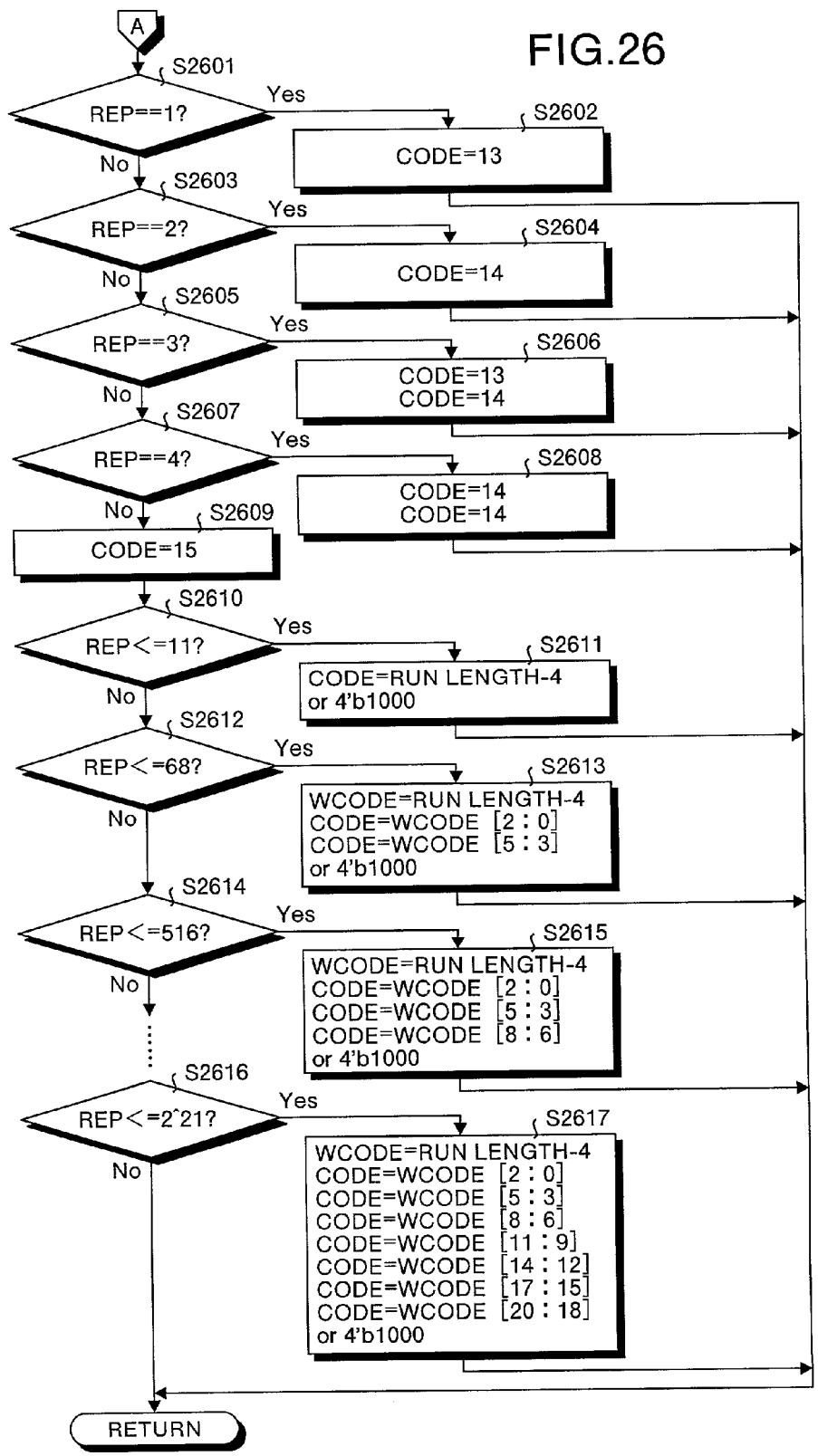
FIG. 26 is a continuation of the processing shown in FIG. 25.

The processing performed by the encoding processing section 340 will now be described. FIG. 24, FIG. 25 and FIG. 26 are flowcharts showing one example of the processing performed by the encoding processing section 340. Among these figures, FIG. 24 shows the overall flow of the encoding processing in accordance to DMASK3 to DMASK0, and FIG. 25 and FIG. 26 show the encoding processing flow in accordance with the value of run length RUN and the value of the repetition number REP, respectively.

First, description is given with regard to FIG. 24. The encoding processing section 340 encodes the respective run lengths RUN, in accordance with the value of the mask values DMASK3 to DAMSK0. Specifically, it is first judged whether DMASK3=1 or not (step S2401). If DMASK=1 (step S2401: YES), a value of RUN3 is substituted in the run length RUN to be encoded, and REP3 is substituted in the repetition number REP to be encoded, to thereby encode these RUN and REP (step S2402).

On the other hand, if DMASK3 is not 1 (step S2401: NO), it is judged whether DMASK2=1 or not (step S2403). Thereafter, judgment similar to the judgment in step S2401 and step S2402 is repeated, to perform encoding in each stage.

Specific run length encoding processing, i.e., the contents of step S2402, step S2404, step S2406 and step S2408 will now be described, using FIG. 25 and FIG. 26. Encoding of the run length will first be described, with reference to FIG. 25.

At the time of encoding, it is judged whether the run length RUN=0 or not (step 2501). If the run length RUN is not 0 (step S2501: NO), it is judged whether the run length RUN≦10 (step S2502). If RUN≦10 (step S2502: YES), the run length RUN is used directly as a code (step S2503).

On the other hand, if the run length RUN>10 (step S2502: NO), it is judged whether RUN≦43 (step S2504). If this condition is satisfied (step S2504: YES), it is judged whether the run length RUN<27 (step S2505). If RUN<27 (step S2505: YES), 4-bit 1010 is added as a header, and a value obtained by subtracting 11 from the run length is designated as a code (step S2506).

On the other hand, if the run length RUN≧27 (step S2505: NO), 4-bit 1011 is added as a header, and a value obtained by subtracting 11 from the run length is designated as a code (step S2507). Moreover, if the run length>43 (step S2504:NO), 4-bit 1100 is added as a header (step S2508), and subsequently, the value of the run length RUN is judged in an order of step S2509, step S2511, step S2513 and step S2515, and a value obtained in step S2510, step S2512, step S2514 and step S2526 corresponding to the value thereof is designated as a code. In order to indicate that it is the end of the code, the numerical value is expressed in such a manner that the fourth bit in the 4-bit data is a terminal flag, so that the code length is expressed small (see FIG. 6).

Next, the processing of encoding of a repetition number performed by the encoding processing section 340 will be described, with reference to FIG. 26. If the run length RUN=0 in FIG. 25 (step S2501: YES), control moves to FIG. 26, and it is judged whether the repetition number REP=1 or not (step S2601). If REP=1 (step S2601: YES), 13 is designated as a code (step S2602).

On the other hand, if REP is not 1 (step S2601: NO), it is judged whether the repetition number REP=2 or not (step S2603). If REP=2 (step S2603: YES), 14 is designated as a code (step S2602). On the other hand, if REP is not 2 (step S2603: NO), it is judged whether REP=3 or not (step S2605). If REP=3 (step S2605: YES), 13 and 14 are designated as codes (step S2606).

If REP is not 3 (step S2605: NO), it is judged whether REP=4 or not (step S2607). If REP=4 (step S2607: YES), 14 and 14 are designated as codes (step S2608).

If REP>4 (step S2607: NO), 4-bit 1111 is added as a header (step S2609), and subsequently, the value of the repetition number REP is judged in an order of step S2610, step S2612, step S2614 and step S2616, and a value is expressed such that the fourth bit in the 4-bit data is made a terminal flag by step S2611, step S2613, step S2615 and step S2617 corresponding to the value thereof, so that the code length is expressed small.

(Encoding Section 301: 8-bit Data Processing In)

An example of parallel processing of the image data for every 8 bits performed by the run length processing section 320 will be described. In the run length encoding method, it is necessary to design the hardware, taking all the combinations into consideration. However, as the bit length to be parallel processed increases, the run count processing becomes complicated, such that 16*2 ways with 4 bits, 32*2 ways with 5 bits, and 256*2 ways with 8 bits, thereby causing problems in the hardware size and the processing speed. Here, the run length processing section adopting a processing method, taking the problem of this run count processing into consideration will be described.

Figure 27:
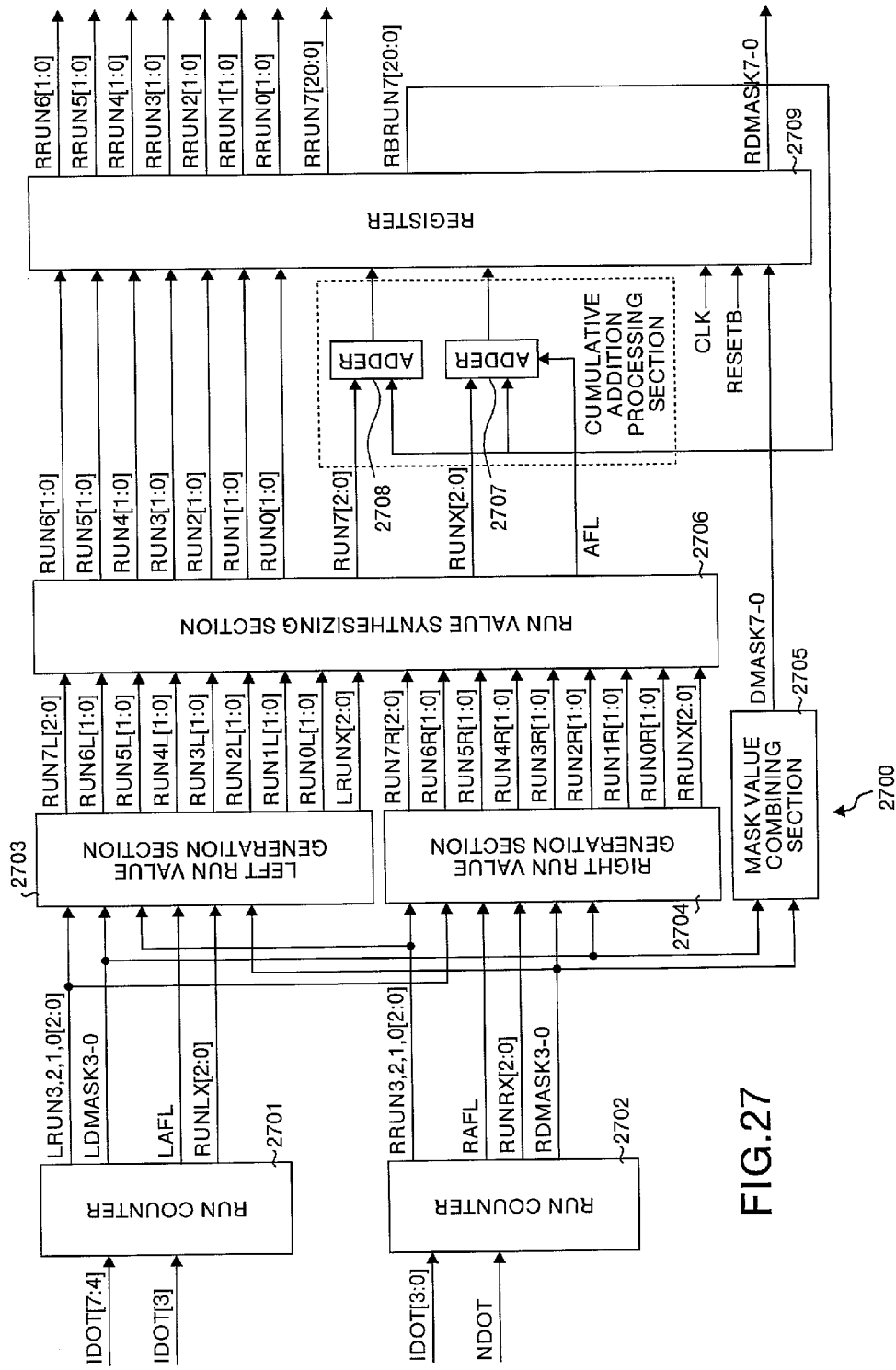
FIG. 27 is a block diagram showing one example of a run length processing section that performs parallel processing of 8-bit data.

FIG. 27 is a block diagram showing one example of a run length processing section performing parallel processing of 8-bit data. Here, the run length processing section handing 8-bit data is discriminated from the run length processing section 320 for 4 bits described above, and is expressed as a run length processing section 2700.

The run length processing section 2700 comprises a run counter 2701 and a run counter 2702, a left run value generation section 2703, a right run value generation section 2704, a mask value combining section 2705, a run value combining section 2706, an adder 2707 and an adder 2708, and a register 2709. An output example of the run length processing section 2700 with respect to a specific input of an image pattern will be described later, with reference to FIG. 28 and FIG. 29.

Explaining roughly the processing of the run length processing section 2700, at first, 8-bit image pattern (IDOT) and the first bit (NDOT) of the next image pattern are input from the image reading section 310 (see FIG. 3). Then, the run counter 2701 and the run counter 2702 determine a plurality of closed run lengths LRUN and RRUN in each section; mask values LDMASK and RDMASK indicating whether the run length is effective or not, that is, closed or not; and run lengths RUNLX and RUNRX to be carried over to next, based on the high-order 4 bits of IDOT (IDOT[7:4]) and IDOT[3] as NDOT and low-order 4 bits of IDOT (IDOT[3:0]) and NDOT.

Then, by the left run value generation section 2703 and the right run value generation section 2704, the 4-bit processing results are respectively modified to appropriate positions as eight 8-bit run lengths. In addition, by the run value combining section 2706, a run in the same position is added thereto, to thereby obtain one set of eight run lengths. Lastly, a cumulative addition processing section (the adder 2707 and adder 2708) judges whether the run lengths carried over up to now should be added to the first run length RUN7 in this image pattern (IDOT), or carried over to the next. Through these steps, the run length processing section 2700 finally generates a plurality of closed run lengths and mask values.

Next, each section will be described. The run counter 2701 is a 4-bit run counter, and processes the high-order 4 bits in the 8-bit image data input from the image reading section 310, in the same manner as the run counter 321 described above (see FIG. 5). Moreover, the run counter 2702 is also a 4-bit run counter, and processes similarly the low-order 4 bits in the 8-bit image data.

The left run value generation section 2703 inputs the run lengths LRUN and RRUN, mask values LDMASK and RDMASK from the run counter 2701 and the run counter 2702, to calculate maximum eight run lengths RUNXL (x=0 to 7) in the 8 bit length, and output these. The run length LRUNX to be carried over to the next is also output. The specific processing contents of the left run value generation section 2703 will be described later, with reference to FIG. 30 and FIG. 31.

Figure 32:
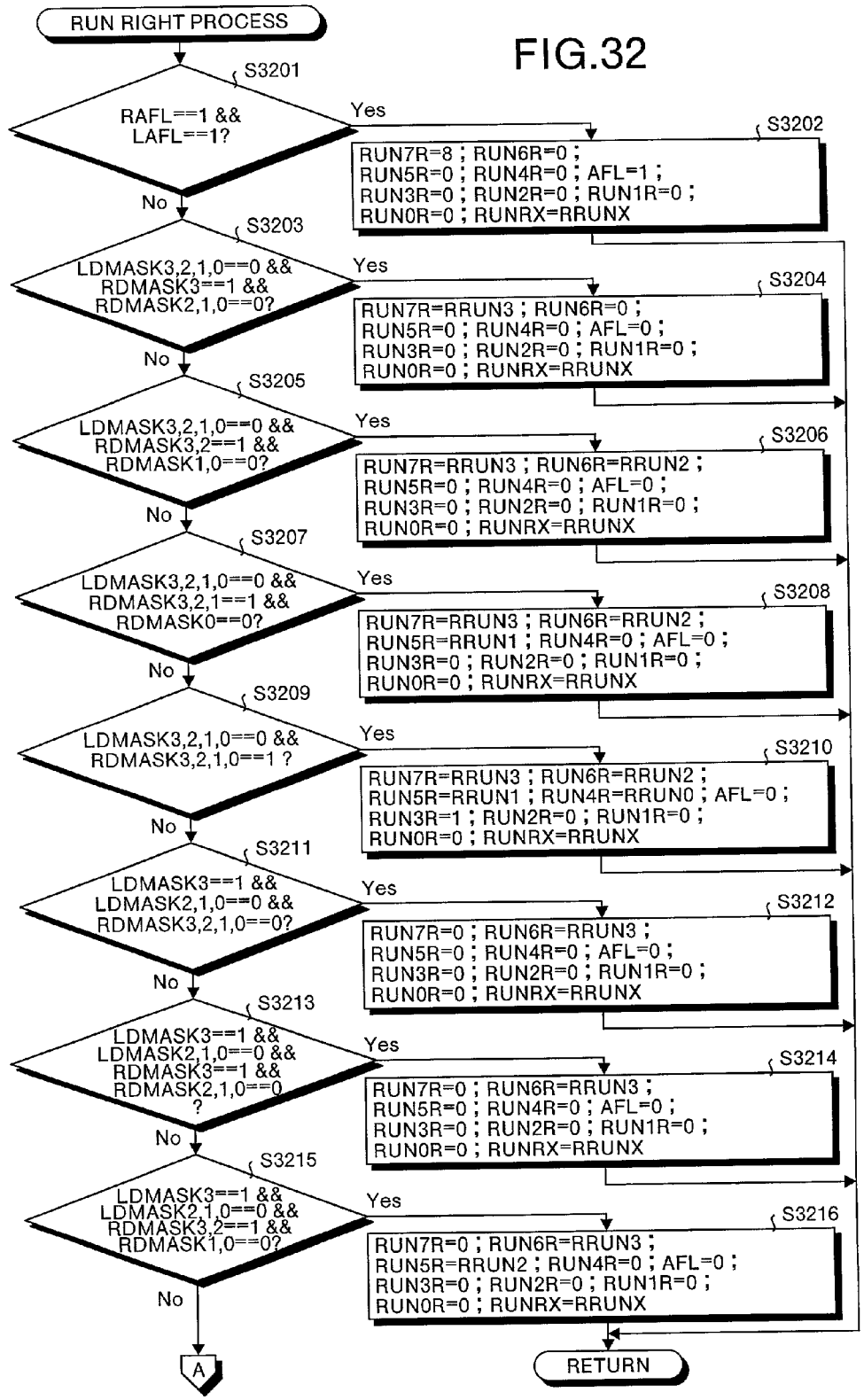
FIG. 32 is a diagram showing one example of a processing performed by the right run value generation section.
Figure 33:
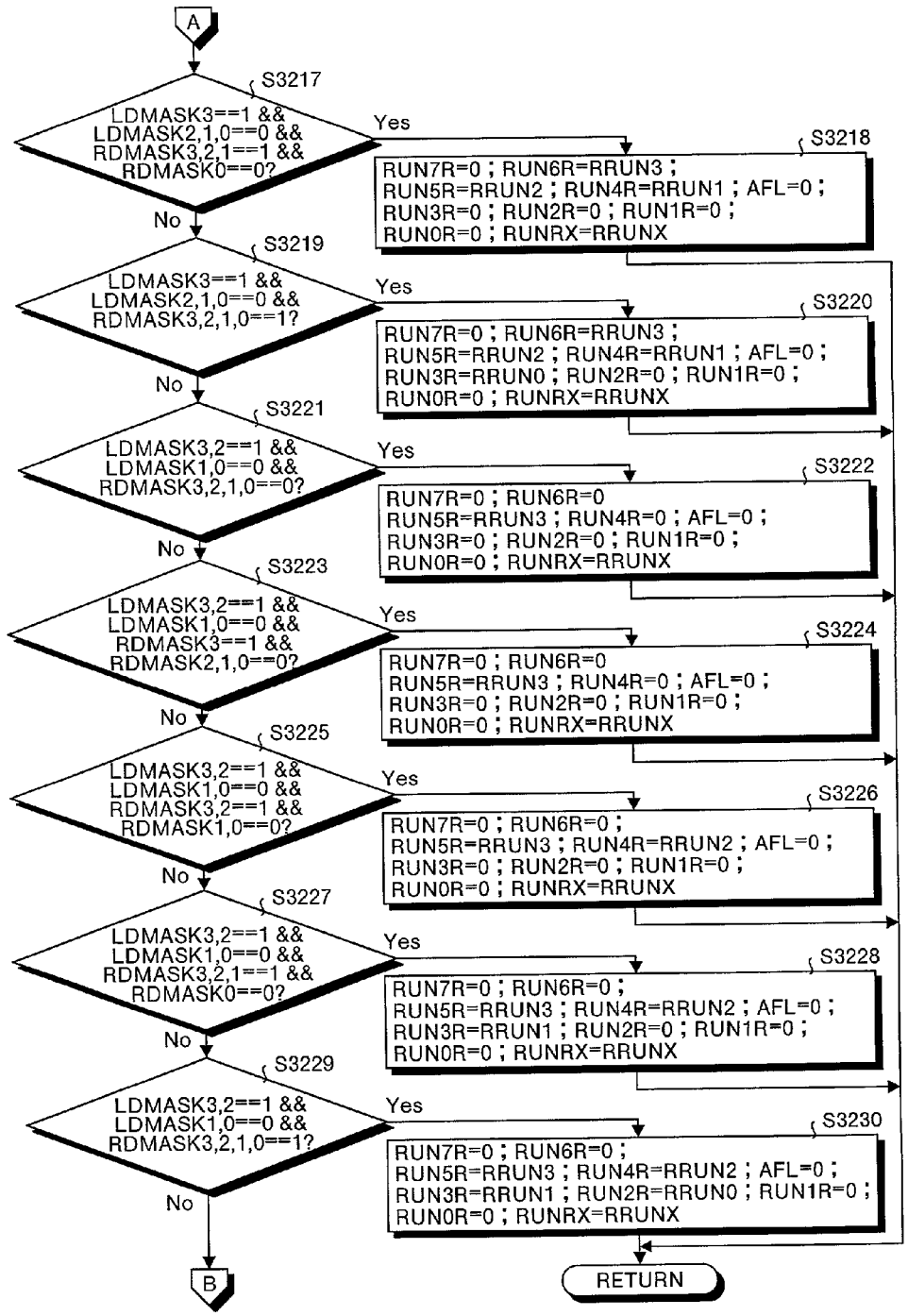
FIG. 33 is a continuation of the processing shown in FIG. 32.
Figure 34:
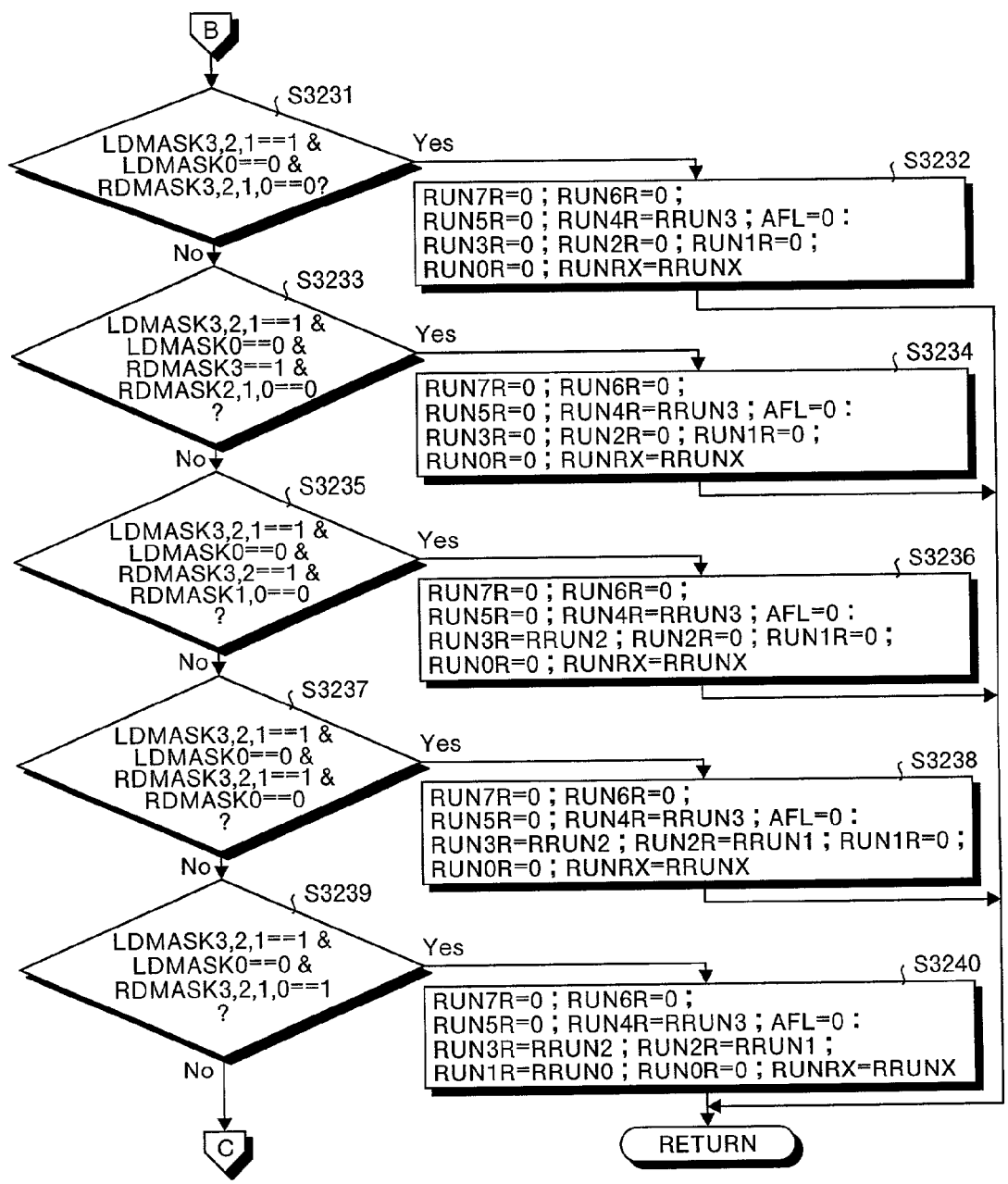
FIG. 34 is a continuation of the processing shown in FIG. 33.
Figure 35:
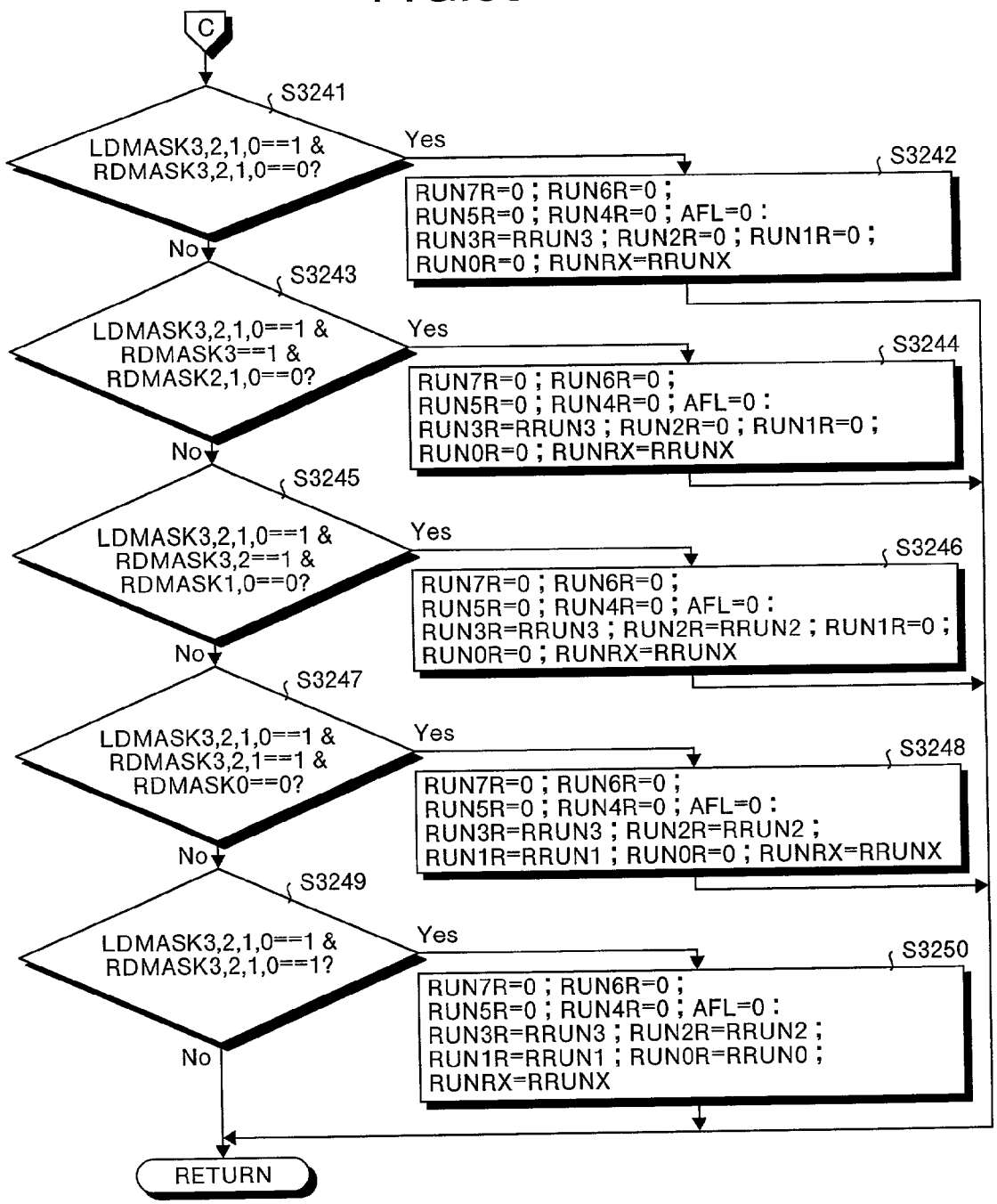
FIG. 35 is a continuation of the processing shown in FIG. 34.
Figure 36:
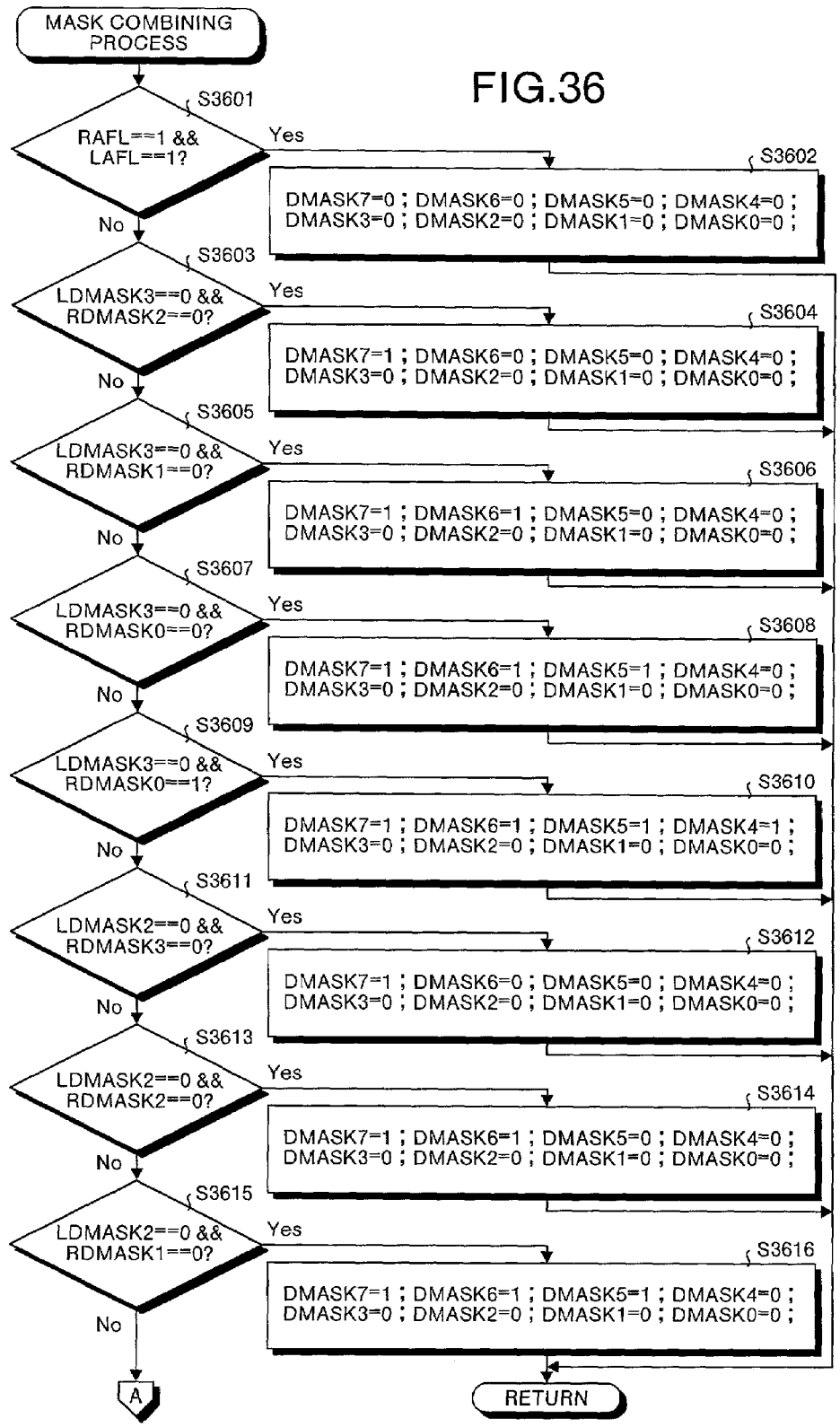
FIG. 36 is a flowchart for explaining a processing for combining mask values.
Figure 37:
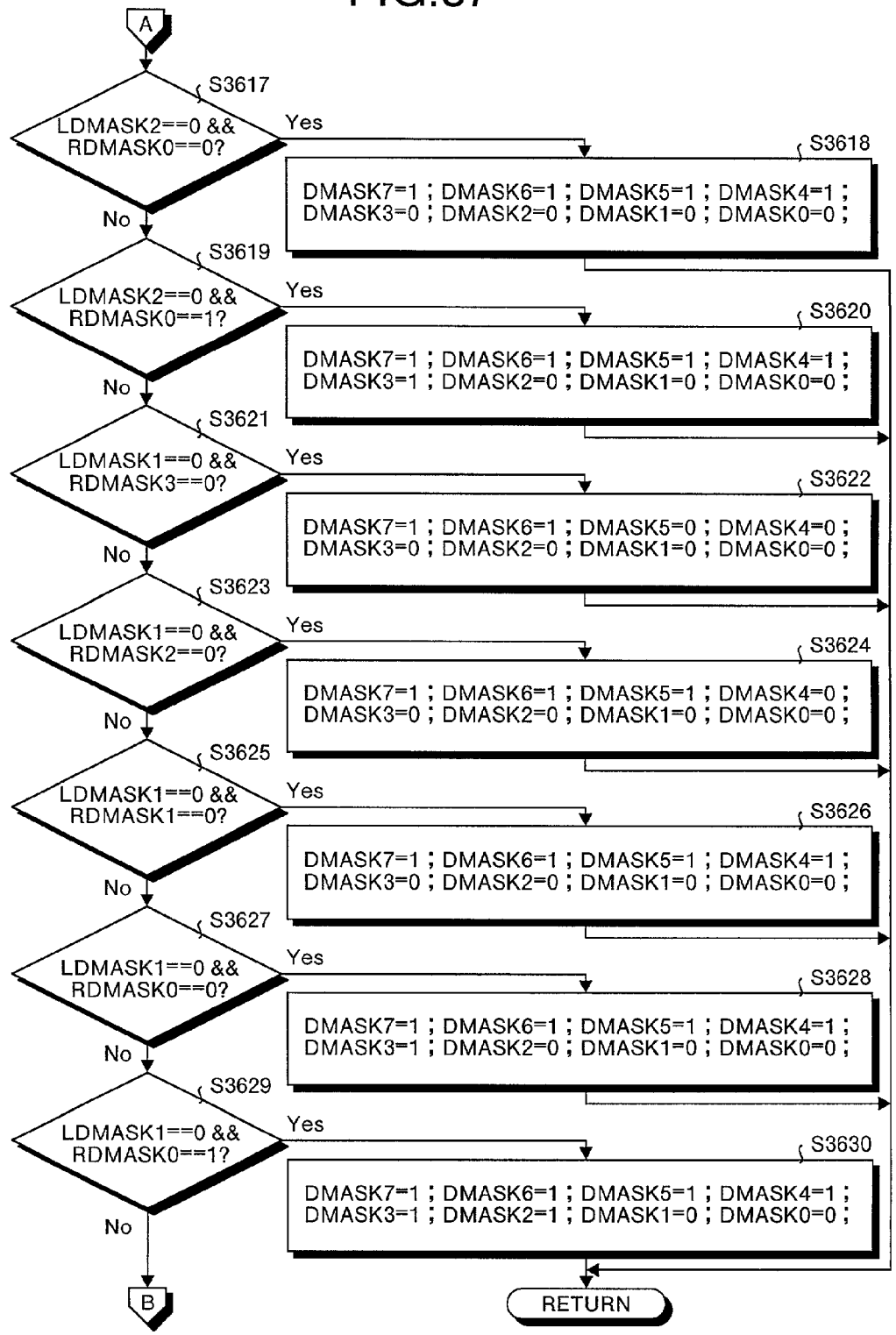
FIG. 37 is a continuation of the processing shown in FIG. 36.
Figure 38:
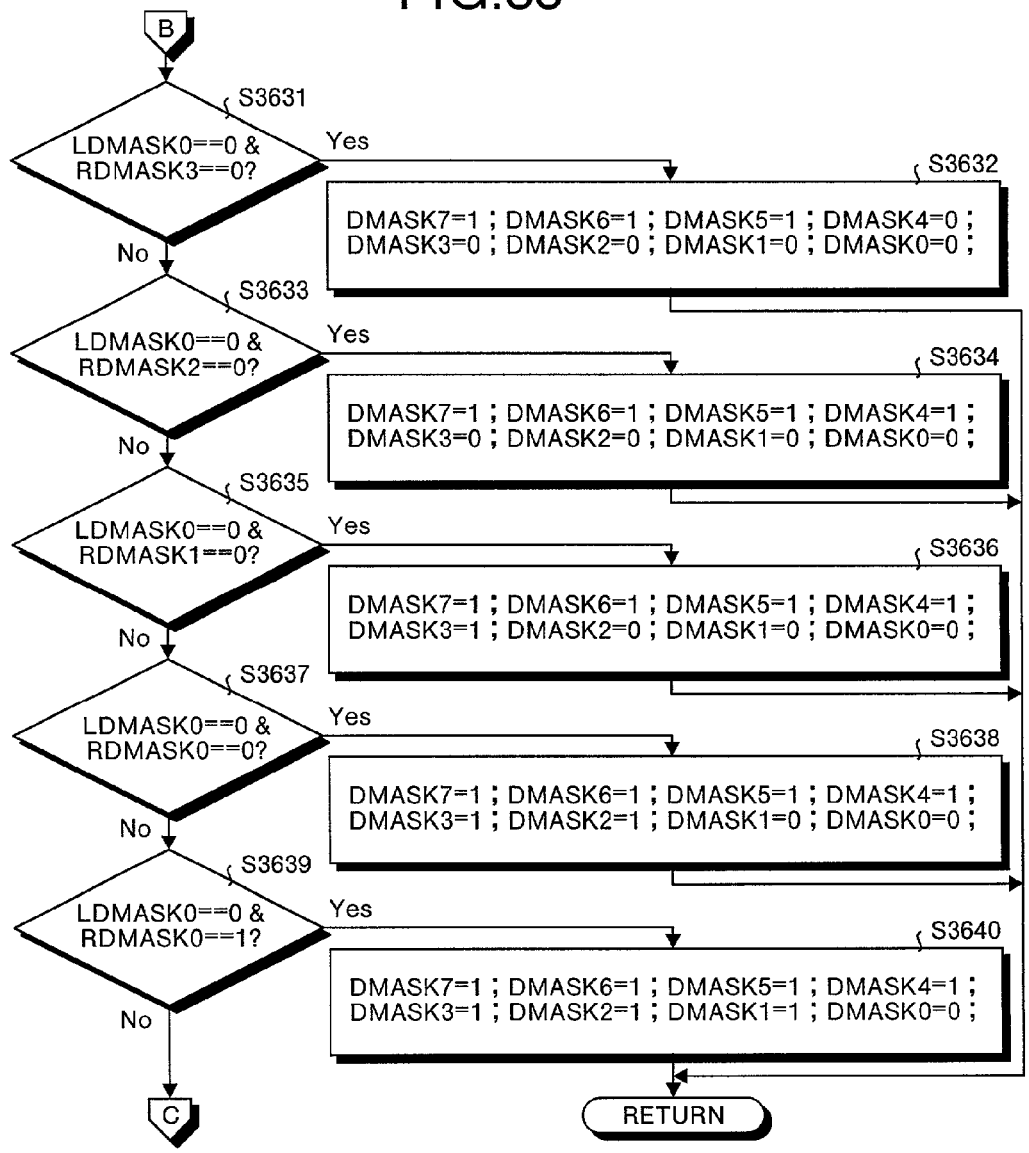
FIG. 38 is a continuation of the processing shown in FIG. 37.
Figure 39:
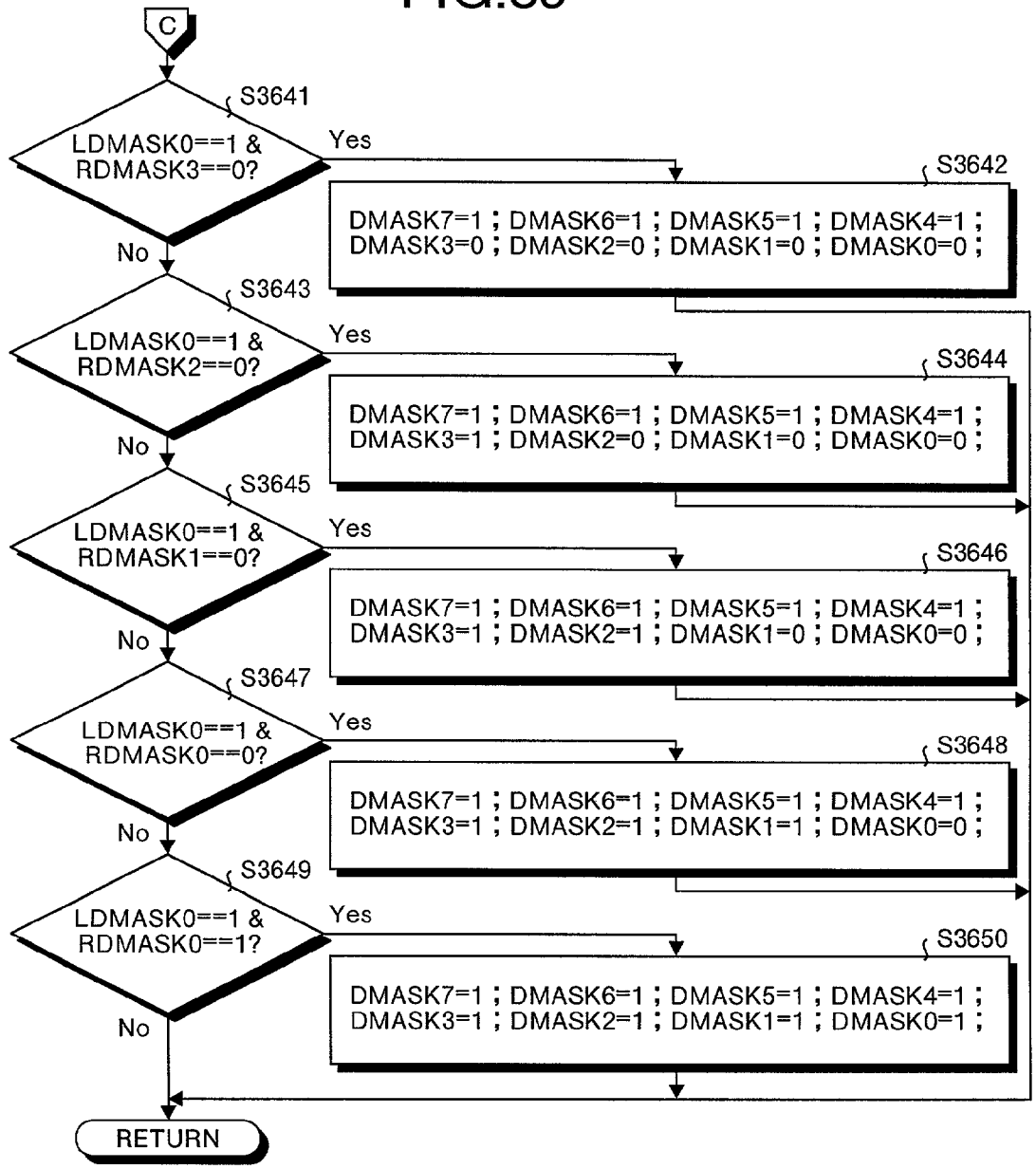
FIG. 39 is a continuation of the processing shown in FIG. 38.

The right run value generation section 2704 similarly calculates maximum eight run lengths RUNxR (x=0 to 7) in the 8 bit length, and output these, and also outputs the run length RRUNX to be carried over to the next. The specific processing contents of the right run value generation section 2704 will be described later, with reference to FIG. 32 and FIG. 35.

The mask value combining section 2705 combines a MASK value from the run counter 2701 and a MASK value from the run counter 2702, to obtain eight mask values in the 8-bit length. The specific processing contents of the mask value combining section 2705 will be described later, with reference to FIG. 36 to FIG. 39.

The run value combining section 2706 combines maximum eight run lengths (RUNxL) from the left run value generation section 2703 and maximum eight run lengths (RUNxR) from the right run value generation section 2704, to generate maximum eight run lengths RUNx. The specific processing contents of the run value combining section 2706 will be described later, with reference to FIG. 40.

When AFL is 1, the adder 2707 adds the carried over run length RUNX to the total of the run length RBRUN7 carried over up to now, which is stored in the register 2709, to designate it as RBRUN7 again. When AFL is 0, the carried over run length RUNX is set to the total RBRUN7 of the run length carried over up to now.

The adder 2708 adds the first run length RUN7 to the total RBRUN7 of the run length carried over up to now, to thereby obtain the run length RRUN7, taking the run length carried over up to now into consideration.

Figure 28:
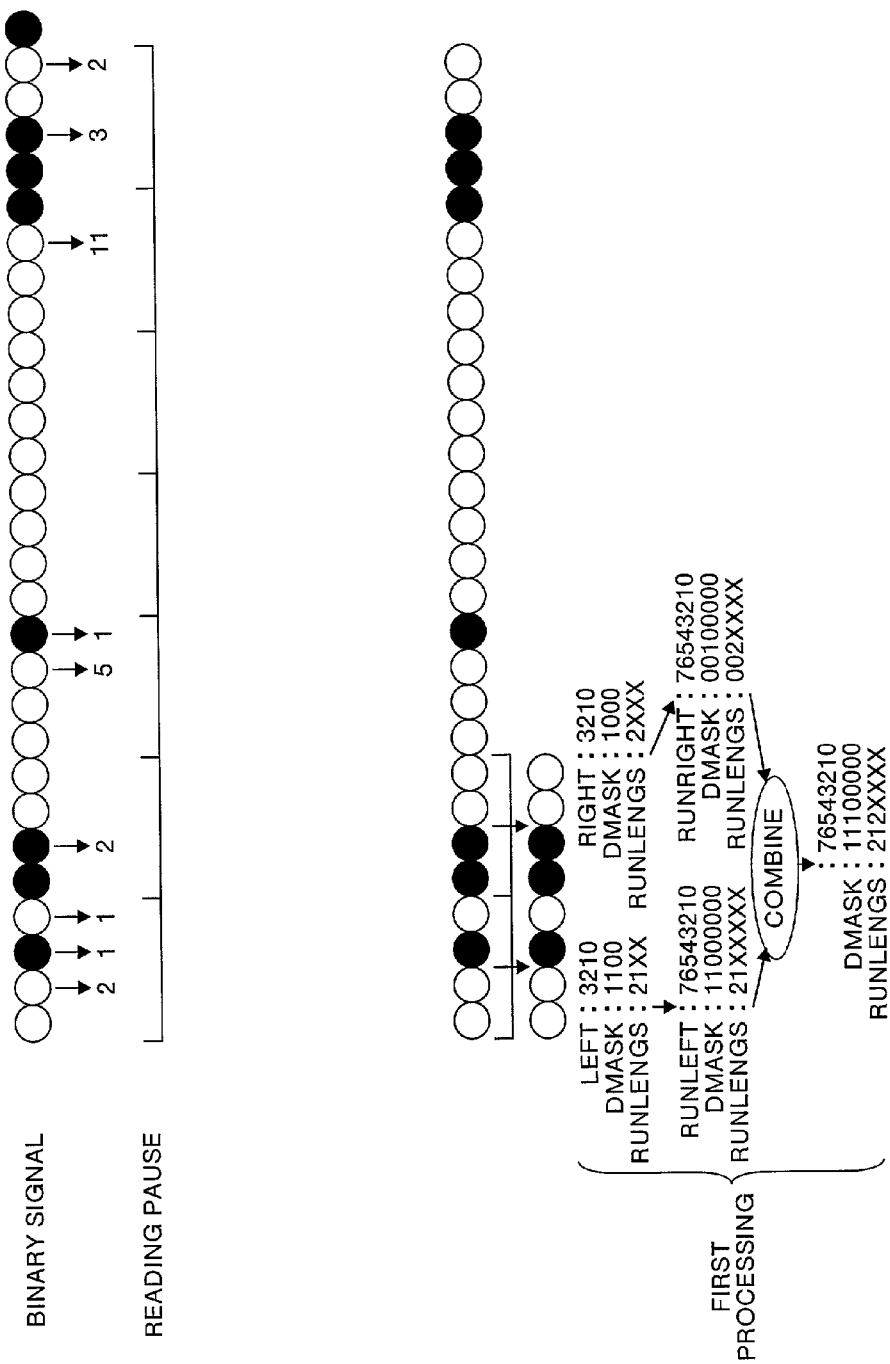
FIG. 28 is a diagram showing an example of working of the run length processing section.
Figure 29:
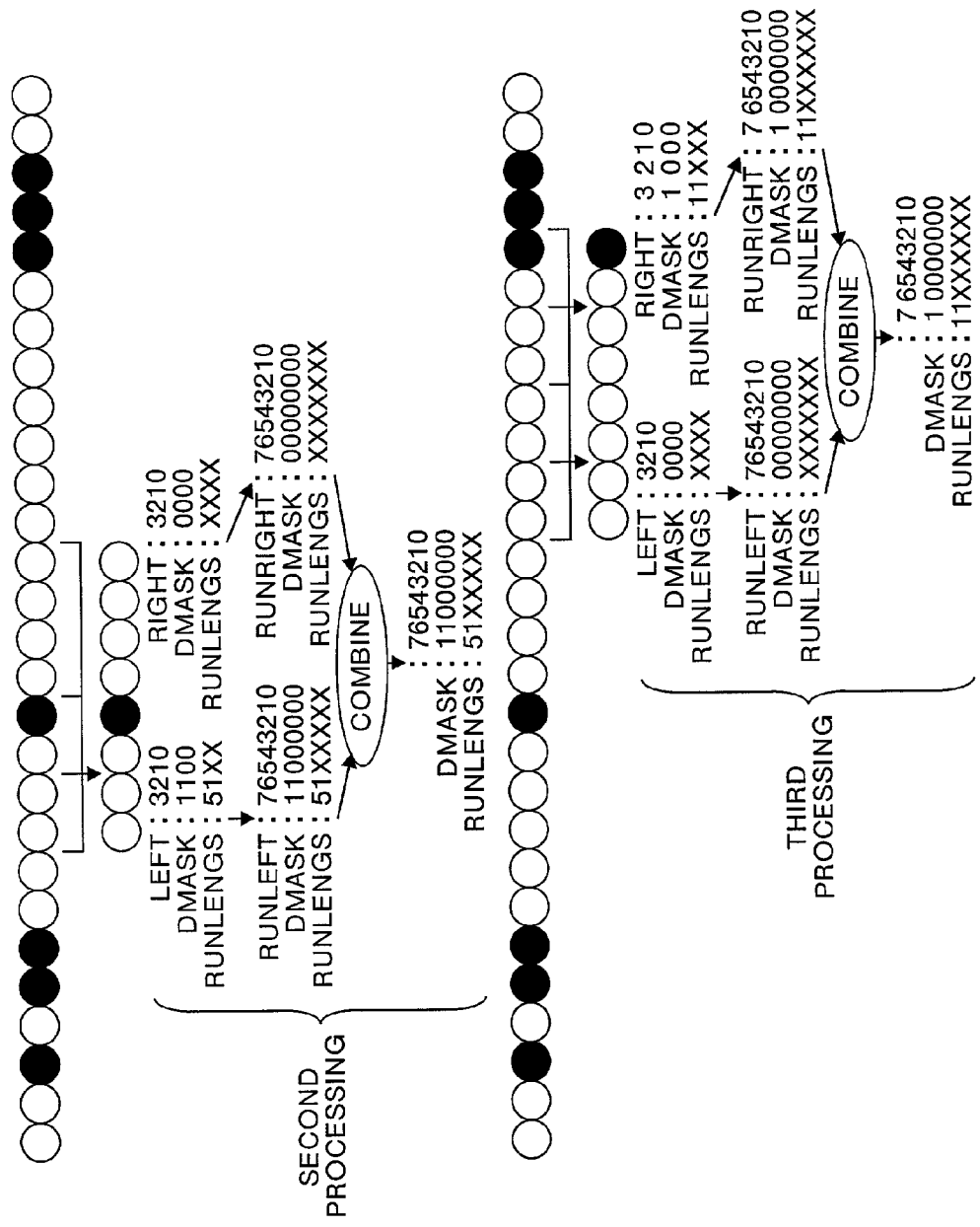
FIG. 29 is a diagram showing another example of working of the run length processing section.

FIG. 28 and FIG. 29 are diagrams showing the processing example of the run length processing section 2700. At first, in the first processing, being the first processing, 8 bits are divided into 4-bit LEFT and 4-bit RIGHT, to go ahead with the processing. In the LEFT, three run lengths '2', '1' and '1' are obtained, and in the RIGHT, one run length '2' is obtained. Then, these are developed to LEFT eight run lengths by the LEFT run value generation section 2703 and to RIGHT eight run lengths by the RIGHT run value generation section. The RIGHT run length is shifted by the number of run lengths of the LEFT to thereby prepare eight run lengths.

Then, by the run value combining section 2706, the LEFT and RIGHT run lengths are added, to generate eight run lengths. Characters in the figure are similar to those used above, and for example, DMASK indicates that the run length is effective, that is, closed, and RUNLENGS indicates run length.

In the second processing (see FIG. 29), in the LEFT, one run length '5' is obtained, and in the RIGHT, no run length is obtained. Then, the LEFT run value generation section 2703 develops it to eight LEFT run lengths, and the RIGHT run value generation section 2704 develops it to eight RIGHT run lengths. The RIGHT run length is shifted by the number of run lengths of the LEFT to thereby prepare eight run lengths. The run value combining section 2706 then adds the LEFT and RIGHT run lengths, to generate eight run lengths. Here, there is shown an example where the remaining run length RRUNX=2 obtained in the RIGHT one before is closed in the LEFT this time.

Similarly, in the third processing, 0 run length in the LEFT and one run length '11' in the RIGHT are obtained. Then, the LEFT run value generation section 2703 develops it to eight LEFT run lengths, and the RIGHT run value generation section 2704 develops it to eight RIGHT run lengths. The RIGHT run length is shifted by the number of run lengths of the LEFT to thereby prepare eight run lengths. The run value combining section 2706 then adds the LEFT and RIGHT run lengths, to generate eight run lengths.

Figure 30:
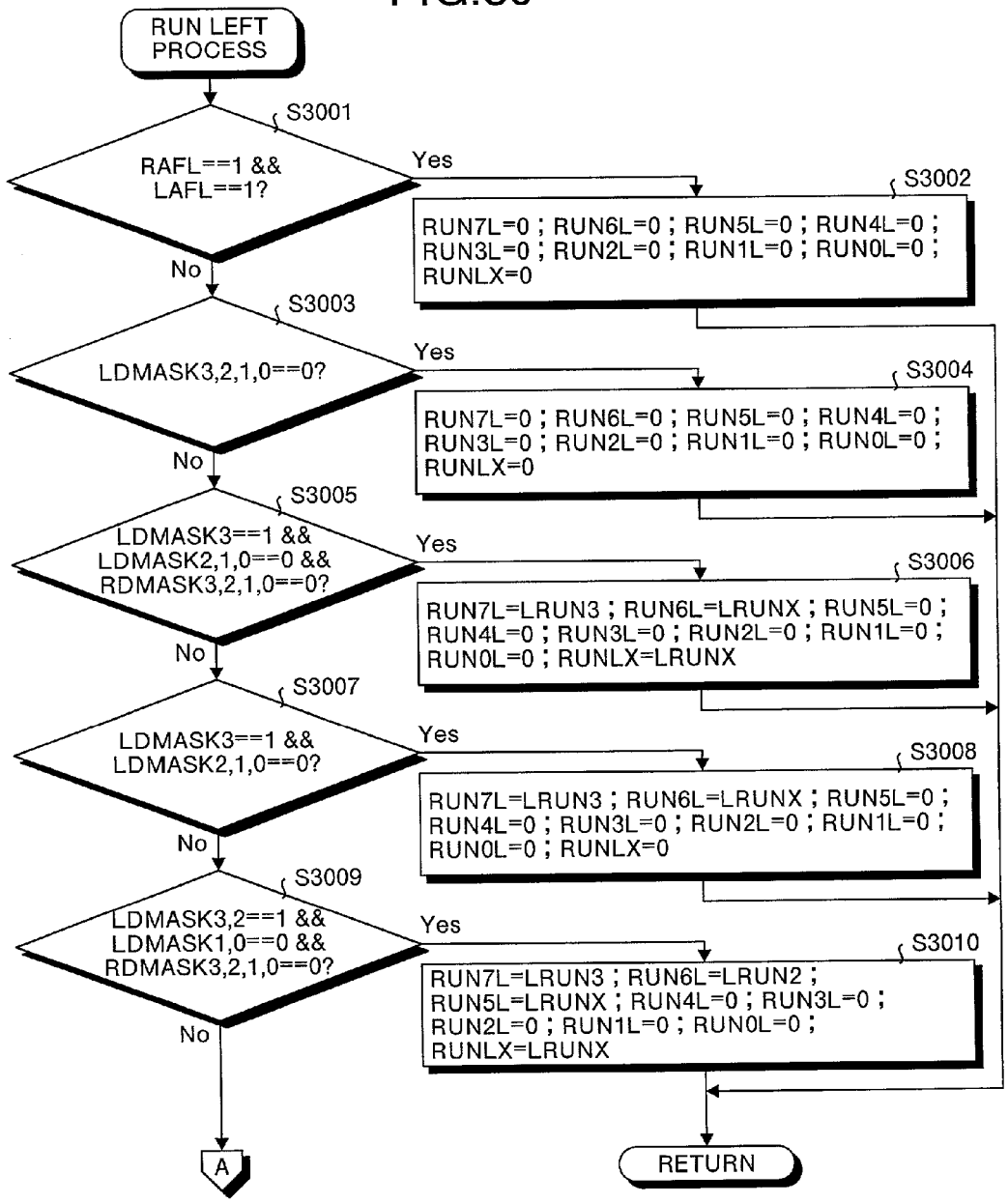
FIG. 30 is a diagram showing one example of a processing performed by the left run value generation section.
Figure 31:
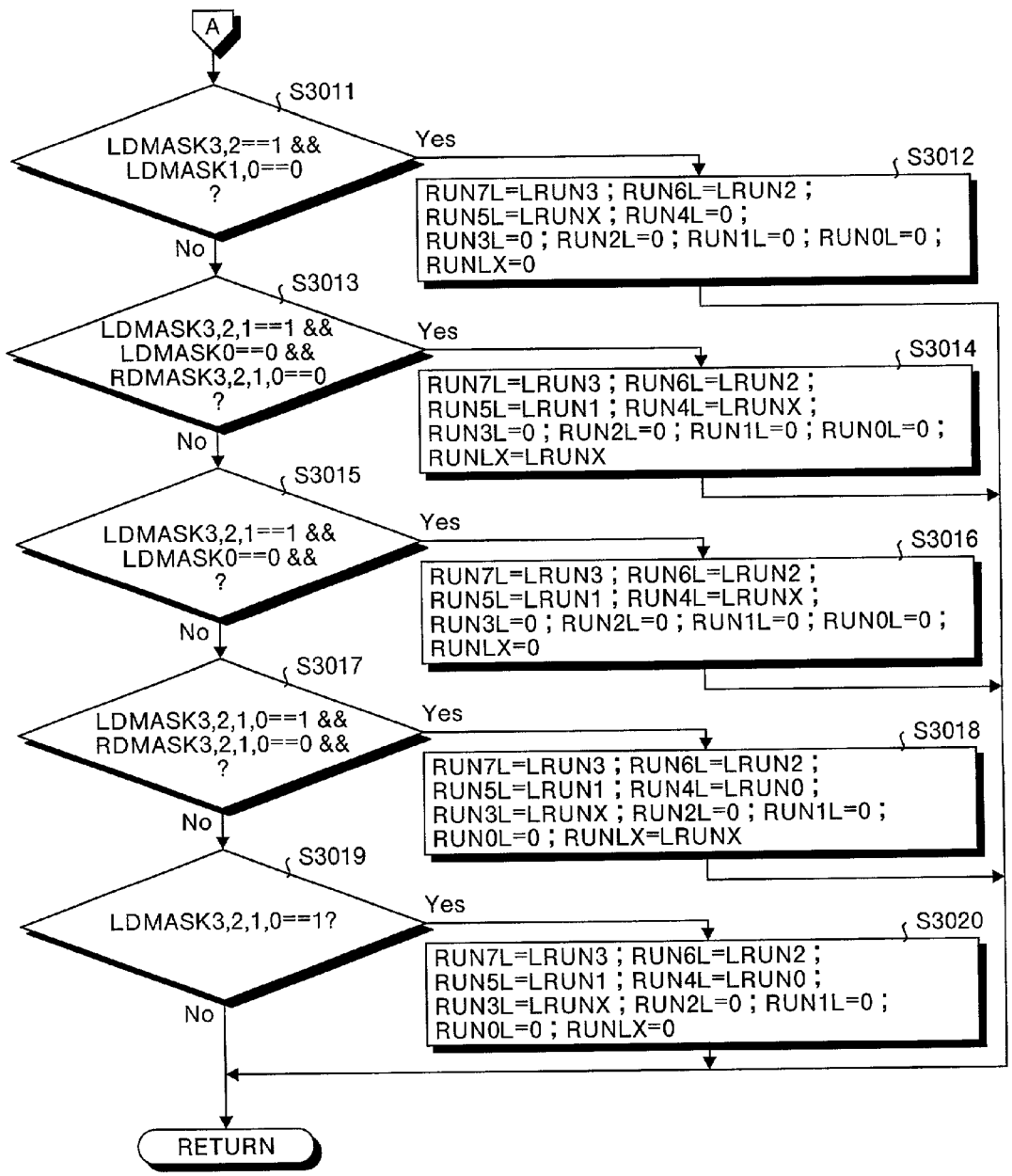
FIG. 31 is a continuation of the processing shown in FIG. 30.

The processing performed by the LEFT run value generation section 2703 will now be described. FIG. 30 and FIG. 31 are diagrams showing one example of the processing performed by the LEFT run value generation section 2703. The LEFT run value generation section 2703 judges whether AFL from the run counter 2701 (LAFL) and AFL from the run counter 2702 (RAFL) are both 1, that is, 8 bits input from the image reading section 310 are all '1' or '0' (step S3001).

If RAFL=LAFL=1 (step S3001: YES), since the input run length is not terminated here, the value is carried over to the next (step S3002). That is, it is set such that RUNxL=0 (x=0 to 7), RUNLX=0. Here, a value is not set in RUNLX which makes the run length continuous to the next. This is because it is processed by the RIGHT run value generation section 2704.

On the other hand, if RAFL=1, and LAFL≠1 (step S3001: NO), it is judged if LDMASKx=0 (x=0 to 3) or not, that is, if a run length does not exist in the LEFT side or not (step S3003). If a run length does not exist in the LEFT side (step S3003: YES), it is set such that RUNxL=0 (x=0 to 7) (step S3004).

On the other hand, if a run length exists in the LEFT side (step S3003: YES), it is judged whether it is a data input showing that one run length exists in the LEFT (LDMASK3=1, LDMASKX=0 (x=0 to 2), and there is no run length terminating in the RIGHT (RDMASKX=0 (x=0 to 3). If these conditions are satisfied (step S3005: YES), one run length is set (RUN7L=LRUN3, RUN6L=LRUNX, RUNxL=0 (x=0 to 5)), and LRUNX is set to the continuous run length RUNLX (step S3006).

On the other hand, if conditions in step S3005 are not satisfied (step S3005: NO), it is judged whether one run length exists in the LEFT, and terminates in the RIGHT, that is, closed run length exists one or more (step S3007) If these conditions are satisfied (step S3007: YES), one run length is set (RUN7L=LRUN3), and a value of the LEFT halfway run length LRUNX, which is not terminated, is set in the second run length RUN6L (step S3008).

On the other hand, if conditions in step S3007 are not satisfied (step S3007: NO), it is judged if two run lengths exist in the LEFT, and there is no run length terminating in the RIGHT (step S3009). If these conditions are satisfied (step S3009: YES), two run lengths are set (RUN7L=LRUN3, RUN6L=LRUN2), and the continuous run length RUNLX is set in LRUNX (step S3010).

Thereafter, in accordance with each condition, RUNxL (x=0 to 7) and RUNLX are set. Though detailed description is omitted, in step S3011, it is judged if two run lengths exist in the LEFT, and that one or more terminating run lengths exist in the RIGHT. If conditions are satisfied, in step S3012, two run lengths are set, and a value of the LEFT halfway run length, which is not terminated, is set in the third run length.

Subsequently, in step S3013, it is judged if three run lengths exist in the LEFT, and that there is no terminating run length in the RIGHT. If conditions are satisfied, in step S3014, three run lengths are set, and the continuous run length is set in RUNLX.

Subsequently, in step S3015, it is judged if three run lengths exist in the LEFT, and that one terminating run length exists in the RIGHT. If conditions are satisfied, in step S3016, three run lengths are set, and a value of the LEFT halfway run length, which is not terminated, is set in the fourth run length.

Subsequently, in step S3017, it is judged if one run length exists in the LEFT, and that there is no run length terminating in the RIGHT. If conditions are satisfied, in step S3018, one run length is set, and the continuous run length is set in RUNLX.

Lastly in step S3019, it is judged if four run lengths exist in the LEFT, and that one terminating run length exists in the RIGHT. If conditions are satisfied, in step S3020, four run lengths are set, and a value of the LEFT halfway run length, which is not terminated, is set in the fifth run length.

The processing performed by the RIGHT run value generation section 2704 of the run length processing section 2700 will now be described. FIG. 32 to FIG. 35 are diagrams showing one example of the processing performed by the RIGHT run value generation section 2704. The RIGHT run value generation section 2704 first judges if RAFL=LAFL=1 or not (step S3201). If this condition is satisfied, since this run length is not terminated herein, the value is carried over to the next (step S3202). At this time, a value of 8 (all number of bits) is set in RUNRX.

Thereafter, in accordance with each condition, RUNxR (x=0 to 7) and RUNRX are set. Though detailed description is omitted, in step S3203, it is judged if there is no run length in the LEFT, and one run length exists in the RIGHT. If conditions are satisfied, in step S3204, one run length is set, and a value of the halfway run length, which is not terminated, is set in RUNRX.

Subsequently, in step S3205, it is judged if there is no run length in the LEFT, and two run lengths exist in the RIGHT. If conditions are satisfied, in step S3206, two run lengths are set, and a value of the halfway run length, which is not terminated, is set in RUNRX.

Subsequently, in step S3207, it is judged if there is no run length in the LEFT, and three run lengths exist in the RIGHT. If conditions are satisfied, in step S3208, three run lengths are set, and a value of the halfway run length, which is not terminated, is set in RUNRX.

Subsequently, in step S3209, it is judged if there is no run length in the LEFT, and four run lengths exist in the RIGHT. If conditions are satisfied, in step S3210, four run lengths are set, and a value of the halfway run length, which is not terminated, is set in RUNRX.

Subsequently, in step S3211, it is judged if one run length exists in the LEFT, and there is no run length in the RIGHT. If conditions are satisfied, in step S3212, a value of the halfway run length, which is not terminated, is set in RUNRX.

Subsequently, in step S3213, it is judged if one run length exists in the LEFT, and one run length exists in the RIGHT. If conditions are satisfied, in step S3214, one run length is set in the second position, and a value of the halfway run length, which is not terminated, is set in RUNRX.

Subsequently, in step S3215, it is judged that one run length exists in the LEFT, and that two run lengths exist in the RIGHT. If conditions are satisfied, in step S3216, two run lengths are set in the second position, and a value of the halfway run length, which is not terminated, is set in RUNRX.

Subsequently, instep S3217 (see FIG. 33), it is judged if one run length exists in the LEFT, and three run lengths exist in the RIGHT. If conditions are satisfied, in step S3218, three run lengths are set in the second position, and a value of the halfway run length, which is not terminated, is set in RUNRX.

Subsequently, in step S3219, it is judged if one run length exists in the LEFT, and four run lengths exist in the RIGHT. If conditions are satisfied, in step S3220, four run lengths are set in the second position, and a value of the halfway run length, which is not terminated, is set in RUNRX.

Subsequently, in step S3221, it is judged if two run lengths exist in the LEFT, and there is no run length in the RIGHT. If conditions are satisfied, in step S3222, a value of the halfway run length, which is not terminated, is set in RUNRX.

Subsequently, in step S3223, it is judged if two run lengths exist in the LEFT, and one run length exists in the RIGHT. If conditions are satisfied, in step S3224, one run length is set in the third position, and a value of the halfway run length, which is not terminated, is set in RUNRX.

Subsequently, in step S3225, it is judged if two run lengths exist in the LEFT, and two run lengths exist in the RIGHT. If conditions are satisfied, in step S3226, two run lengths are set in the third position, and a value of the halfway run length, which is not terminated, is set in RUNRX.

Subsequently, in step S3227, it is judged if two run lengths exist in the LEFT, and three run lengths exist in the RIGHT. If conditions are satisfied, in step S3228, three run lengths are set in the third position, and a value of the halfway run length, which is not terminated, is set in RUNRX.

Subsequently, in step S3229, it is judged if two run lengths exist in the LEFT, and four run lengths exist in the RIGHT. If conditions are satisfied, instep S3230, four run lengths are set in the third position, and a value of the halfway run length, which is not terminated, is set in RUNRX.

Subsequently, in step S3231 (see FIG. 34), it is judged if three run lengths exist in the LEFT, and there is no run length in the RIGHT. If conditions are satisfied, in step S3232, a value of the halfway run length, which is not terminated, is set in RUNRX.

Subsequently, in step S3233, it is judged if three run lengths exist in the LEFT, and one run length exists in the RIGHT. If conditions are satisfied, in step S3234, one run length is set in the fourth position, and a value of the halfway run length, which is not terminated, is set in RUNRX.

Subsequently, in step S3235, it is judged if three run lengths exist in the LEFT, and two run lengths exist in the RIGHT. If conditions are satisfied, in step S3236, two run lengths are set in the fourth position, and a value of the halfway run length, which is not terminated, is set in RUNRX.

Subsequently, in step S3237, it is judged if three run lengths exist in the LEFT, and three run lengths exist in the RIGHT. If conditions are satisfied, in step S3238, two run lengths are set in the fourth position, and a value of the halfway run length, which is not terminated, is set in RUNRX.

Subsequently, in step S3239, it is judged if three run lengths exist in the LEFT, and four run lengths exist in the RIGHT. If conditions are satisfied, in step S3240, four run lengths are set in the fourth position, and a value of the halfway run length, which is not terminated, is set in RUNRX.

Subsequently, in step S3241 (see FIG. 35), it is judged if four run lengths exist in the LEFT, and there is no run length in the RIGHT. If conditions are satisfied, in step S3242, a value of the halfway run length, which is not terminated, is set in RUNRX.

Subsequently, in step S3243, it is judged if four run lengths exist in the LEFT, and one run length exists in the RIGHT. If conditions are satisfied, in step S3244, one run length is set in the fifth position, and a value of the halfway run length, which is not terminated, is set in RUNRX.

Subsequently, in step S3245, it is judged if four run lengths exist in the LEFT, and two run lengths exist in the RIGHT. If conditions are satisfied, in step S3246, two run lengths are set in the fifth position, and a value of the halfway run length, which is not terminated, is set in RUNRX.

Subsequently, in step S3247, it is judged if four run lengths exist in the LEFT, and three run lengths exist in the RIGHT. If conditions are satisfied, instep S3248, three run lengths are set in the fifth position, and a value of the halfway run length, which is not terminated, is set in RUNRX.

Subsequently, in step S3249, it is judged if four run lengths exist in the LEFT, and four run lengths exist in the RIGHT. If conditions are satisfied, in step S3250, four run lengths are set, and a value of the halfway run length, which is not terminated, is set in RUNRX.

FIG. 36 to FIG. 39 show respectively a flowchart for explaining combining of the mask value by the mask value combining section of the run length processing section 2700. Though detailed description is omitted, mask values are constructed in accordance with 49 patterns consisting of 48 combinations of LDMASKx and RDMASKx (x=0 to 4) (step S3602 to step S3649) and one pattern of RAFL=LAFL=1 (step S3601).

Figure 40:
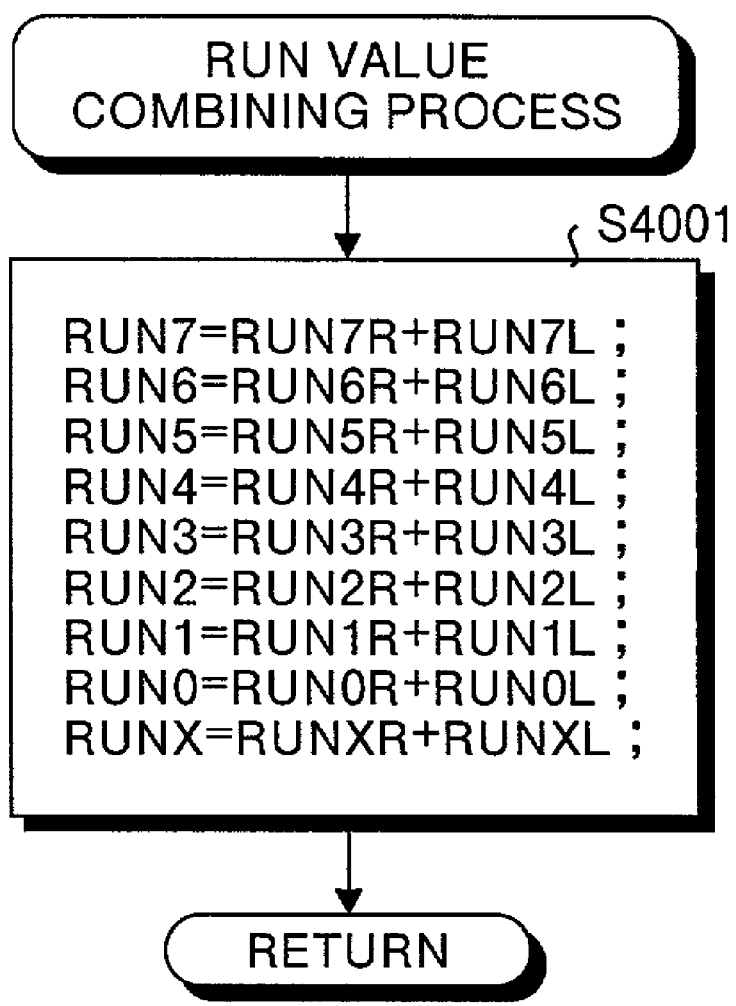
FIG. 40 is a flowchart for explaining one example of a processing performed by the run value combining section.

The processing performed by the run value generation section 2703 of the run length processing section 2700 will now be described. FIG. 40 is a flowchart for explaining one example of the processing performed by the run value combining section. The run values are combined by adding the corresponding parts of an output RUNxL (x=0 to 7) from the LEFT run value generation section 2703 and an output RUNxR (x=0 to 7) from the RIGHT run value generation section 2704. That is to say, the processing is such that the combined run length RUNx=RUNxR+RUNxL (x=1 to 7).

Hereafter, in the repetitive processing section 330 (see FIG. 3) and the encoding processing section 340, with respect to 4-bit parallel processing, each data consists of four run values or four repetition numbers, and also in case of 8-bit in parallel processing, each data consists of eight four run values or eight repetition numbers. Hence, it is possible to consider in the same manner. Therefore, the description thereof is omitted.

Moreover, the principle of the run value combining is not limited to a unit of 4 bits, and is applicable to any number of bits. If it is 16 bits, it is possible to use four run counters processing 4 bits, or to use two run counters processing 8 bits, or to use one run counter processing 16 bits.

Figure 41:
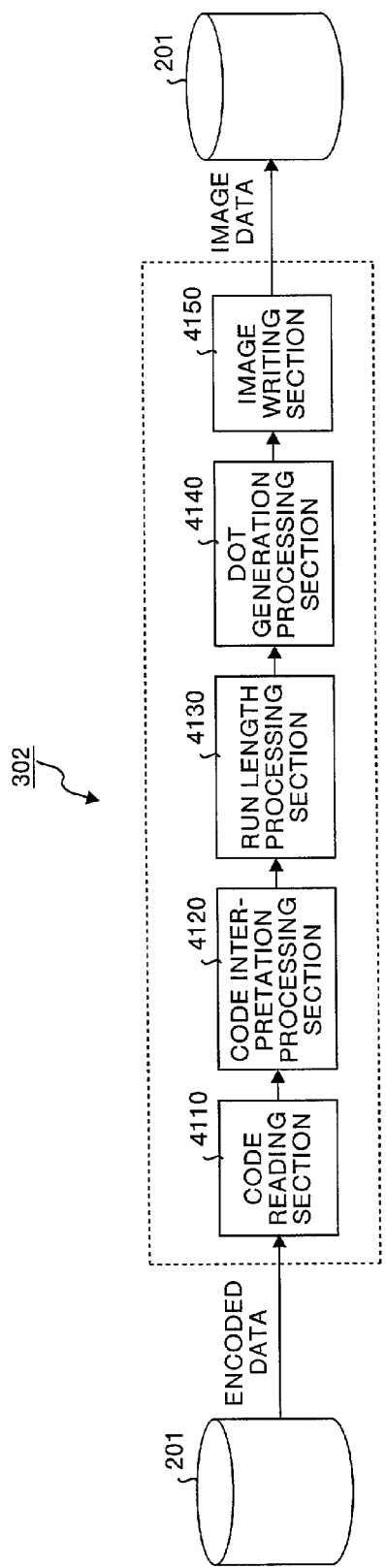
FIG. 41 is a block diagram for explaining the data flow when a decoding apparatus decodes the image data.

Details of the Decoding Section:

The decoding section 302 will now be described in detail. FIG. 41 is a block diagram for explaining the data flow when the decoding section 302 decodes the image data.

The decoding section 302 comprises a code reading section 4110 for reading encoded data, being an encoded image data from the image memory 201, a code interpretation processing section 4120 for interpreting the encoded data read by the code reading section 4110 and converting the encoded data to a run length or a repetition number, a run length processing section 4130 for developing the run length by the repeated amount based on the repetition number converted by the code interpretation processing section 4120, a DOT generation processing section 4140 for turning the run length decoded by the run length processing section 4130 into dots (turning it into image data), and an image writing section 4150 for writing the decoded image data in the image memory 201. Each section of the decoding section 302 will be described below.

Figure 42:
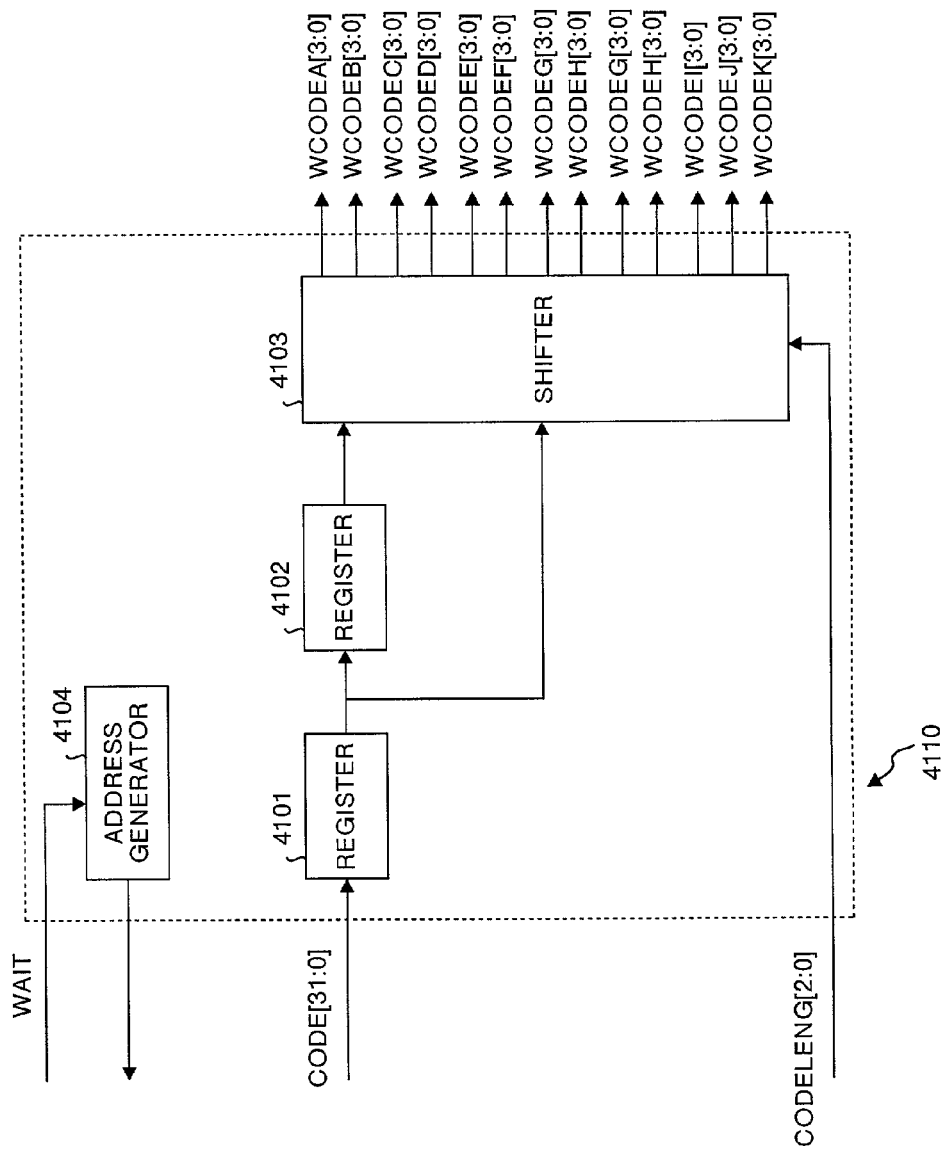
FIG. 42 is a block diagram showing one example of a construction of a code reading section.

The contents of the code reading section 4110 will now be described. FIG. 42 is a block diagram showing one example of a construction of the code reading section 4110. The code reading section 4110 comprises a register 4201 for storing encoded data read from the image memory 201, a register 4102 connected thereto, a shifter 4103, and an address generator 4104 for generating addresses for reading the codes. The code reading section 4110 reads a code in a format as shown in FIG. 23 and outputs it as a code for every 4 bits.

The register 4101 and the register 4102 are a register, respectively, and temporarily store the read encoded data. The shifter 4103 transfers the encoded data for every 4 bits to the code interpretation processing section 4120, while shifting a 4-bit code sequentially, according to the consumed code length (CODELENG) from the code interpretation processing section 4120 described below. Moreover, when the FIFO becomes full, read-in of the code is suspended by a WAIT signal from the FIFO.

The contents of the code interpretation processing section 4120 will now be described. The code interpretation processing section 4120 reads a plurality of codes in a unit of 4 bits from the code reading section 4110, and obtains four run lengths or four repetition numbers, and a plurality of flags indicating that the obtained value is a value of the run length or a value of the repetition number.

Figure 43:
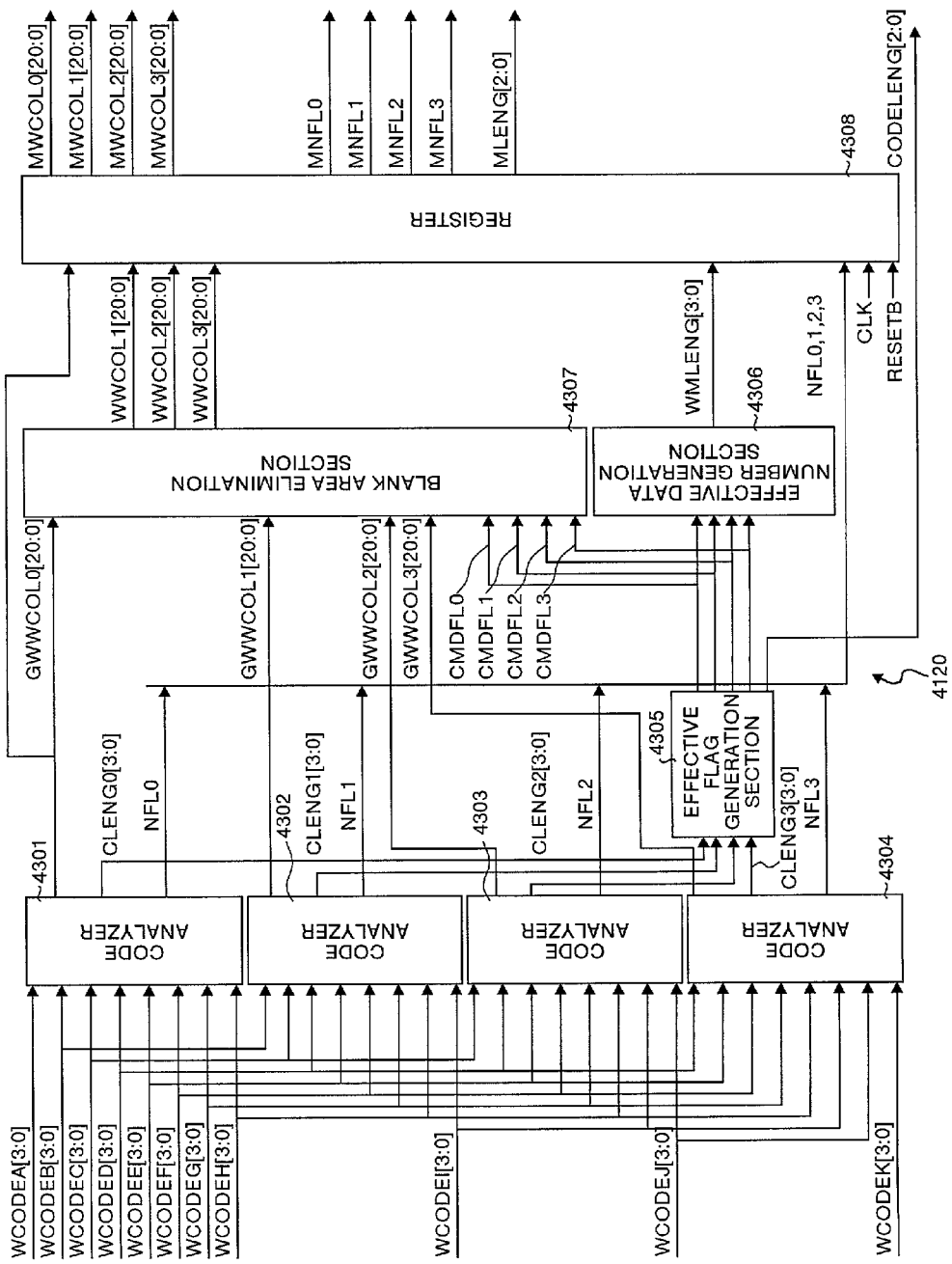
FIG. 43 is a block diagram showing one example of a construction of a code interpretation processing section.

FIG. 43 is a block diagram showing one example of a construction of the code interpretation processing section 4120. The code interpretation processing section 4120 comprises code analyzers 4301 to 4304, an effective flag generation section 4305, an effective data number generation section 4306, a blank area elimination section 4307, and a register 4308. An output example of the code interpretation processing section 4120 with respect to a specific input of encoded data (WCODE) will be described later separately.

As an overall processing performed by the code interpretation processing section 4120, at first, the code analyzers 4301 to 4304 analyzes the code in a format shown in FIG. 23. At this time, each one code analyzer can read a code of a maximum code length. In the format shown in FIG. 23, the maximum code length has eight 4-bit codes. The four code analyzers 4301 to 4304 respectively analyze eight 4-bit codes, respectively, by shifting by one 4-bit code. The contents of the analysis will be described later. The effective flag generation section 4305 judges whether the boundary of the code matches with each other or not in the respective code analyzer.

The effective flag generation section 4305 judges if it is effective or not from a value of the code length (CLENG0 to CLENG3) from the four code analyzers, outputs a run length or a repetition number output from the respective code analyzer, and a flag (CMDFL0 to CMDFL3) indicating whether a flag (NFL0 to NFL3) indicating that it is a run length or a repetition number is effective or ineffective, converts it to a length (MLENG) by the effective data number generation section 4306, and transfers, to the FIFO described later, a run length or a repetition number, the flag (CMDFL0 to CMDFL3) indicating whether the flag (NFL0 to NFL3) indicating that it is a run length or a repetition number is effective or ineffective, and the effective data number (MLENG).

Moreover, the effective flag generation section 4305 transfers the total code length (CODELENG) obtained by the effective flag generation section 4305 to the code reading section 4110, to thereby prepare the next code.

An output example of the code interpretation processing section 4120 with respect to a specific input of encoded data will be described later, with reference to FIG. 44 and FIG. 45.

Figure 46:
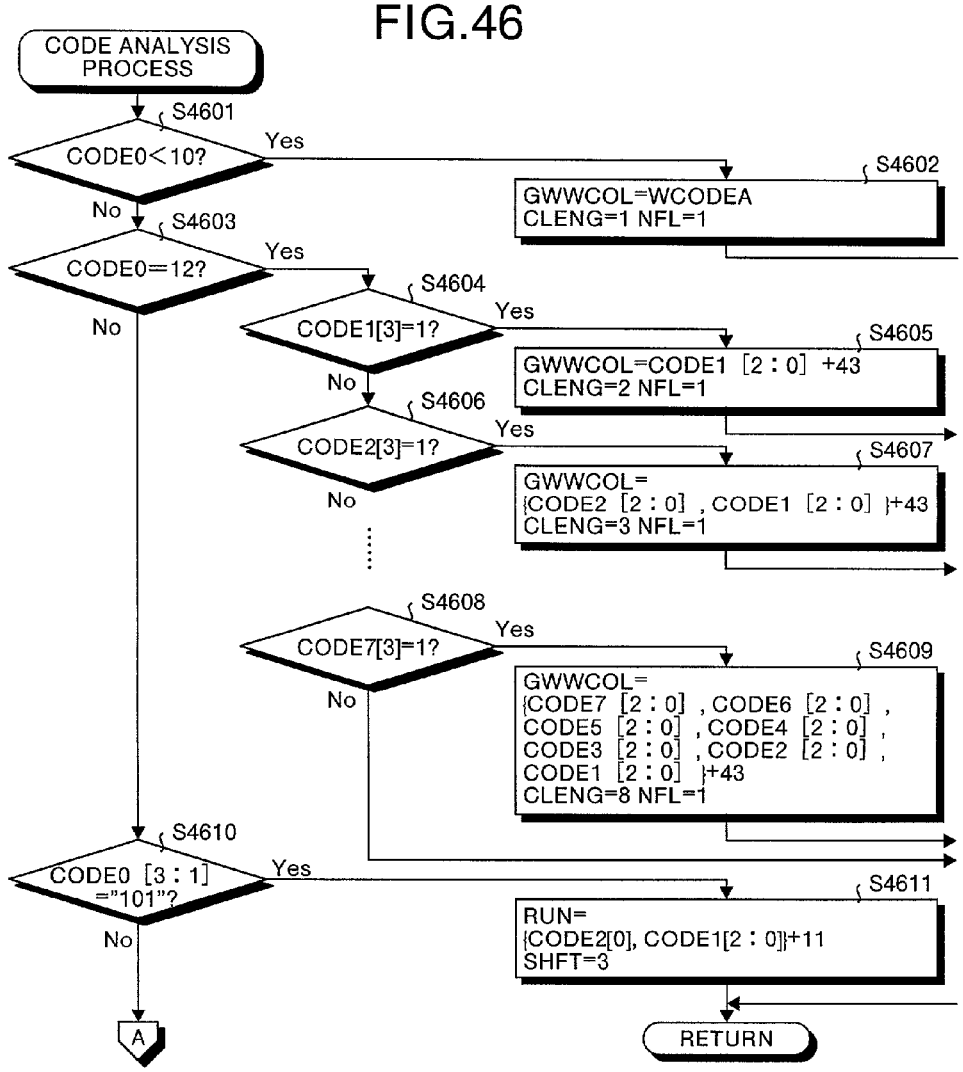
FIG. 46 is a flowchart showing a specific example of a processing performed by a code analyzer.
Figure 47:
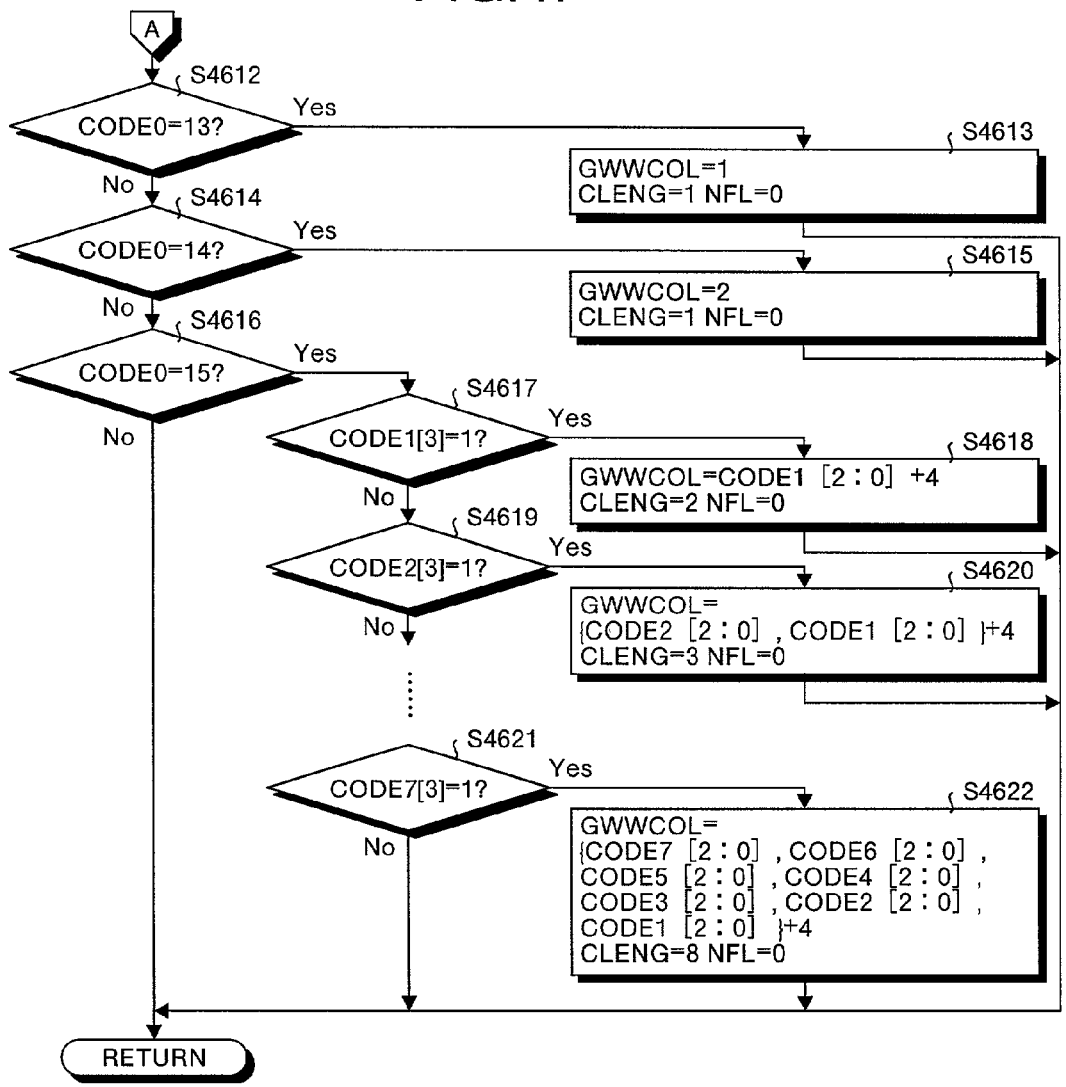
FIG. 47 is a continuation of the processing shown in FIG. 46.

Contents of each section of the code interpretation processing section 4120 will now be described in detail. The code analyzers 4301 to 4304 analyze codes having the format shown in FIG. 23, and output a run length or a repetition number, a flag (NFL) indicating whether it is a run length (GWWCOL) or a repetition number, and a processed code length (CLENG). At the time of analysis, one code analyzer is, respectively, made possible to read a code having a maximum code length (the MAX code length in the format shown in FIG. 6 is eight 4-bit codes). Then, the four code analyzers 4301 to 4304 analyze eight 4-bit codes, respectively, by shifting by one 4-bit code. An example of the specific processing performed by the code analyzer 4301 is shown in FIG. 46 and FIG. 47.

The effective flag generation section 4305 receives the processed code length (CLENG) from the code analyzers 4301 to 4304, and performs analysis in the following manner. That is, the code analyzer 4301 is in the correct position to perform analysis of correct codes, the code analyzer 4302 becomes effective if the code length processed by the code analyzer 4301 is 1, but ineffective if the code length is larger than 1. The code analyzer 4303 becomes effective if the figure obtained by adding the code length processed by the code analyzer 4301 and the code length processed by the code analyzer 4302 (0 if it is ineffective) is 1 or 2, but ineffective in other cases.

Figure 48:
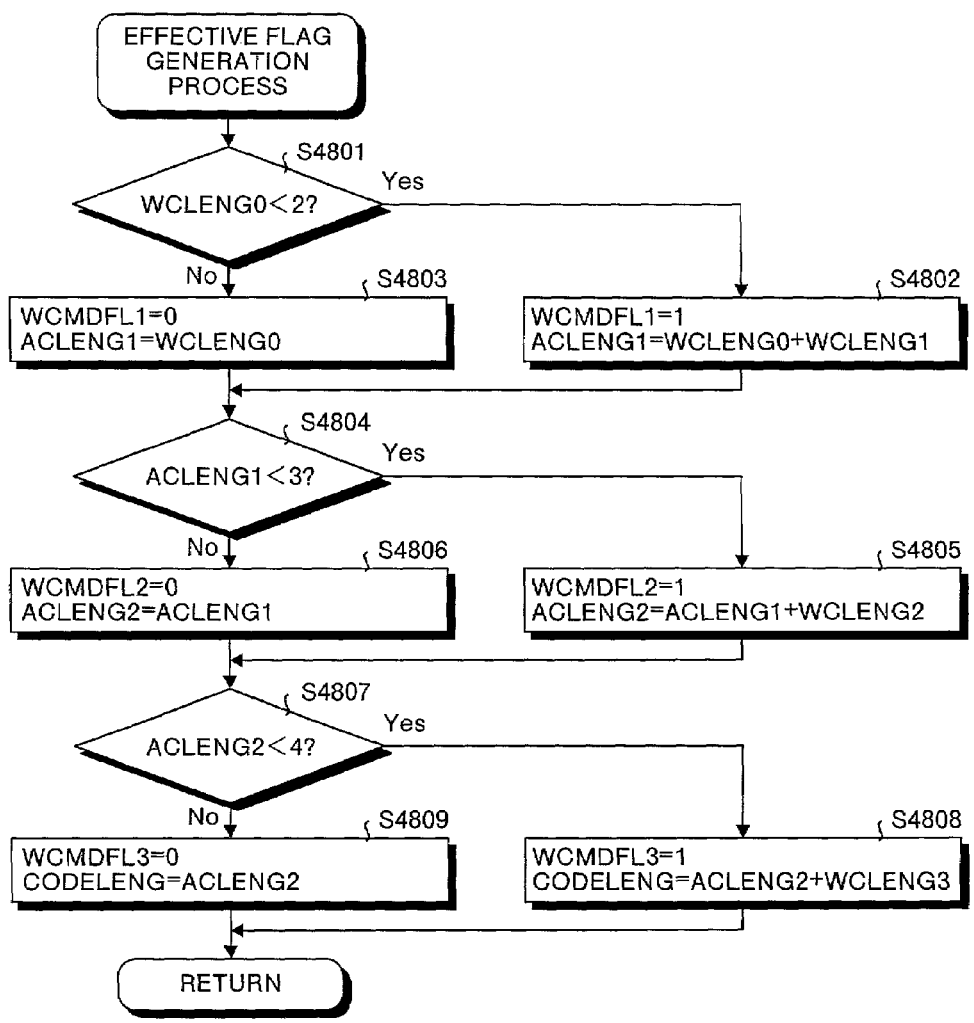
FIG. 48 is a flowchart showing a specific example of a processing performed by an effective flag generation section.

The code analyzer 4304 becomes effective if the figure obtained by adding the code length processed by the code analyzer 4301, the code length processed by the code analyzer 4302 (0 if it is ineffective) and the code length processed by the code analyzer 4303 (0 if it is ineffective) is 1 or 2 or 3, but ineffective in other cases. An example of the specific processing performed by the effective flag generation section 4305 is shown in FIG. 48.

Figure 49:
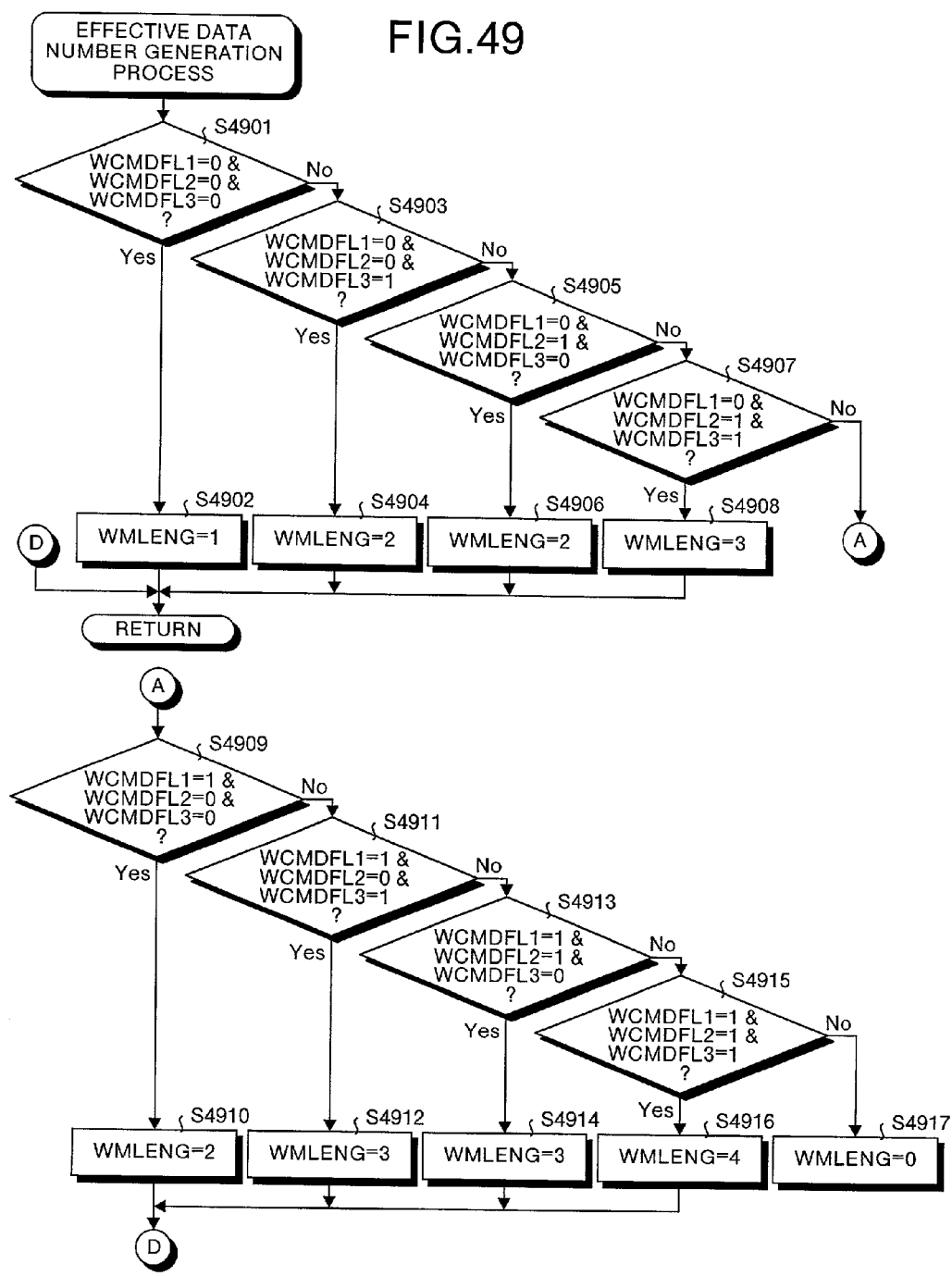
FIG. 49 is a flowchart showing a specific example of a processing performed by an effective data number generation section.

The effective data generation section 4306 converts the effective flag from the effective flag generation section 4305 to a length (MLENG). An example of the specific processing performed by the effective data generation section 4306 is shown in FIG. 49.

Figure 50:
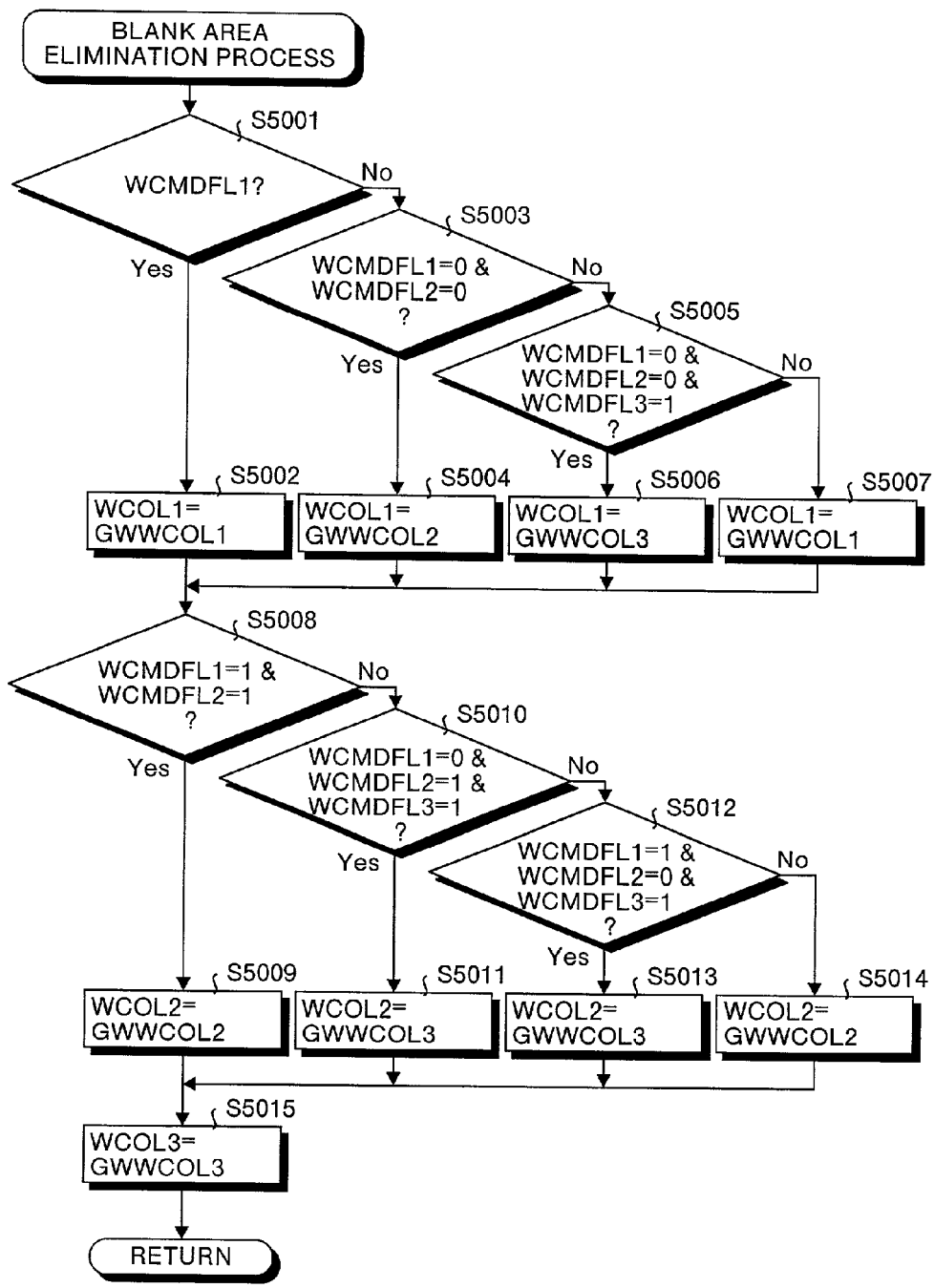
FIG. 50 is a flowchart showing a specific example of a processing performed by a blank area elimination section.

The blank area elimination section 4307 shifts a portion where there is no information, judged based on a plurality of repetition numbers or run lengths (GWWCOL0 to GWW-COL3) received from the code analyzers 4301 to 4304 and the effective/ineffective flag (CMDFL0 to CMDFL3) from the effective flag generation section 4305, to thereby reduce the repetition number or run length. An example of the specific processing performed by the blank area elimination section 4307 is shown in FIG. 50.

The processing contents of the code interpretation processing section 4120 will now be described, using a specific code queue. FIG. 44 and FIG. 45 are flowcharts showing one example of the processing performed by the code interpretation processing section 4120. In these figures, GWWCOL denotes the run length or repetition number of the code analyzed by the code analyzer 4301 to code analyzer 4304, CLENG denotes the length of the analyzed code, NFL denotes a flag indicating that the value of GWWCOL is a run length or a repetition number, and CMDFL denotes a flag indicating the effectiveness of the analysis result of each code analyzer obtained by the effective flag generation section 4305.

Moreover, MWCOL denotes the finally obtained run length or repetition number, and MNFL denotes a flag indicating if it is a run length or a repetition. CODELENG denotes a figure of analyzed code obtained by the effective flag generation section 4305. MLENG denotes the output figure of the run length or repetition number.

Figure 44:
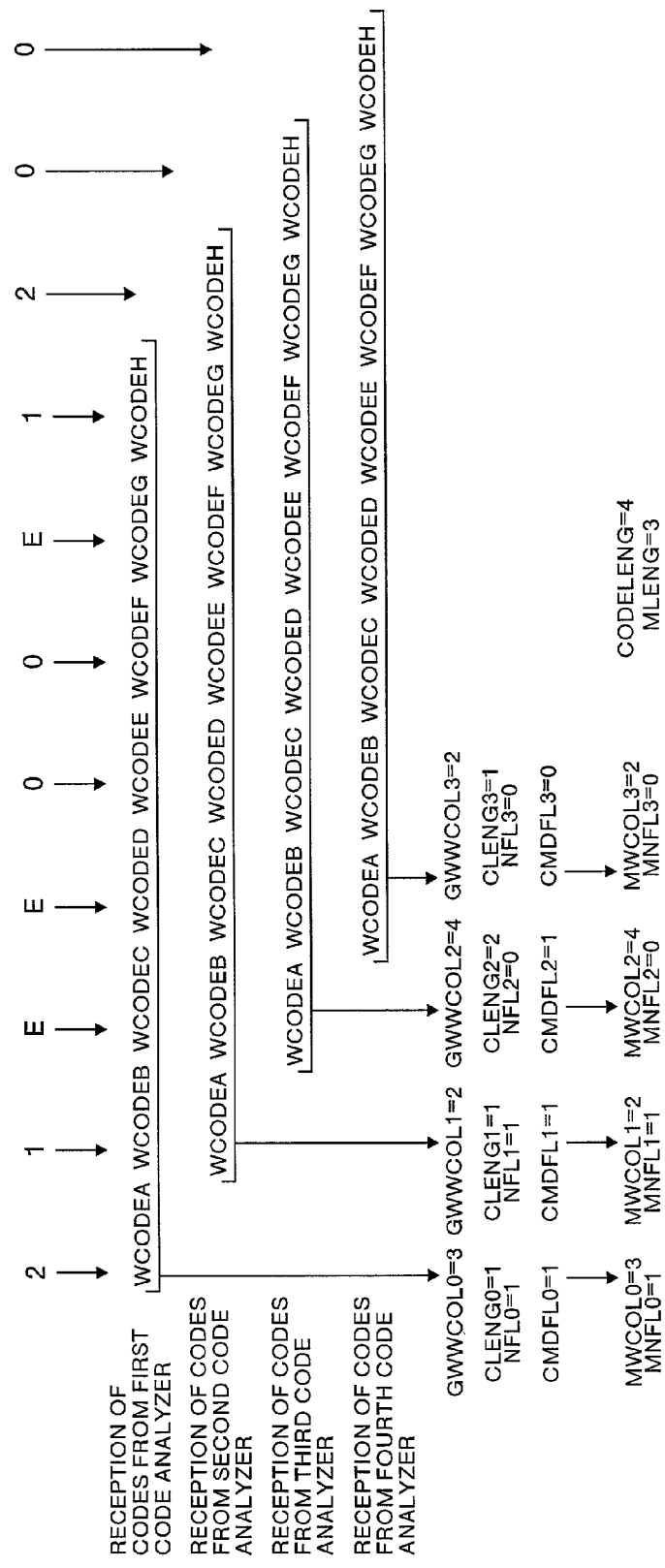
FIG. 44 is a flowchart showing one example of a processing performed by the code interpretation processing section.

As shown in FIG. 44, an example of when the code interpretation processing section 4120 receives codes of '2', '1', 'E', 'E', '0', '0', 'E', '1', '2', '0', '0' and analyzes these codes will be described.

The first code analyzer 4301 receives the code data (WCODEX (x=A to H) of '2', '1', 'E', 'E', '0', '0', 'E', '1', and analyzes the code as run length 3. This code number is 1.

The second code analyzer 4302 receives the code data of '1', 'E', 'E', '0', '0', 'E', '1', '1', '2', and analyzes the code as run length 2. This code number is 1.

The third code analyzer 4303 receives the code data of 'E', 'E', '0', '0', 'E', '1', '2', '0', and analyzes the code as repetition number 4. This code number is 1.

The fourth code analyzer 4304 receives the code data of 'E', '0', '0', 'E', '1', '2', '0', '0', and analyzes the code as repetition number 2. This code number is 1.

The effectiveness of the run length or repetition number analyzed by the respective code analysis processing section is then determined, from the code number obtained from the code analyzer 4301 to the code analyzer 4304. In the above example, since the code number of the run length/repetition number obtained by the third code analyzer 4303 is 2, it is seen that the code analyzed by the fourth code analyzer 4304 is not a top of the code, thereby the CMDFL3 of the fourth code analyzer 4304 is made ineffective. The number of codes consumed here is 4.

Figure 45:
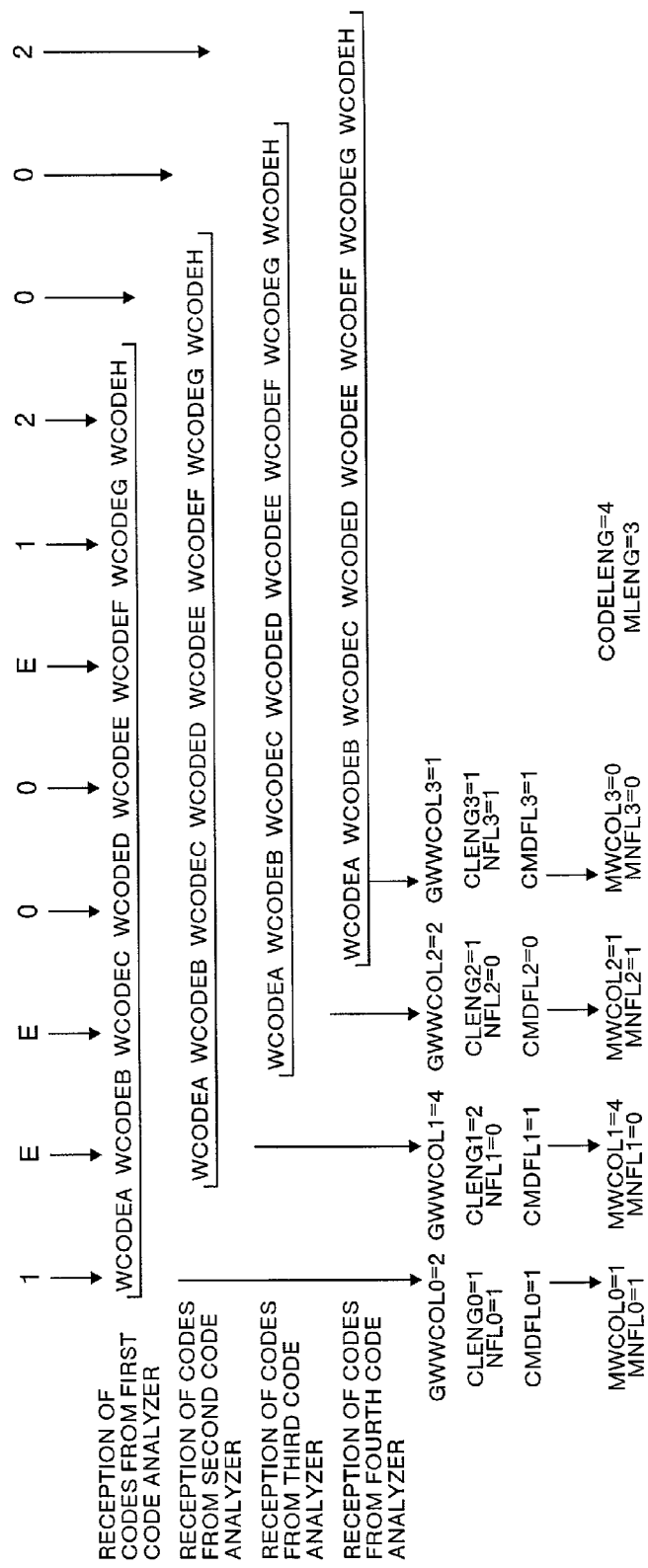
FIG. 45 is a flowchart showing another example of a processing performed by the code interpretation processing section.

As shown in FIG. 45, the next processing is to receive and analyze the code of '1', 'E', 'E', '0', '0', 'E', '1', '2', '0', '0', '2'. The first code analyzer 4301 receives the code '1', 'E', 'E', '0', '0', 'E', '1', '2', and analyzes the code as run length 2. This code number is 1.

The second code analyzer 4302 receives the code 'E', 'E', '0', '0', 'E', '1', '2', '0', and analyzes the code as repetition number 4. This code number is 2.

The third code analyzer 4303 receives the code 'E', '0', '0', 'E', '1', '2', '0', '0' and analyzes the code as repetition number 2. This code number is 1.

The fourth code analyzer 4304 receives the code '0', '0', 'E', '1', '2', '0', '0', '2', and analyzes the code as run length 1. This code number is 1.

The effectiveness of the run length or repetition number analyzed by the respective code analyzer is then determined, from the code number obtained from the code analyzer 4301 to the code analyzer 4304. In this example, since the code number of the run length/repetition number obtained by the second code analyzer 4302 is 2, it is seen that the code analyzed by the third code analyzer 4303 is not a top of the code, thereby the CMDFL2 of the third code analyzer 4303 is made ineffective.

Since there is a blank in the obtained run length or repetition number, the blank is eliminated by the blank area elimination section 4307, to thereby simplify the data format to be delivered to the next processing section. The number of codes consumed here is 4.

(Decoding Section 302: Contents of the Run Length Processing Section 4130)

Figure 51:
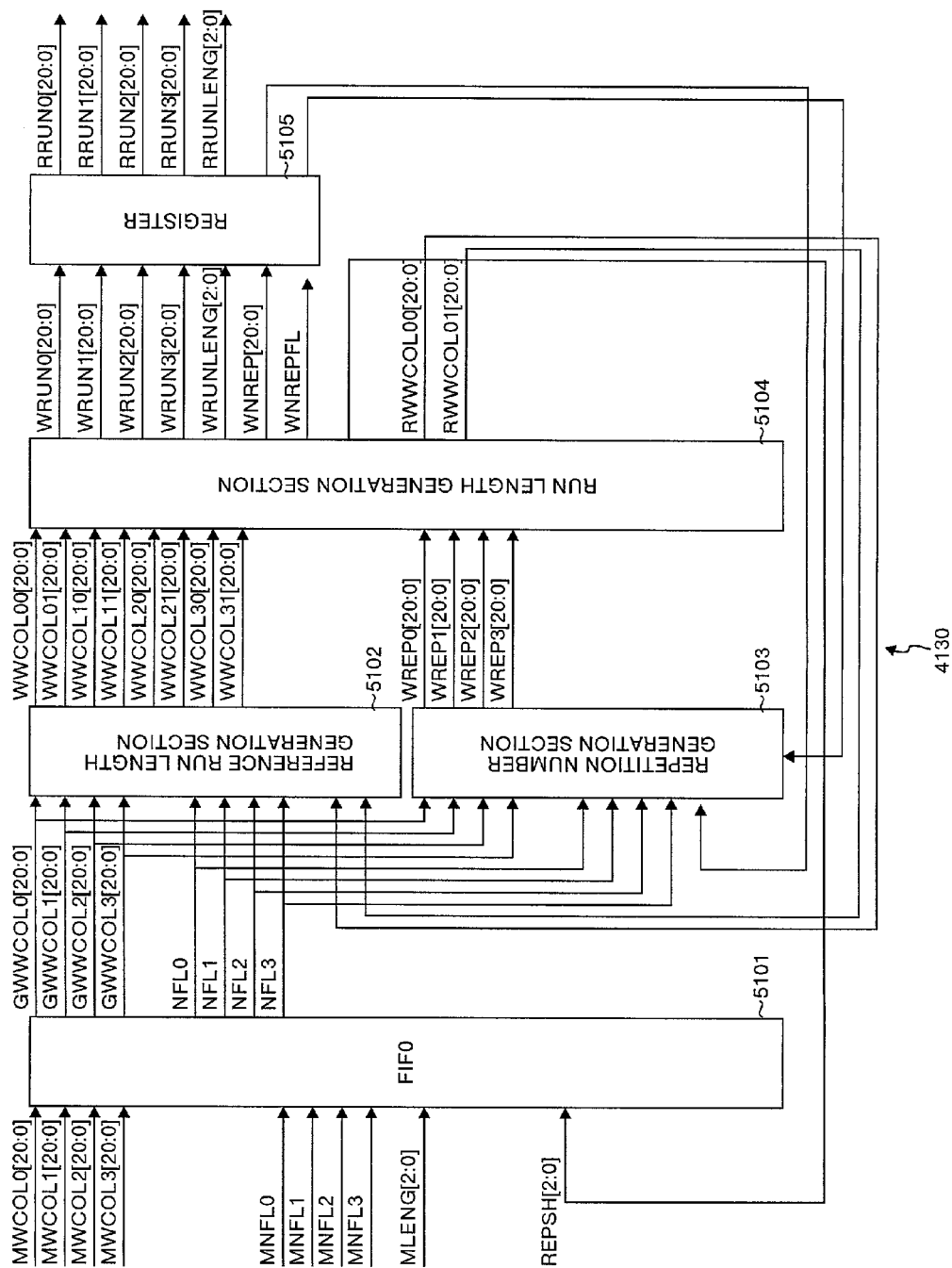
FIG. 51 is a block diagram showing one example of a construction of a run length processing section.

The contents of the run length processing section 4130 will now be described. FIG. 51 is a block diagram showing one example of a construction of the run length processing section 4130. The run length processing section 4130 comprises a FIFO 5101, a reference run length generation section 5102, a repetition number generation section 5103, a run length generation section 5104 and a register 5105.

The run length processing section 4130 receives a plurality of run lengths or repetition numbers and a plurality of flags indicating that it is a run length or a repetition number from the code interpretation processing section 4120, develops the repetition number, generates four run lengths and outputs these to the DOT generation processing section 4140. As a result, maximum four run lengths required for generating a 4-bit decoded pattern for every clock can be generated.

The contents of each section of the run length processing section 4130 will now be described. The FIFO 5101 receives a plurality of run lengths or repetition numbers MWCOL, a plurality of flags MNFL indicating that it is a run length or a repetition number, and a figure thereof (MLENG), and stores these sequentially. The FIFO 5101 sends four MWCOLs and a plurality of MNFLs to the reference run length generation section 5102 and the repetition number generation section 5103, inputs the number of REPSH, being the number of data consumed in the run length generation section 5104, and shifts the value by the number of REPSH. Thereby the stored data is output.

The reference run length generation section 5102 receives a plurality of run lengths or repetition numbers GWWCOL and a plurality of flags NFL indicating that it is a run length or a repetition number from the FIFO 5101, and the previous last run length RWWCOL00, RWWCOL01 from the run length generation section 5104, and converts these into a format as described below so that repetitive processing can be easily performed.

If the previous last run length=5, four run lengths from the FIFO=3, 2, 4, 1 and the flag indicating that it is a run length or a repetition number=0, 0, 1, 0 (the third is repetition), the processing is performed as follows.

TABLE 1

|  | WWCOL | | | |
| --- | --- | --- | --- | --- |
| Color | 0 | 1 | 2 | 3 |
| 0: | 3 | 3 | 3 | 1 |
| 1: | 5 | 2 | 2 | 2 |

This is repeatedly processed by the run length generation section 5104 as described below.

TABLE 2

| WWCOL | 0 | 1 | 2 | 3 | 4 | 5 | 6 |
| --- | --- | --- | --- | --- | --- | --- | --- |
| Color | | | | | | | |
| 0: | 3 | 3 | 3 | 3 | 3 | 3 | 1 |
| 1: | 5 | 2 | 2 | 2 | 2 | 2 | 2 |

The image data is a repetition of white and black run lengths, and the run length has white one and black one. If the next color of the run length begins from, for example, '0', it can be converted into the information including only run lengths by searching in a zigzag manner, for example, color 0, WWCOL0=3, then, color 1, WWCOL1=2, color 0, WWCOL2=3, color 1, WWCOL3=2, color 0, WWCOL4=3, that is, 3, 2, 3, 2, 3, 2, 1, . . . .

Here, the processing is performed until the following level, where conversion from information including run length and repetition to the information including only the run length is easy.

TABLE 3

|  | WWCOL | | | |
| --- | --- | --- | --- | --- |
| Color | 0 | 1 | 2 | 3 |
| 0: | 3 | 3 | 3 | 1 |
| 1: | 5 | 2 | 2 | 2 |

Figure 52:
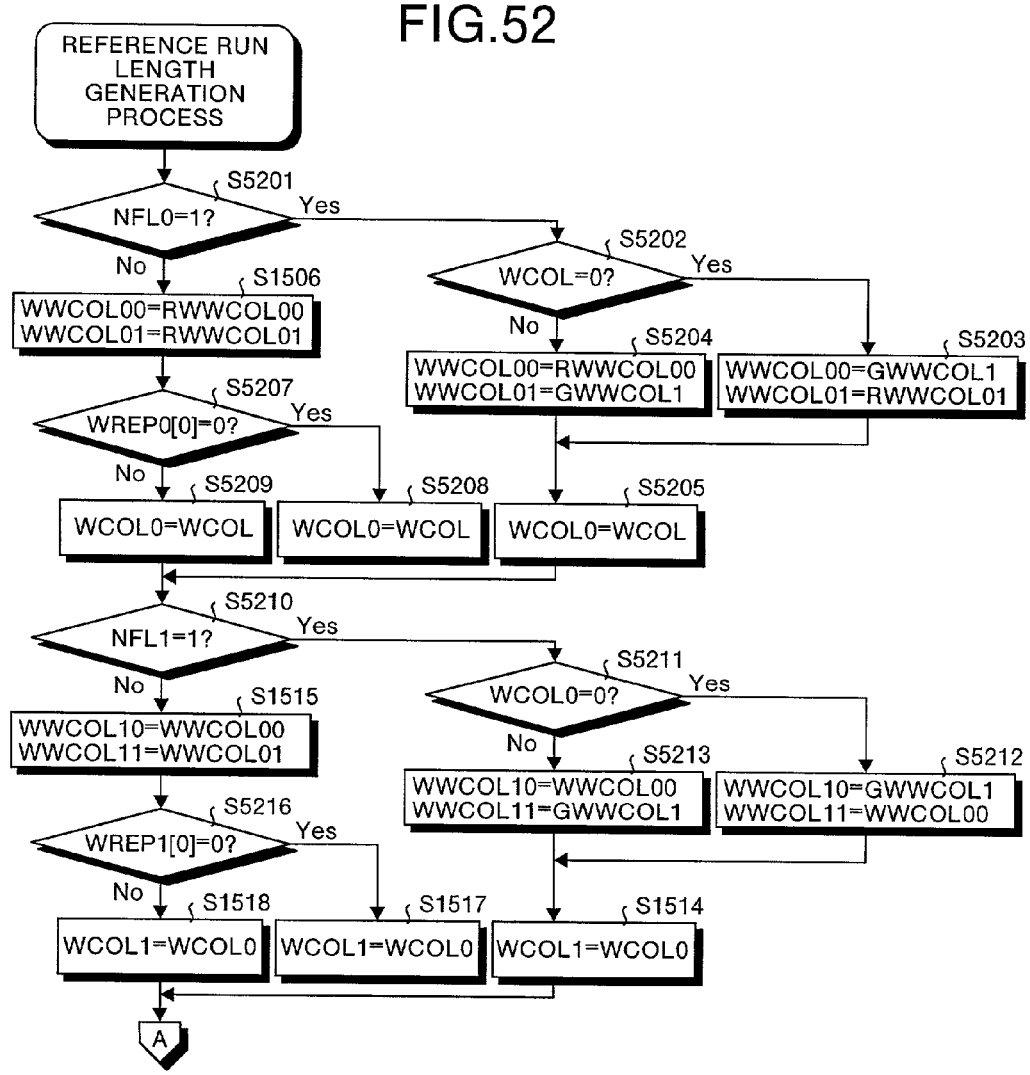
FIG. 52 is a flowchart showing a specific example of a processing performed by a reference run length generation section.
Figure 53:
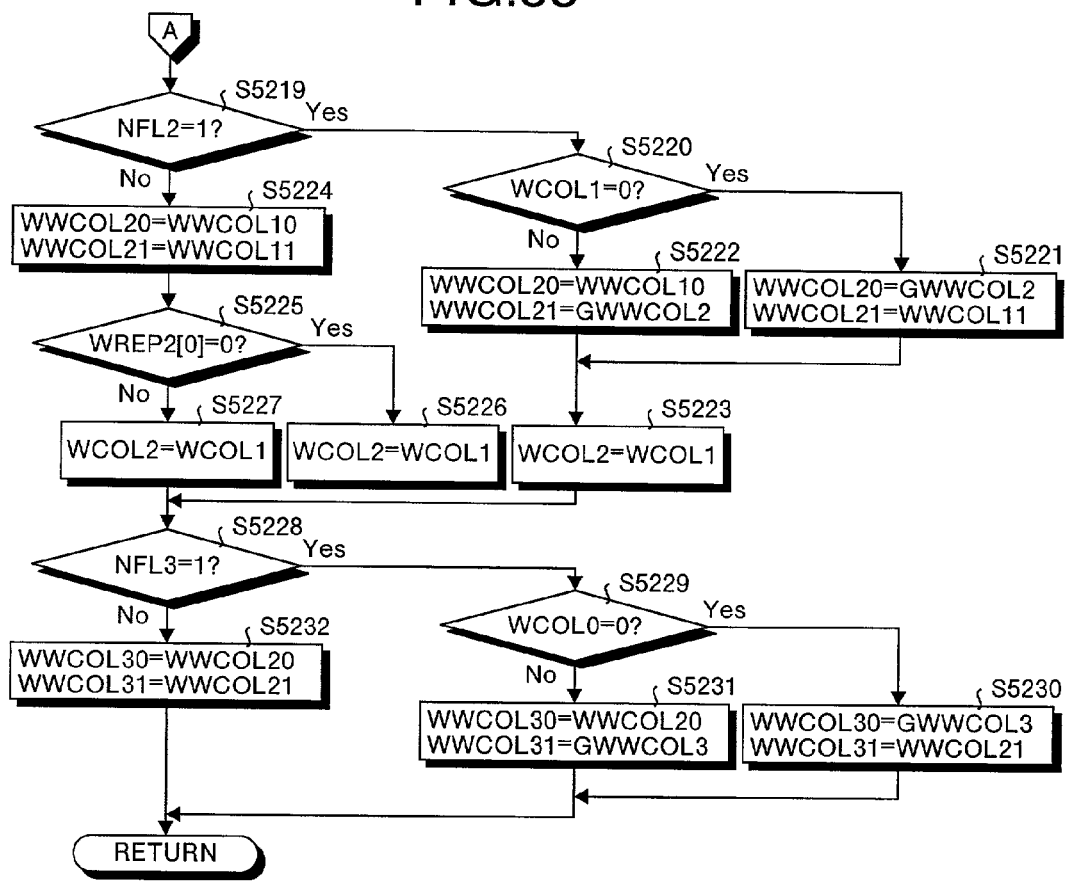
FIG. 53 is a continuation of the processing shown in FIG. 52.

An example of a specific processing performed by the reference run length generation section 5102 is shown in FIG. 52 and FIG. 53.

Figure 54:
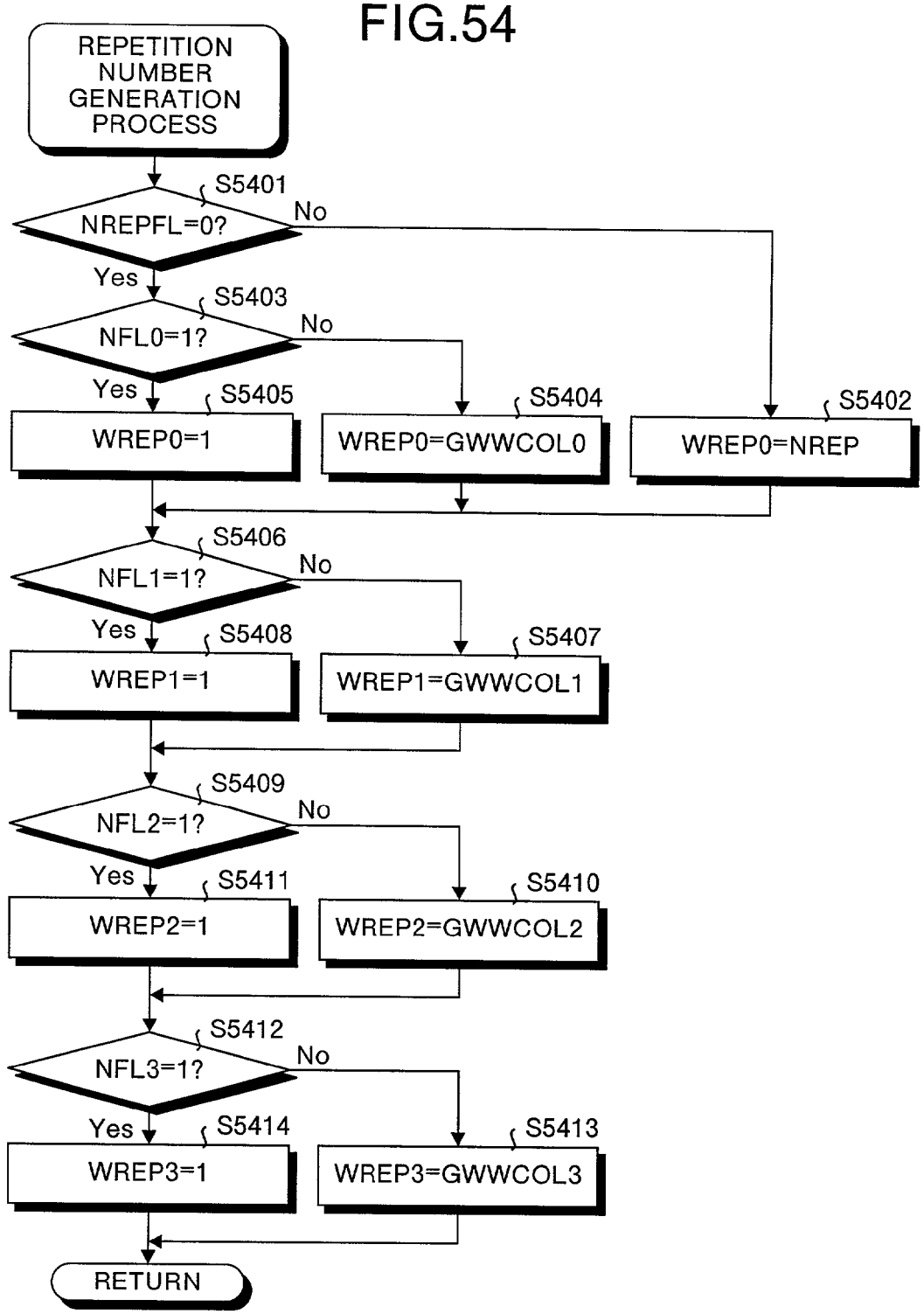
FIG. 54 is a flowchart showing a specific example of a processing performed by a repetition number generation section.
Figure 55:
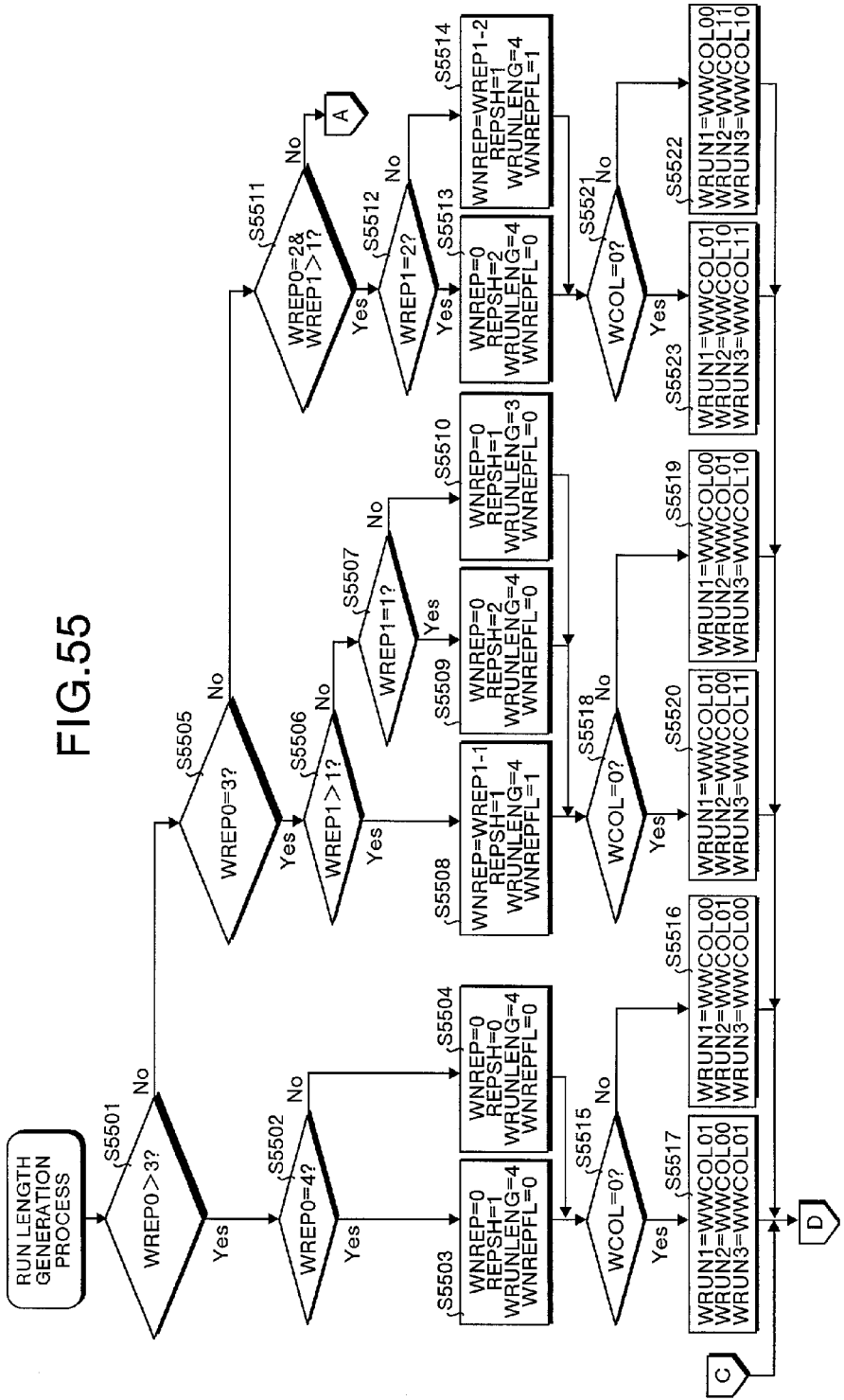
FIG. 55 is a flowchart showing a specific example of a processing performed by the run length generation section.
Figure 56:
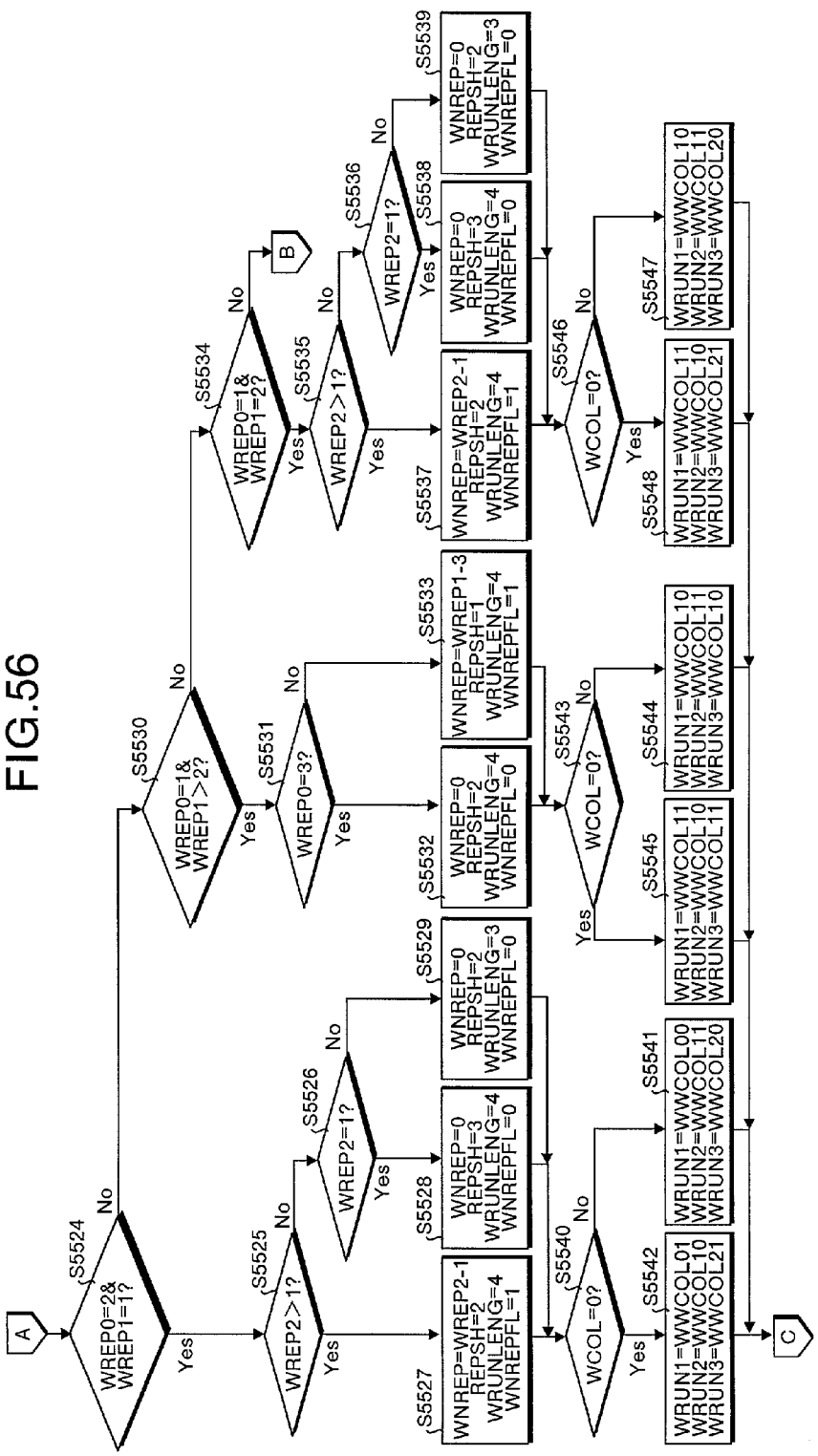
FIG. 56 is a continuation of the processing shown in FIG. 55.
Figure 57:
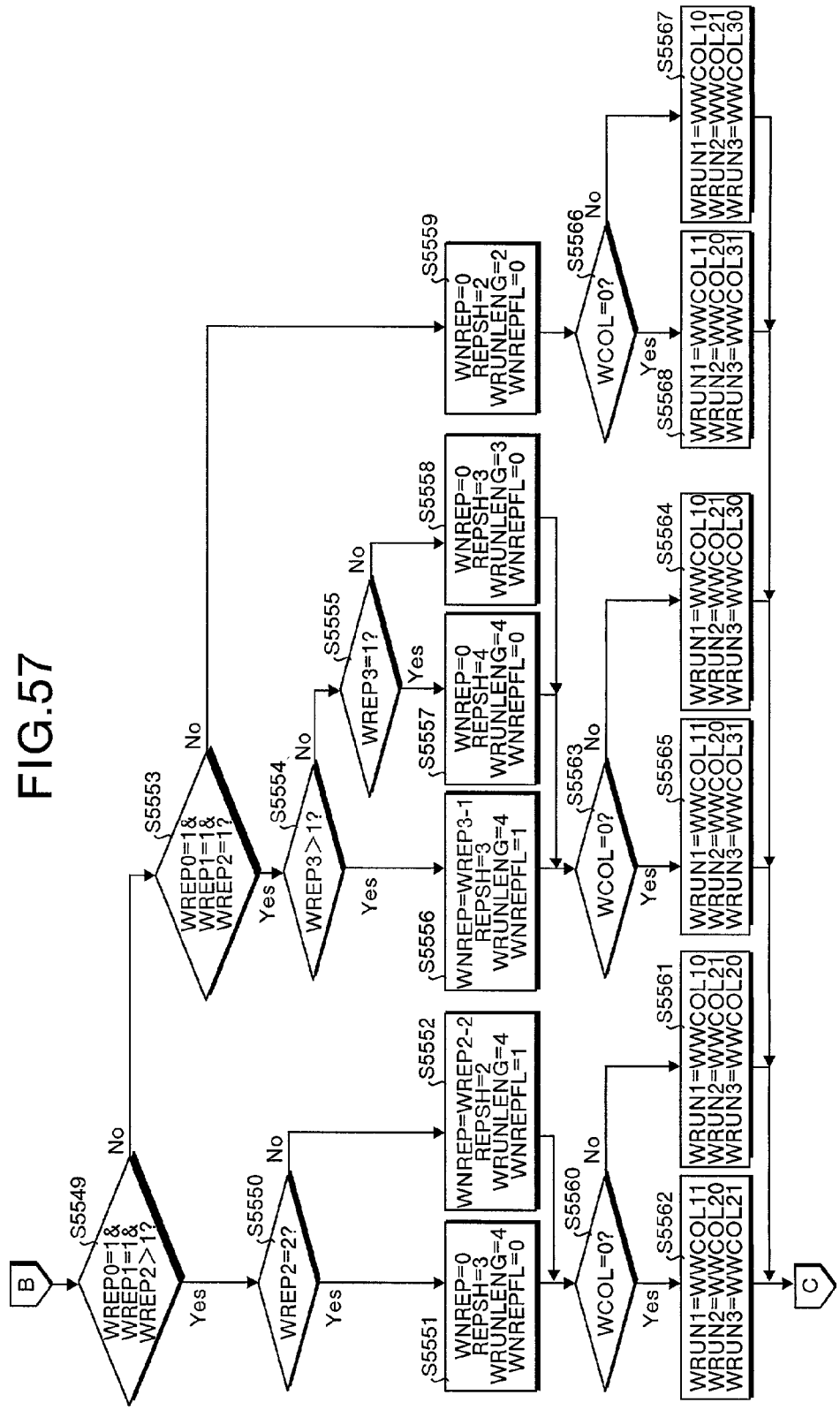
FIG. 57 is a continuation of the processing shown in FIG. 56.
Figure 58:
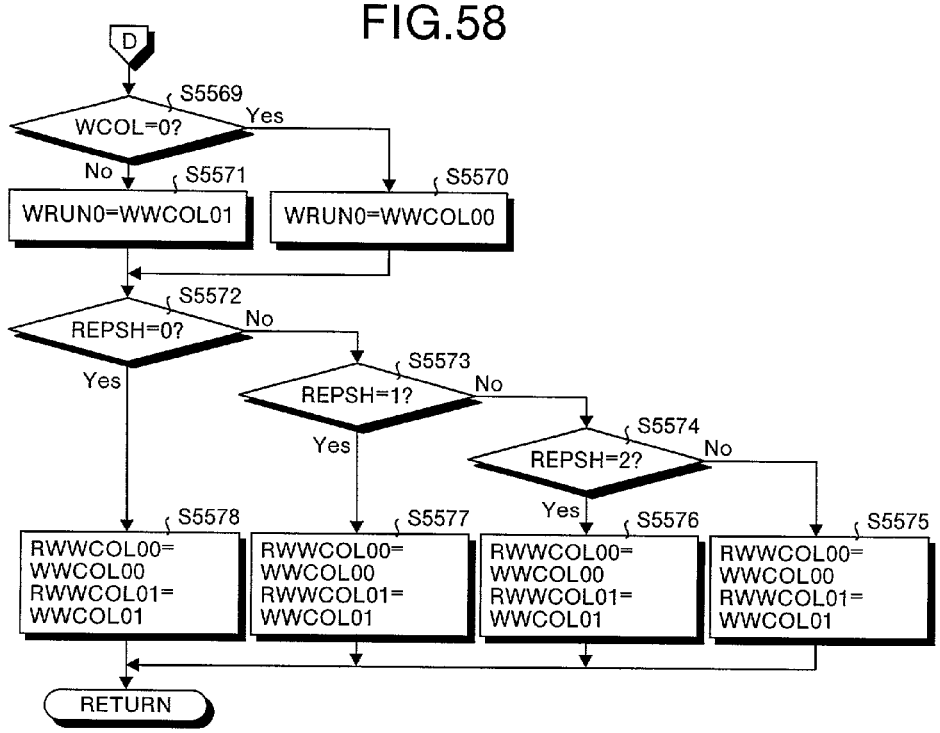
FIG. 58 is a continuation of the processing shown in FIG. 46.

The repetition number generation section 5103 receives a plurality of run lengths or repetition numbers and a plurality of flags indicating that it is a run length or a repetition number from the FIFO 5101, to generate a repetition number WREP. An example of a specific processing performed by the repetition number generation section 5103 is shown in FIG. 54.

The run length generation section 5104 receives the information of black and white run lengths for easy repetitive processing from the reference run length generation section 5102, as described in the reference run length generation section 5102, and the repetition information from the repetition number generation section 5103, to thereby develop the run length.

Examples of WWCOL and WREP to be input are shown below.

TABLE 4

|  | WWCOL | | | |
| --- | --- | --- | --- | --- |
| Color | 0 | 1 | 2 | 3 |
| 0: | 3 | 3 | 3 | 1 |
| 1: | 5 | 2 | 2 | 2 |
| WREP | 1 | 1 | 4 | 1 |

It can be developed as follows, based on WREP.

TABLE 5

| WWCOL | 0 | 1 | 2 | 3 | 4 | 5 | 6 |
| --- | --- | --- | --- | --- | --- | --- | --- |
| Color | | | | | | | |
| 0: | 3 | 3 | 3 | 3 | 3 | 3 | 1 |
| 1: | 5 | 2 | 2 | 2 | 2 | 2 | 2 |

From the obtained result, a progression including only the information of run length can be obtained, as 3, 2, 3, 2, 3, 2, 1, . . . .

The repetition pattern of the input data is recognized, from all repetition patterns repeating 4 dots, {4}, {3, 1}, {2, 2}, {2, 1, 1}, {1, 3}, {1, 2, 1}, {1, 1, 2} and {1, 1, 1, 1}, the run length is developed as in the above example, and the number of data sufficient for filling four runs are returned as REPSH to the FIFO 5101. Then, the number of runs WRUNLENG, the run length, and the last halfway repetition number c, remaining after four runs have been filled, are sent to the register 5105.

WNREP is then supplemented. For example, in an example described below,

TABLE 6

| WWCOL | 0 | 1 | 2 | 3 | 4 | 5 | 6 |
| --- | --- | --- | --- | --- | --- | --- | --- |
| Color | | | | | | | |
| 0: | 3 | 3 | 3 | 3 | 3 | 3 | 1 |
| 1: | 5 | 2 | 2 | 2 | 2 | 2 | 2 | since, the following four runs are sufficient, four repetitions of the repeated WREP2 are used only up to 2 halfway, and the remaining two repetitions are held in NREP. If there is a remaining repetition, a WNREPFL flag is set, and the repetition is sent to the repetition number generation section 5103, and used as the next first repetition number.

TABLE 7

|  | WWCOL | | | |
| --- | --- | --- | --- | --- |
| Color | 0 | 1 | 2 | 3 |
| 0: | 3 | 3 | 3 | 3 |
| 1: | 5 | 2 | 2 | 2 |

An example of a specific processing performed by the run length generation section 5104 is shown in FIG. 55 to FIG. 58.

Figure 59:
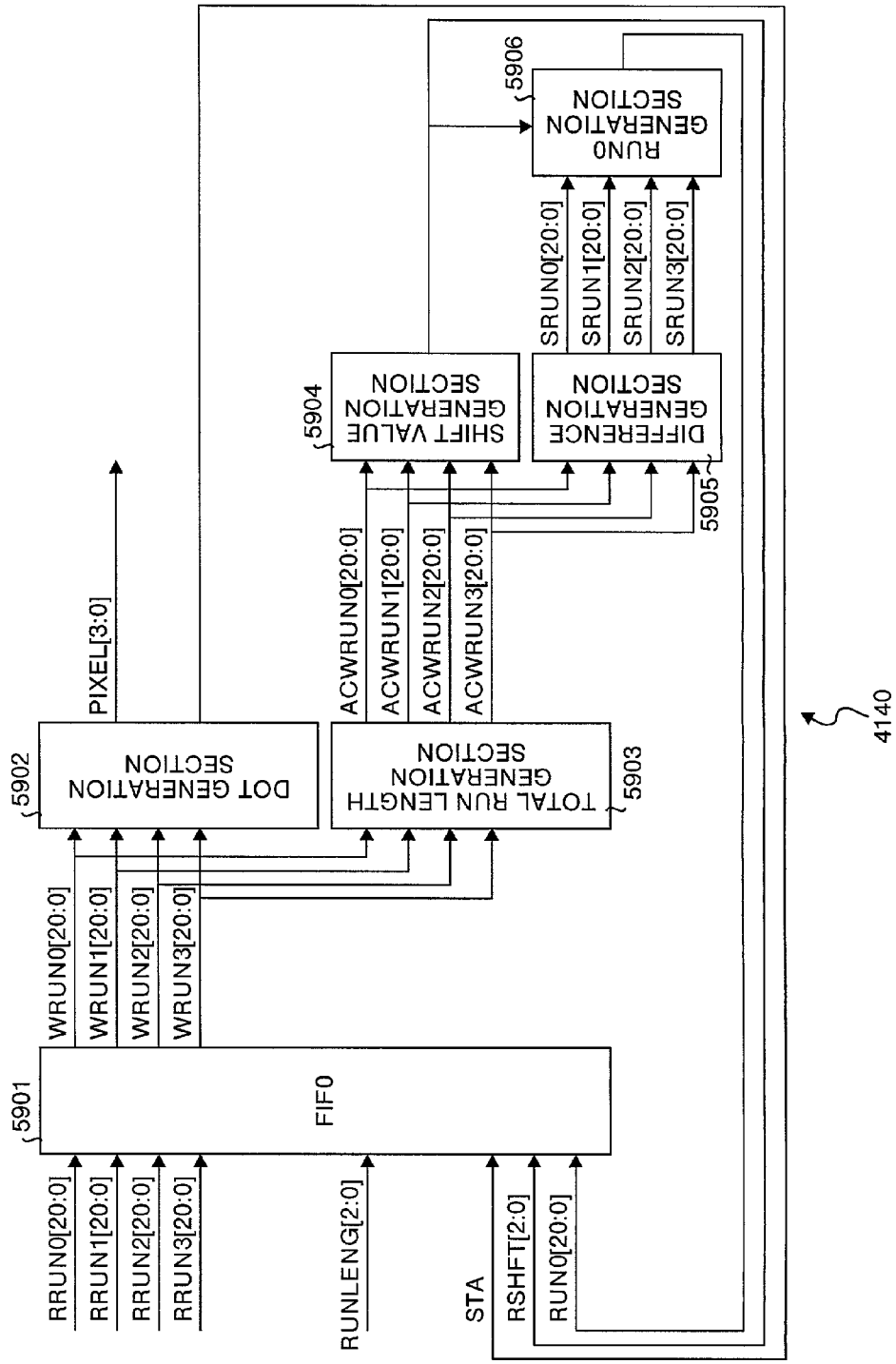
FIG. 59 is a block diagram showing an example of configuration of a DOT generation section.

The contents of the DOT generation processing section 4140 will now be described. FIG. 59 is a block diagram showing a configuration example of a DOT generation section. The DOT generation processing section 4140 comprises a FIFO 5901, a DOT generation section 5902, a total run length generation section 5903, a shift value generation section 5904, a difference generation section 5905, and a RUN0 generation section 5906.

The DOT generation processing section 4140 receives four run lengths RRUN and effective number RUNLENG of the run lengths from the FIFO 5901, generates dots of the run length by the DOT generation section 5902, determines the total of the run length at the respective positions of the four runs, for judging in which position of the four run lengths the four dots are filled by the TOTAL run length generation section 5903 to thereby find a position of the run length in which four dots are filled by the shift value generation section 5904, informs the FIFO 5901 of the number of consumed run lengths, and performs a shift for the next four dots. In the difference generation section 5905, if there is a remainder at the time of filling the four dots with any of the four run lengths, the remainder is sent to the FIFO 5901 and a difference between the four values and the total value of each run length from the TOTAL run length generation section 5903 is determined for obtaining the remaining run length to be used as the next first run value. Then, a run value actually used is received from the shift value generation section 5904 to select RUN0 by the RUN0 generation section 5906, and the RUN0 is sent to the FIFO 5901.

By performing the above processing in one clock, a 4-dot pixel can be decoded for every clock.

Next, each constituent section of the DOT generation processing section 4140 will be described in detail. The FIFO 5901 receives four run lengths RRUN and the effective number of the run length RUNLENG from the run length processing section 4130, and stores therein sequentially. The FIFO 5901 then sends four lengths WRUN to the DOT generation section 5902 and the TOTAL run length generation section 5903. If there is a remainder at the time of filling the four dots with any of the four run lengths, this matter is informed as a STA flag to the FIFO 5901 from the DOT generation section 5902. Then, the number of consumed run lengths is sent to the FIFO 5901 from the shift value generation section 5904, and if there is a remainder at the time of filling the four dots, the remainder is also sent to the FIFO 5901 from the RUN0 generation section 5906. The FIFO 5901 also receives the remaining run length to be used as the next first run value, and if there is a remainder, the remaining run value RUN0 is shifted as specified, as the next first run value, to thereby output the stored data.

The DOT generation section 5902 receives four run lengths WRUN from the FIFO 5901, to recognize all the four run combinations for filling the four dots, that is, {4}, {3, 1}, {2, 2}, {2, 1, 1}, {1, 3}, {1, 2, 1}, {1, 1, 2} and {1, 1, 1, 1}, and uses some runs from the first of the four runs to fill four dots, to thereby generate four dots. If there is a remainder at the time of filling four dots with any of the four run lengths, it is informed to the FIFO 4140 by the STA flag.

An example of a specific processing performed by the DOT generation section 5902 will be described later, using FIG. 64 to FIG. 68.

The TOTAL run length generation section 5903 obtains the total of the run length at the respective position of four runs, for judging in which position of the four run lengths four dots are filled. That is to say, the length of the first run length equals to the length of run length 1 (ACWRUN0=WRUN0), the length of the second run length equals to the length obtained by adding the length of run length 1 and run length 2 (ACWRUN1=WRUN0+WRUN1), the length of the third run length equals to the length obtained by adding the length of run length 1, run length 2 and run length 3 (ACWRUN2=WRUN0+WRUN1+WRUN2), and the length of the fourth run length equals to the length obtained by adding the length of run length 1, run length 2, run length 3 and run length 4 (ACWRUN3=WRUN0+WRUN1+WRUN2+WRUN3).

Figure 60:
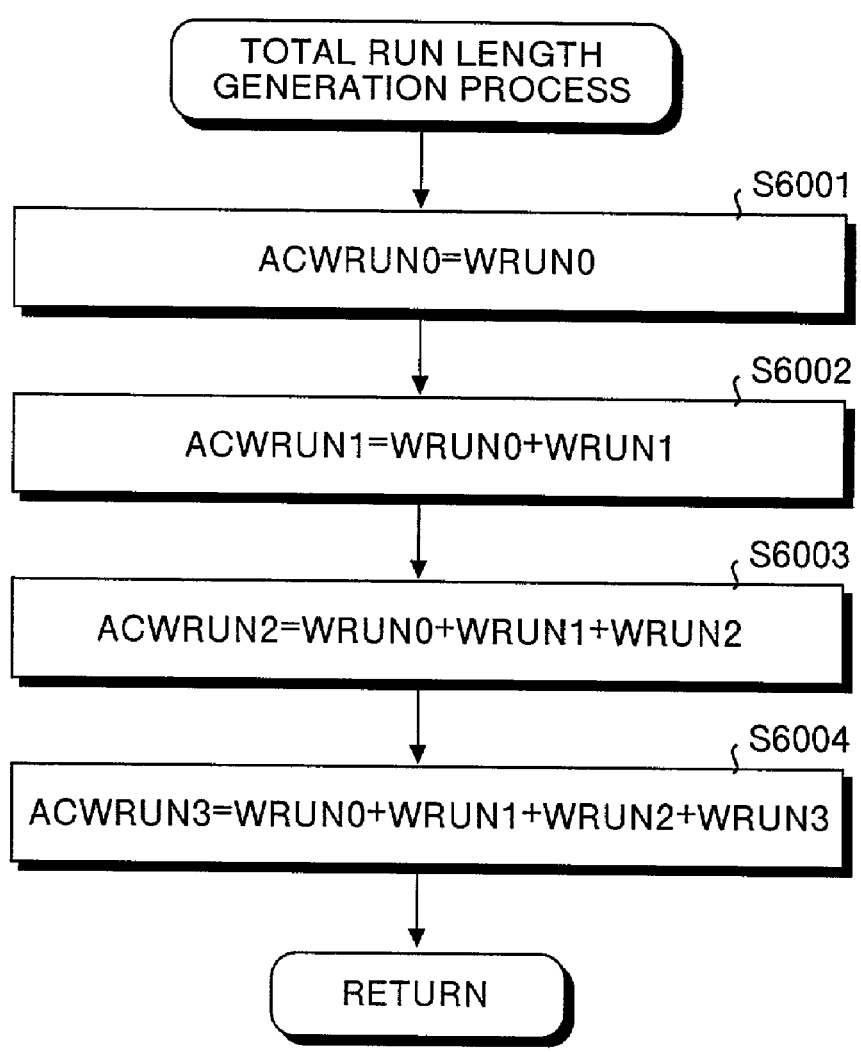
FIG. 60 is a flowchart showing a specific example of a processing performed by a TOTAL run length generation section.

An example of a specific processing performed by the TOTAL run length generation section 5903 is shown in FIG. 60.

Figure 61:
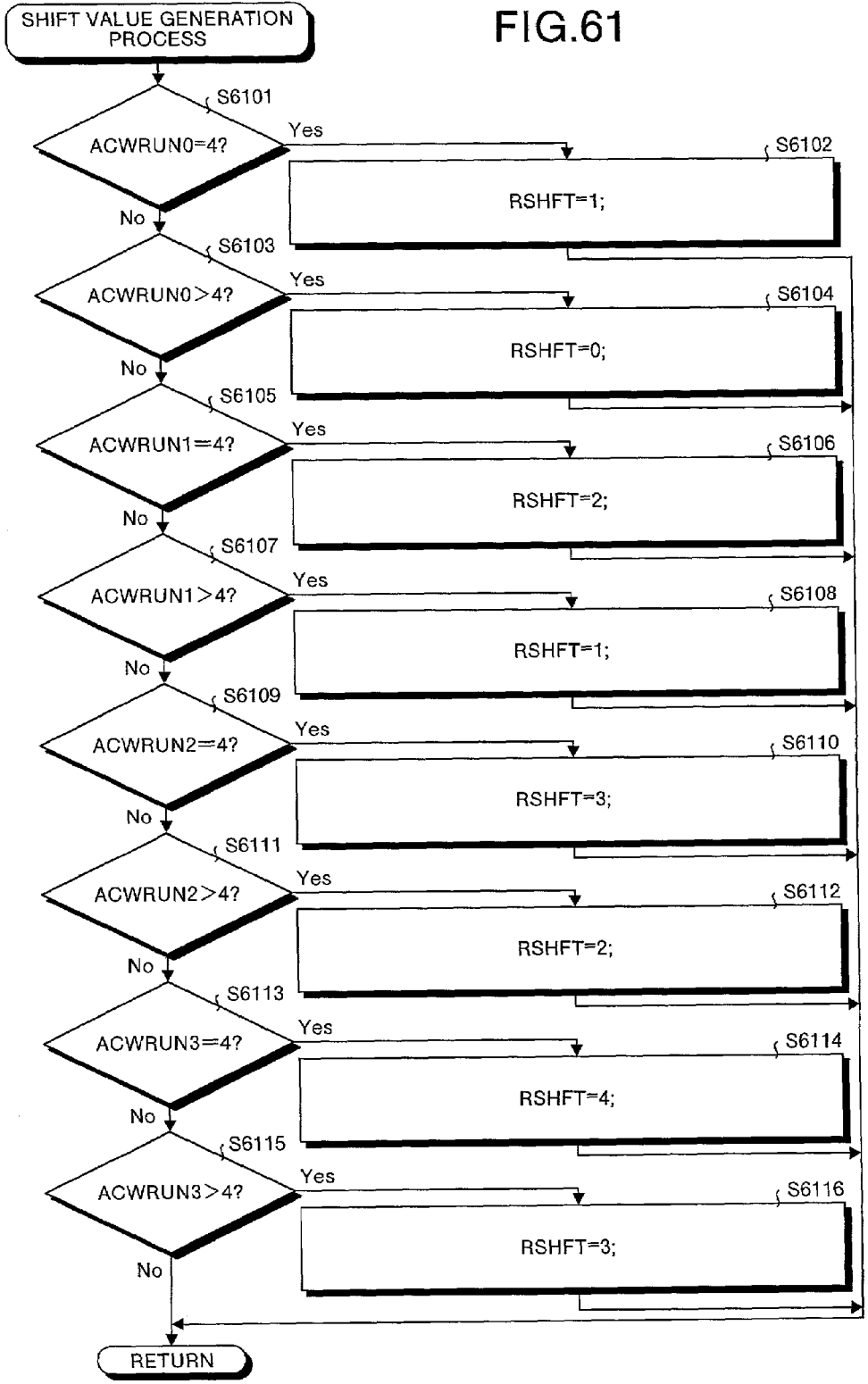
FIG. 61 is a flowchart showing a specific example of a processing performed by a shift value generation section.

In order to find a position of the run length to fill four dots, the shift value generation section 5904 finds a position having a value of 4 or more by giving priority to the run length of the total of four run lengths from the TOTAL run length generation section 5903 from the first, and informs the position to the FIFO 5901 and the RUN0 generation section 5906. An example of a specific processing performed by the shift value generation section 5904 is shown in FIG. 61.

Figure 62:
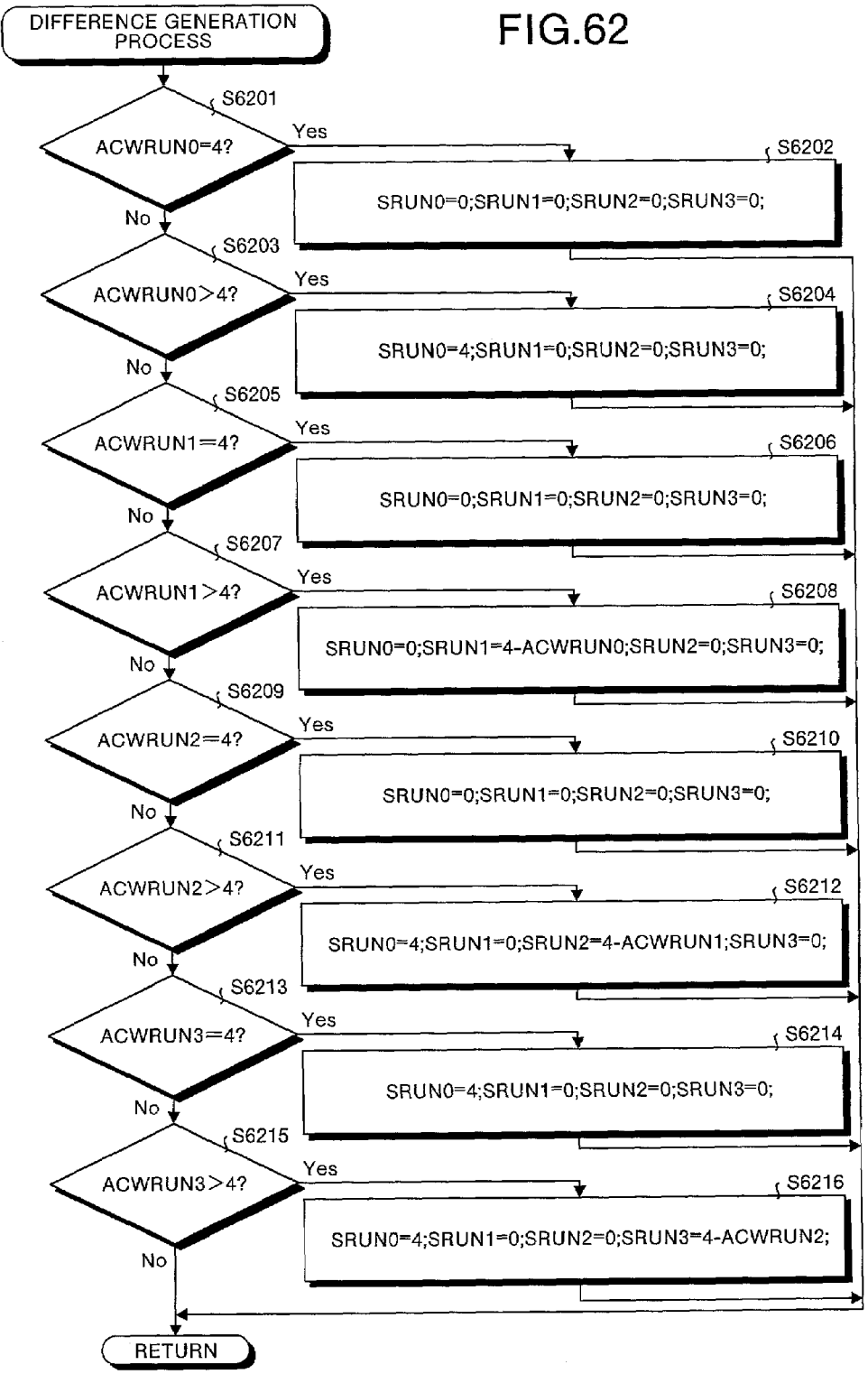
FIG. 62 is a flowchart showing a specific example of a processing performed by a difference generation section.

If there is a remainder at the time of filling four dots with any of the four run lengths, in order to send the remainder to the FIFO 5901 and determine the remaining run length to be used as the next first run value, the difference generation section 5905 determines a difference between the total run length of the four run lengths from the TOTAL run length generation section 5903 and four values of the total value up to each run length. An example of a specific processing performed by the difference generation section 5905 is shown in FIG. 62.

Figure 63:
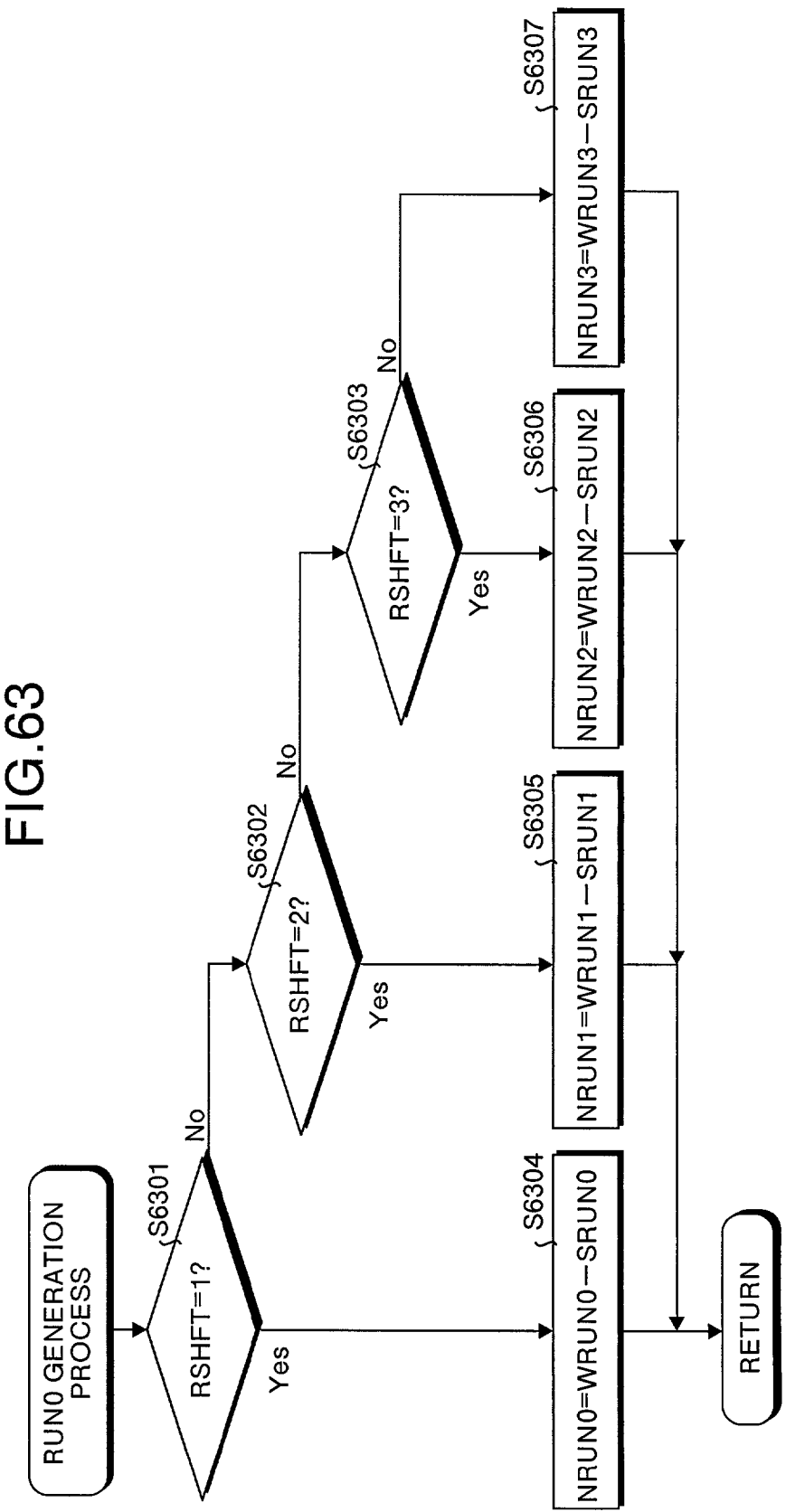
FIG. 63 is a flowchart showing a specific example of a processing performed by a RUN0 generation section.
Figure 64:
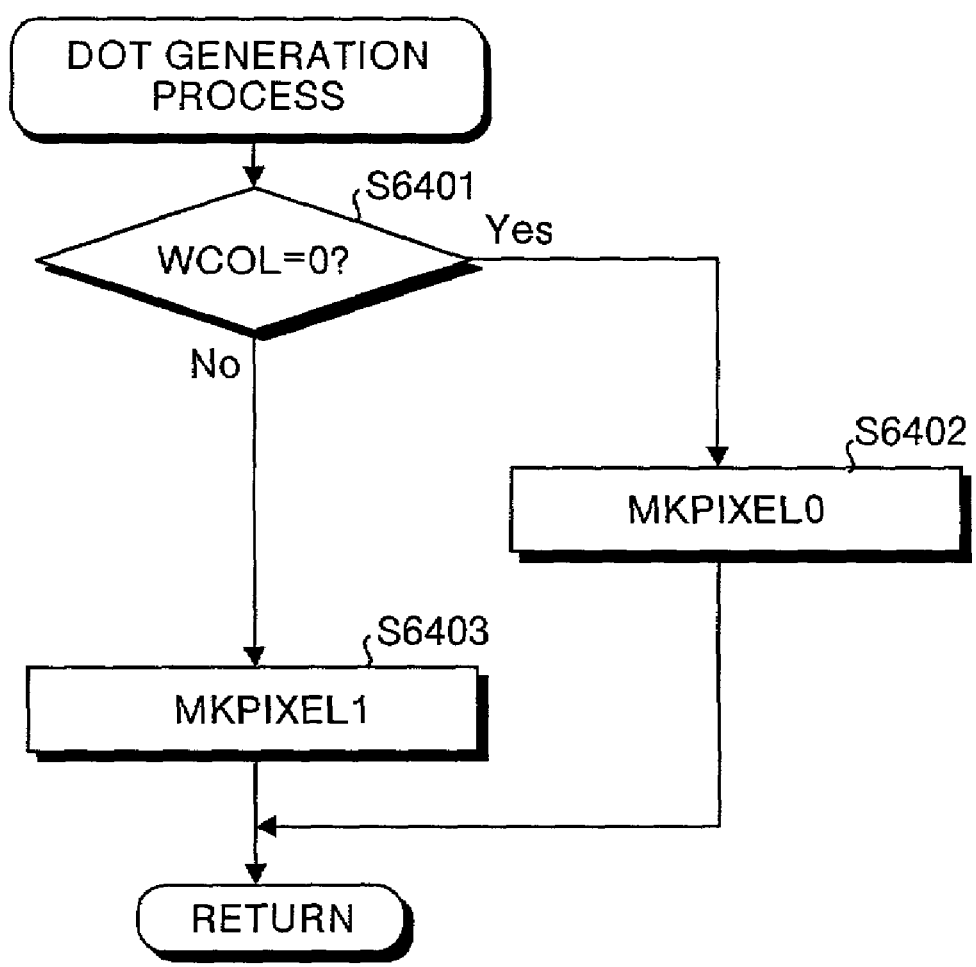
FIG. 64 is a flowchart showing a specific example of a processing performed by the DOT generation processing section.

The RUN0 generation section 5906 receives a value of the remainder at the respective four points from the difference generation section 5905, also receives the actually used run value from the shift value generation section 5904, and selects the value from the shift value generation section 5904, to thereby send it as a remainder RUN0 of the last run length to the FIFO 5901. An example of a specific processing performed by the RUN0 generation section 5906 is shown in FIG. 63.

Figure 65:
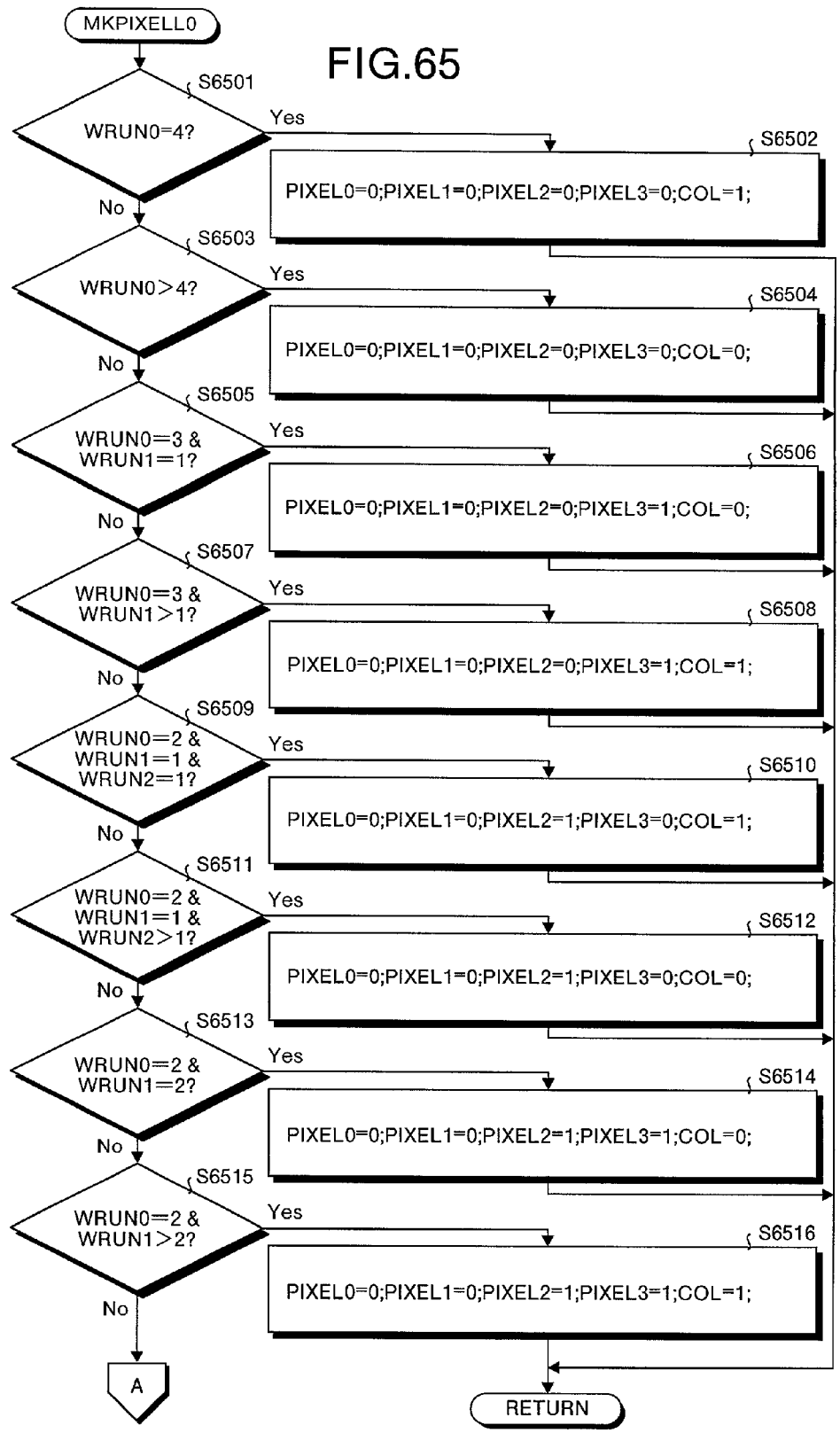
FIG. 65 is a continuation of the processing shown in FIG. 64.
Figure 66:
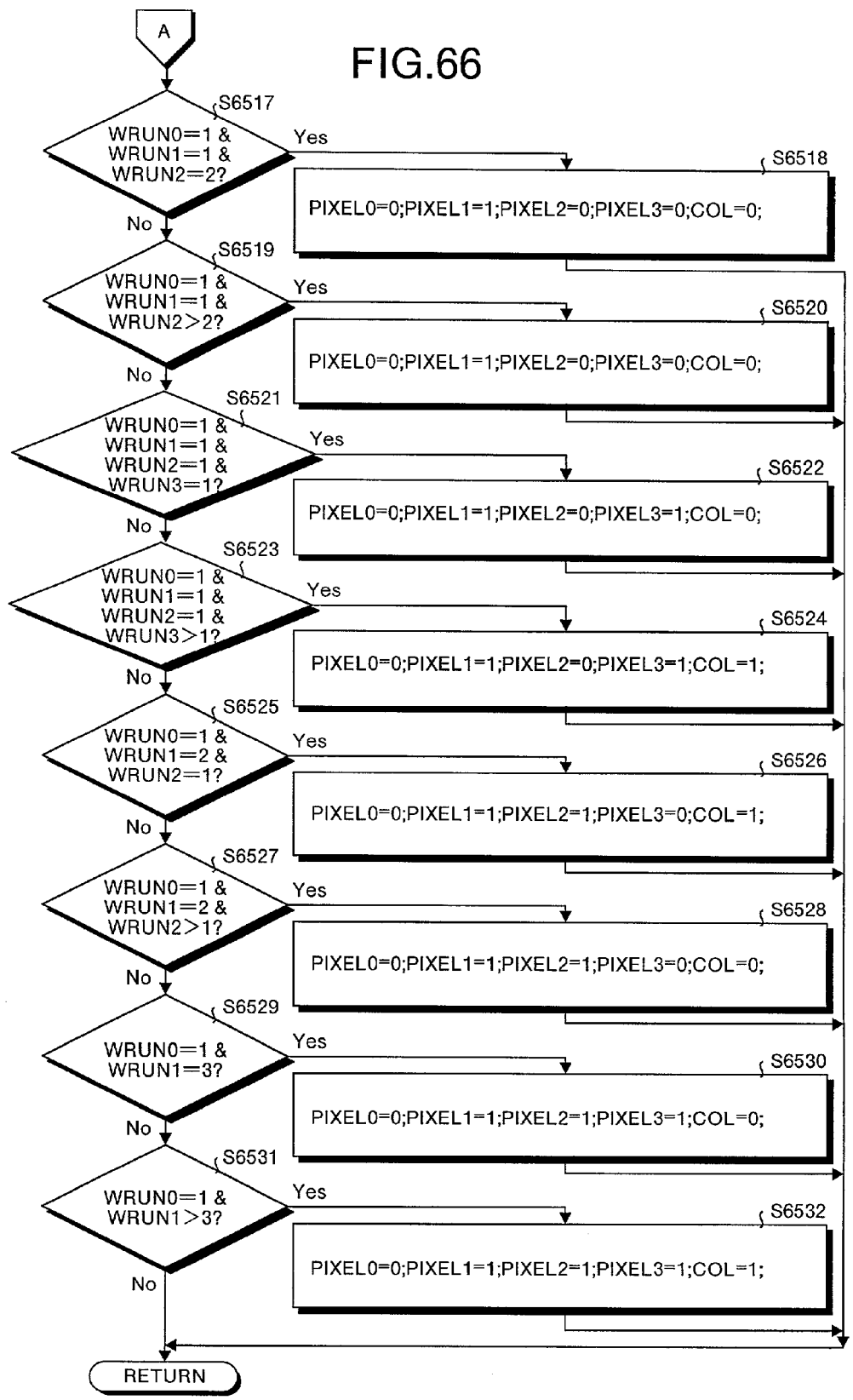
FIG. 66 is a continuation of the processing shown in FIG. 65.

Lastly, a specific processing performed by the DOT generation section 5902 will be described. FIG. 64 and FIG. 65 to FIG. 68 are flow charts showing one example of the processing performed by the DOT generation section 5902. The DOT generation section 5902 judges whether WCOL, that is, the binary value of PIXEL continuous at present is 0 or 1 (step S6401). If it is 0 (step S6401: YES), processing of MKPIXEL0 shown in FIG. 65 and FIG. 66 is performed (step S6402). On the other hand, if WCOL is not 0 (step S6401: NO), processing of MKPIXEL1 shown in FIG. 67 and FIG. 68 is performed (step S6403).

If WCOL=0, control proceeds to the processing of MKPIXEL0, to fill four run lengths SWRUN0 from the FIFO 5901 and 4 bits from the FIFO 5901, to thereby determine values of SRUN0 (value used by respective four run values after the 4-bit PIXEL processing) and FSHFT in the respective cases.

If WCOL=1, control proceeds to the processing of MKPIXEL1, to fill four run lengths SWRUN0 from the FIFO 5901 and 4 bits from the FIFO 5901, to thereby determine values of SRUN0 (value used by respective four run values after the 4-bit PIXEL processing) and FSHFT in the respective cases.

The above example shows a case of the 4-bit parallel processing, but parallel processing of other values can be considered similarly.

As described above, with the encoding apparatus and the encoding method according to one aspect of the present invention, a long run length can be calculated, while reducing the bit length to be processed, thereby enabling high-speed compression of binary signals.

Moreover, it can be judged with a simple construction that the run length is determined, thereby enabling high-speed compression of binary signals.

Furthermore, it can be judged with a simple construction that the run length is not determined, thereby enabling high-speed compression of binary signals.

Moreover, a binary signal whose value is changed over with a short cycle, such as image data in which many neutral colors exist, can be efficiently compressed, thereby enabling high-speed compression of binary signals.

With the encoding apparatus and the encoding method according to another aspect of the present invention, the bit length that can be processed at a time with a circuit structure having a fewer number of gates can be increased, thereby enabling high-speed compression of binary signals.

With the decoding apparatus and the decoding method according to still another aspect of the present invention, the data to be processed can be efficiently input, thereby enabling high-speed decoding of the binary signals.

With the image forming apparatus according to still another aspect of the present invention, binarized image data can be efficiently input, thereby enabling high-speed compression and expansion of the image data.

The present document incorporates by reference the entire contents of Japanese priority document, 2000-334027 filed in Japan on Oct. 31, 2000.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An encoding apparatus comprising:
   a binary signal input unit which inputs binary signals sequentially by a predetermined bit length;
   a determined run length output unit which outputs the run length determined in the binary signal of the predetermined bit length, input by the binary signal input unit;
   an indeterminate run length output unit which outputs the run length not determined in the binary signal of the predetermined bit length, input by the binary signal input unit;
   a run length adding unit which adds the run length output by the indeterminate run length output unit to the first run length of the binary signal of the predetermined bit length to be subsequently input by the binary signal input unit; and
   an encoding unit which encodes the run length output by the determined run length output unit.

2. The encoding apparatus according to claim 1, further comprising a repetition number output unit which calculates the number of repetitions of a numerical value of the run lengths, by judging whether or not the numerical value of a certain run length is the same as that of a run length two before, with respect to a progression constituted of the run length output by the determined run length output unit, the encoding unit encodes the run length having no repetition and the number of repetitions.

3. An encoding apparatus comprising:
   a binary signal mass input unit which inputs binary signals sequentially by a predetermined unit, designating binary signals of a predetermined bit length as one unit;
   an in-unit determined run length output unit which outputs the run length determined in the respective units input by the binary signal mass input unit;
   storing units, in a number that is the same number as that of the predetermined units, which store the run length determined in the respective units, output by the in-unit determined run length output unit, based on the number of run lengths determined in the respective units and the order of the units in the whole predetermined units;
   a determined run length output unit which outputs the run length determined in one unit, when the run length stored in the storing unit is combined and the whole predetermined unit is designated as one unit;
   an indeterminate run length output unit which outputs the run length not determined in the one unit, when the run length stored in the storing unit is combined and the whole predetermined unit is designated as one unit;
   a run length adding unit which adds the run length output by the indeterminate run length output unit to the first run length of the binary signal in the predetermined unit, subsequently input by the binary signal mass input unit; and
   an encoding unit which encodes the run length output by the determined run length output unit.

4. A decoding apparatus comprising:
   a decoding unit which individually decodes signals consisting of a code of a run length and number of repetitions, being repetition of the run length, and outputting the run length or the number of repetitions;
   a FIFO memory which stores a plurality of run lengths or numbers of repetitions output by the decoding unit in an order of output;
   a binary signal conversion unit which inputs the run length or the number of repetitions stored in the FIFO memory and converts the input run length or the number of repetitions to a binary signal of a predetermined BIT length; and
   a control unit which controls the input of the run length or number of repetitions decoded by the decoding unit by the number of conversion converted to the binary signals by the binary signal conversion unit, into the FIFO memory.

5. An image forming apparatus comprising any one or both of an encoding apparatus and a decoding apparatus, wherein the encoding apparatus includes
   a binary signal input unit which inputs binary signals sequentially by a predetermined bit length;
   a determined run length output unit which outputs the run length determined in the binary signal of the predetermined bit length, input by the binary signal input unit;
   an indeterminate run length output unit which outputs the run length not determined in the binary signal of the predetermined bit length, input by the binary signal input unit;
   a run length adding unit which adds the run length output by the indeterminate run length output unit to the first run length of the binary signal of the predetermined bit length to be subsequently input by the binary signal input unit; and
   an encoding unit which encodes the run length output by the determined run length output unit, and,
   wherein the decoding apparatus includes
   a decoding unit which individually decodes signals consisting of a code of a run length and number of repetitions, being repetition of the run length, and outputting the run length or the number of repetitions;

a FIFO memory which stores a plurality of run lengths or numbers of repetitions output by the decoding unit in an order of output;

a binary signal conversion unit which inputs the run length or the number of repetitions stored in the FIFO memory and converts the input run length or the number of repetitions to a binary signal of a predetermined BIT length; and a control unit which controls the input of the run length or number of repetitions decoded by the decoding unit by the number of conversion converted to the binary signals by the binary signal conversion unit, into the FIFO memory, and, wherein the binary signal is image data.

6. An image forming apparatus comprising any one or both of an encoding apparatus and a decoding apparatus, wherein the encoding apparatus includes a binary signal mass input unit which inputs binary signals sequentially by a predetermined unit, designating binary signals of a predetermined bit length as one unit;

an in-unit determined run length output unit which outputs the run length determined in the respective units input by the binary signal mass input unit;

storing units, in a number that is the same number as that of the predetermined units, which store the run length determined in the respective units, output by the in-unit determined run length output unit, based on the number of run lengths determined in the respective units and the order of the units in the whole predetermined units;

a determined run length output unit which outputs the run length determined in one unit, when the run length stored in the storing unit is combined and the whole predetermined unit is designated as one unit;

an indeterminate run length output unit which outputs the run length not determined in the one unit, when the run length stored in the storing unit is combined and the whole predetermined unit is designated as one unit;

a run length adding unit which adds the run length output by the indeterminate run length output unit to the first run length of the binary signal in the predetermined unit, subsequently input by the binary signal mass input unit; and an encoding unit which encodes the run length output by the determined run length output unit, and, wherein the decoding apparatus includes a decoding unit which individually decodes signals consisting of a code of a run length and number of repetitions, being repetition of the run length, and outputting the run length or the number of repetitions;

a FIFO memory which stores a plurality of run lengths or numbers of repetitions output by the decoding unit in an order of output;

a binary signal conversion unit which inputs the run length or the number of repetitions stored in the FIFO memory and converts the input run length or the number of repetitions to a binary signal of a predetermined BIT length; and a control unit which controls the input of the run length or number of repetitions decoded by the decoding unit by the number of conversion converted to the binary signals by the binary signal conversion unit, into the FIFO memory, and, wherein the binary signal is image data.

7. The encoding method according to claim 6, further comprising a repetition number output step of calculating the number of repetitions of a numerical value of the run length, by judging whether or not a numerical value of a certain run length is the same as that of a run length two before, with respect to a progression constituted of the run length output in the determined run length output step, wherein in the encoding step, the run length having no repetition and the number of repetitions are encoded.

8. An encoding method comprising:

a binary signal input step of inputting binary signals sequentially by a predetermined bit length;

a determined run length output step of outputting the run length determined in the binary signal of the predetermined bit length, input in the binary signal input step;

an indeterminate run length output step of outputting the run length not determined in the binary signal of the predetermined bit length, input in the binary signal input step;

a run length adding step of adding the run length output in the indeterminate run length output step to the first run length of the binary signal of the predetermined bit length to be subsequently input in the binary signal input step; and an encoding step of encoding the run length output in the determined run length output step.

9. A decoding method comprising:

a decoding step of individually decoding signals consisting of a code of a run length and number of repetitions, being repetition of the run length, and outputting the run length or the number of repetitions;

a storing step of storing a plurality of run lengths or numbers of repetitions output in the decoding step, in an FIFO memory in an order of output;

a binary signal conversion step of inputting the run length or the number of repetitions stored in the FIFO memory in the storing step to convert it to a binary signal of a predetermined bit length; and a control step of controlling the input of the run length or number of repetitions decoded in the decoding step by the number of conversion converted to the binary signals in the binary signal conversion step, into the FIFO memory.

* * * * *